(12) United States Patent
Nakagawa et al.

(10) Patent No.: US 9,870,827 B2
(45) Date of Patent: Jan. 16, 2018

(54) SEMICONDUCTOR DEVICE AND ELECTRONIC DEVICE

(71) Applicant: Semiconductor Energy Laboratory Co., Ltd., Kanagawa-ken (JP)

(72) Inventors: Takashi Nakagawa, Kanagawa (JP); Hiroki Inoue, Kanagawa (JP); Fumika Akasawa, Kanagawa (JP); Yoshiyuki Kurokawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/359,017

(22) Filed: Nov. 22, 2016

(65) Prior Publication Data
US 2017/0154678 A1 Jun. 1, 2017

(30) Foreign Application Priority Data

Nov. 26, 2015 (JP) .................. 2015-230745

(51) Int. Cl.
*G11C 16/04* (2006.01)
*G11C 11/34* (2006.01)
(Continued)

(52) U.S. Cl.
CPC .......... *G11C 16/10* (2013.01); *G11C 16/0466* (2013.01); *H01L 27/124* (2013.01);
(Continued)

(58) Field of Classification Search
CPC . G11C 16/10; G11C 16/0466; H01L 27/1225; H01L 27/124; H01L 27/14636; H01L 27/14616; H01L 27/14643
See application file for complete search history.

(56) References Cited

U.S. PATENT DOCUMENTS 5,101,255 A    3/1992  Ishioka et al.
6,436,741 B2*  8/2002  Sato ................. G11C 29/12
                                          438/149
(Continued)

FOREIGN PATENT DOCUMENTS

JP    2007-096055 A    4/2007
JP    2011-119711 A    6/2011
JP    2011-171702 A    9/2011

OTHER PUBLICATIONS

Kotera, N. et al., "Constant-Current Circuit-Biasing Technology for GaAs FET ICs," IEEE Journal of Solid-State Circuits, 1995, vol. 30, No. 1, pp. 61-64.

(Continued)

*Primary Examiner* — Toan Le
(74) *Attorney, Agent, or Firm* — Husch Blackwell LLP

(57) ABSTRACT

A semiconductor device with an arithmetic processing function is provided. The semiconductor device includes a first circuit and a second circuit each having a function of performing one-dimensional discrete cosine transform. By directly inputting output data of the first circuit to the second circuit, two-dimensional discrete cosine transform can be performed immediately. A memory cell array included in the first circuit is divided into a plurality of memory blocks. In the case where a selection transistor is provided in the memory block, data processing can be performed in each memory block.

29 Claims, 34 Drawing Sheets

(51) Int. Cl.
*G11C 16/10* (2006.01)
*H01L 27/12* (2006.01)
*H01L 27/146* (2006.01)

(52) U.S. Cl.
CPC .... *H01L 27/1225* (2013.01); *H01L 27/14616* (2013.01); *H01L 27/14636* (2013.01); *H01L 27/14643* (2013.01)

(56) References Cited

U.S. PATENT DOCUMENTS

| | | | |
|---|---|---|---|
| 6,754,439 | B1 | 6/2004 | Hensley et al. |
| 7,356,189 | B2 | 4/2008 | Kondo et al. |
| 7,674,650 | B2 | 3/2010 | Akimoto et al. |
| 8,378,391 | B2 | 2/2013 | Koyama et al. |
| 8,482,974 | B2 | 7/2013 | Saito et al. |
| 8,547,753 | B2 | 10/2013 | Takemura et al. |
| 8,916,869 | B2 | 12/2014 | Koyama et al. |
| 9,065,438 | B2 | 6/2015 | Aoki et al. |
| 9,135,880 | B2 | 9/2015 | Koyama |
| 9,172,370 | B2 | 10/2015 | Ikeda et al. |
| 2001/0035548 | A1 | 11/2001 | Wahlstrom |
| 2007/0040890 | A1 | 2/2007 | Morioka et al. |
| 2007/0091191 | A1 | 4/2007 | Oike |
| 2008/0310236 | A1* | 12/2008 | Baker ................ G11C 11/5642 365/185.21 |
| 2009/0027254 | A1 | 1/2009 | Troxel |
| 2011/0101351 | A1 | 5/2011 | Yamazaki |
| 2011/0198484 | A1 | 8/2011 | Kurokawa |
| 2012/0001286 | A1 | 1/2012 | Yoon |
| 2012/0120293 | A1 | 5/2012 | Mabuchi |
| 2013/0056619 | A1 | 3/2013 | Shinohara |
| 2013/0293263 | A1* | 11/2013 | Kurokawa ........... H03K 19/094 326/41 |
| 2015/0048366 | A1 | 2/2015 | Koyama et al. |
| 2015/0226802 | A1* | 8/2015 | Kurokawa ....... G01R 31/31919 324/762.01 |
| 2015/0332568 | A1 | 11/2015 | Kurokawa |
| 2016/0021314 | A1 | 1/2016 | Kurokawa et al. |
| 2016/0037106 | A1 | 2/2016 | Ohmaru |
| 2016/0064443 | A1 | 3/2016 | Inoue et al. |
| 2016/0064444 | A1 | 3/2016 | Inoue et al. |
| 2016/0172410 | A1 | 6/2016 | Kurokawa |
| 2016/0295152 | A1 | 10/2016 | Kurokawa |
| 2016/0301890 | A1 | 10/2016 | Kurokawa |
| 2016/0379564 | A1* | 12/2016 | Inoue .................. G09G 3/3241 345/212 |
| 2017/0025415 | A1 | 1/2017 | Kurokawa |
| 2017/0117283 | A1* | 4/2017 | Matsuzaki ........... H01L 23/535 |

OTHER PUBLICATIONS

Kawahito, S. et al., "A CMOS Image Sensor with Analog Two-Dimensional DCT-Based Compression Circuits for One-Chip Cameras," IEEE Journal of Solid-State Circuits, Dec. 1, 1997, vol. 32, No. 12, pp. 2030-2041.

Kawashima, S. et al., "13.3-in. 8K×4K 664-ppi OLED Display Using CAAC-OS FETs," SID Digest '14: SID International Symposium Digest of Technical Papers, Jun. 3, 2014, pp. 627-630.

Aslam-Siddiqi, A. et al., "A 16×16 Nonvolatile Programmable Analog Vector-Matrix Multiplier," IEEE Journal of Solid-State Circuits, Oct. 1, 1998, vol. 33, No. 10, pp. 1502-1509.

* cited by examiner

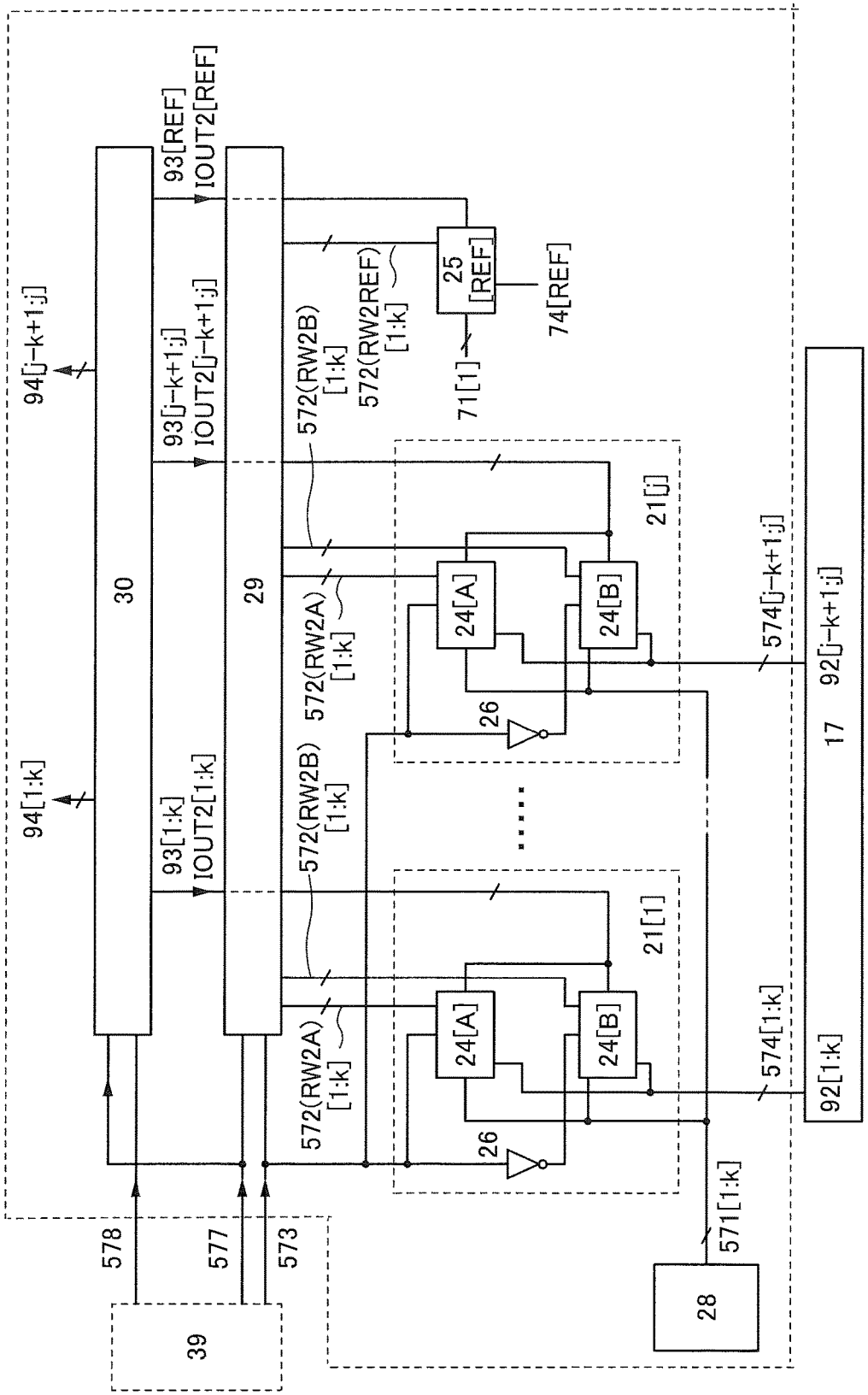

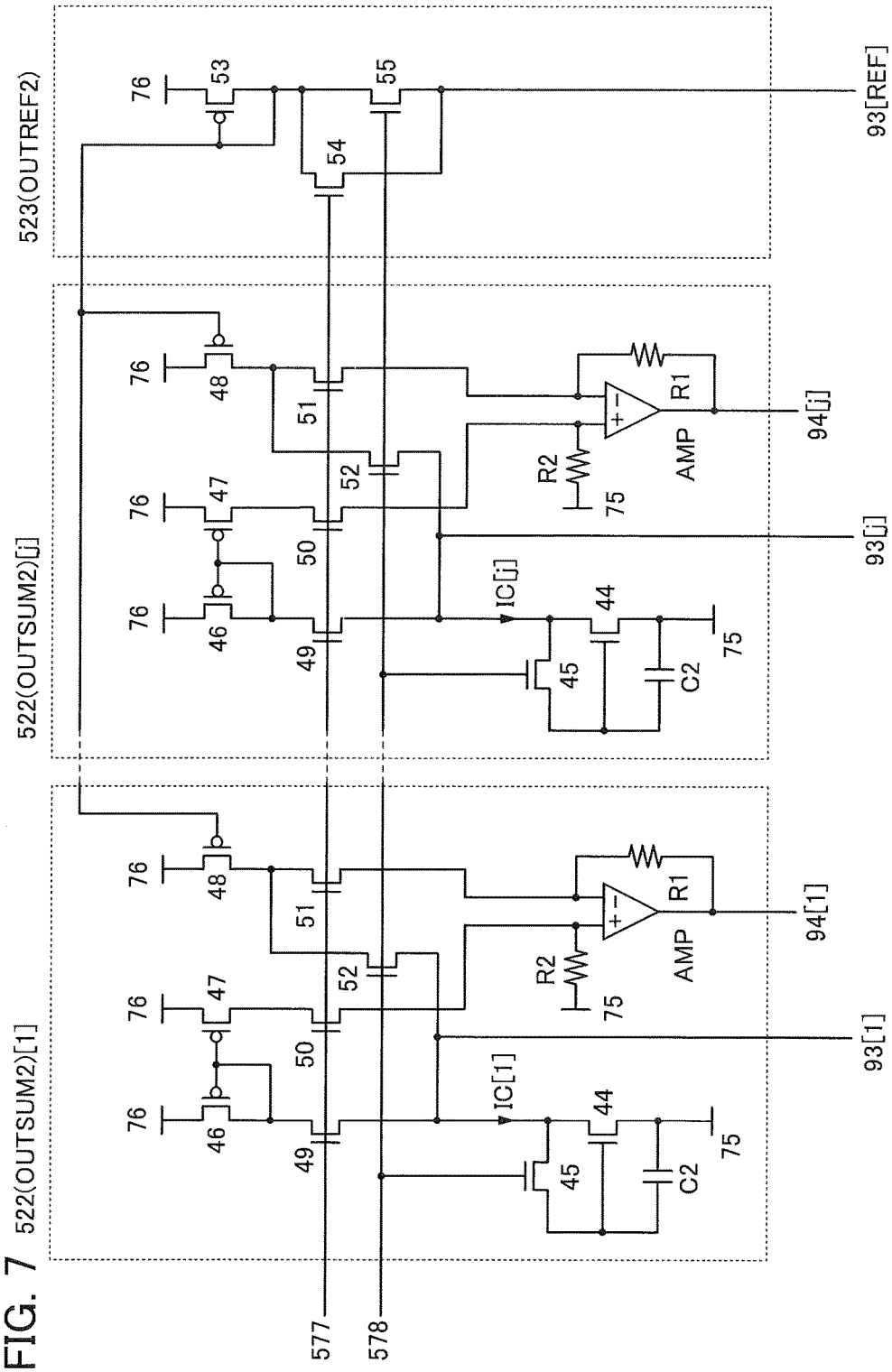

FIG. 31A
FIG. 31B
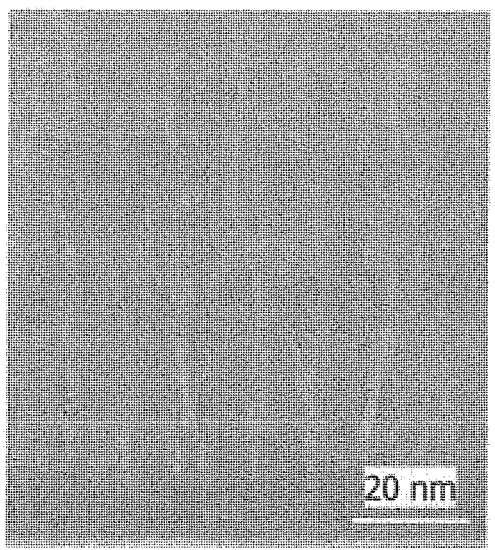
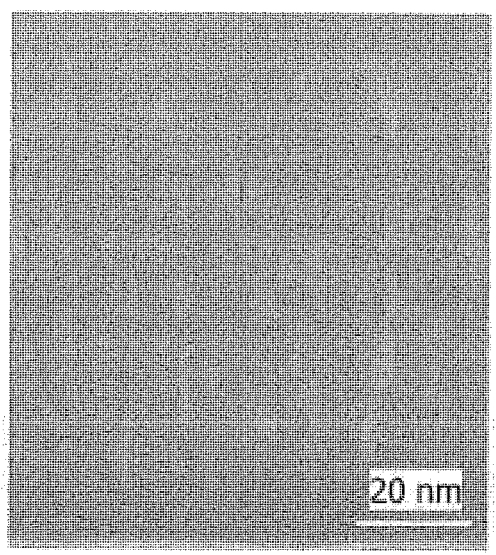

SEMICONDUCTOR DEVICE AND ELECTRONIC DEVICE

BACKGROUND OF THE INVENTION

1. Field of the Invention

One embodiment of the present invention relates to a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic device includes a semiconductor device.

2. Description of the Related Art

In recent years, a technique for forming a transistor by using an oxide semiconductor has attracted attention. For example, Patent Document 1 discloses a technique for forming a transistor by using an In—Ga—Zn-based oxide semiconductor.

Patent Document 2 discloses a technique for forming a storage device by using a transistor including an oxide semiconductor.

Patent Document 3 discloses an imaging device in which a transistor including an oxide semiconductor and having extremely low off-state current is used in part of a pixel circuit and a transistor including silicon with which a complementary metal oxide semiconductor (CMOS) circuit can be formed is used in a peripheral circuit.

REFERENCE

Patent Document 1: Japanese Published Patent Application No. 2007-096055
Patent Document 2: Japanese Published Patent Application No. 2011-171702
Patent Document 3: Japanese Published Patent Application No. 2011-119711

SUMMARY OF THE INVENTION

Vector matrix multiplication is, for example, operation used in smoothing processing, edge enhancement processing, cosine transform, or the like in image processing.

Two-dimensional discrete cosine transform (2D-DCT) is a method used for image data compression. In 2D-DCT, image data is separated into a DC component and an AC component by being subjected to product-sum operation twice so that the image data can be compressed easily. It is common to compress (encode) an image with a large amount of data by this method, transfer the image, and then extend (decode) the image.

In the case where an image with a large amount of data is subjected to two-dimensional discrete cosine transform, the image is separated into several parts, and arithmetic processing is performed in each separated part. The time taken for the arithmetic processing is very long because an arithmetic processing unit repeats data input and product-sum operation in each separated part. A plurality of arithmetic processing units can be provided to perform processings in parallel; thus, processing time can be shortened. However, there is a problem with an increase in power consumption.

An object of one embodiment of the present invention is to provide a semiconductor device with an arithmetic processing function. Another object of one embodiment of the present invention is to provide a semiconductor device capable of performing arithmetic processing at high speed. Another object of one embodiment of the present invention is to provide a low-power semiconductor device. Another object of one embodiment of the present invention is to provide a highly integrated semiconductor device. Another object of one embodiment of the present invention is to provide a semiconductor device that can be used in a wide temperature range. Another object of one embodiment of the present invention is to provide a semiconductor device with high reliability. Another object of one embodiment of the present invention is to provide a novel semiconductor device or the like.

The description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention relates to a semiconductor device with an arithmetic processing function.

One embodiment of the present invention is a semiconductor device that includes a first circuit and a second circuit. The first circuit includes a first memory block, a first reference memory block, a third circuit, a fourth circuit, a fifth circuit, a sixth circuit, and a seventh circuit. The first memory block is arranged in a matrix. The first memory block and the first reference memory block each include a first memory cell. The first memory block has a function of storing first data. The third circuit has a function of selecting the first memory cell to which the first data is written. The fourth circuit has a function of supplying the first data. The fifth circuit has a function of supplying a potential corresponding to a coefficient used for operation to the first memory block and the first reference memory block. The sixth circuit has a function of bringing the first reference memory block and the seventh circuit into conduction. The sixth circuit has a function of bringing the selected first memory block and the seventh circuit into conduction. The seventh circuit has a function of outputting second data obtained by operation using a signal output from the first reference memory block and a signal output from the selected first memory block to the second circuit. The second circuit includes an operation block, a second reference memory block, an eighth circuit, a ninth circuit, and a tenth circuit. The operation block is provided in a row direction. The operation block includes a second memory block and a third memory block. The second memory block, the third memory block, and the second reference memory block each include a second memory cell. The second memory block and the third memory block each have a function of storing the second data. The eighth circuit has a function of selecting the second memory cell to which the second data is written. The ninth circuit has a function of supplying a potential corresponding to a coefficient used for operation to the second memory block or the third memory block and the second reference memory block. The tenth circuit has a function of outputting third data obtained by operation using a signal output from the second reference memory block and a signal output from the selected second memory block or the third memory block. The second data is alternately input to the second memory block and the third memory block. One of the second memory block and the third memory block has a function of performing operation while the second data is input to the other of the second memory block and the third memory block.

The second data corresponds to data obtained by one-dimensional discrete cosine transform of information contained in the first data. The third data corresponds data obtained by one-dimensional discrete cosine transform of information contained in the second data and corresponds to data obtained by two-dimensional discrete cosine transform of the information contained in the first data.

The first memory block can include a first transistor. One first transistor can be provided in each column. The first reference memory block can include a second transistor. The first memory cell can include a third transistor, a fourth transistor, and a first capacitor. One of a source and a drain of the third transistor can be electrically connected to a gate of the fourth transistor and one electrode of the first capacitor. The other of the source and the drain of the third transistor can be electrically connected to the fourth circuit. A gate of the third transistor can be electrically connected to the third circuit. The other electrode of the first capacitor can be electrically connected to the fifth circuit. One of a source and a drain of the fourth transistor can be electrically connected to a power supply line. In the first memory block, the other of the source and the drain of the fourth transistor can be electrically connected to one of a source and a drain of the first transistor provided in the same column. In the first reference memory block, the other of the source and the drain of the fourth transistor can be electrically connected to one of a source and a drain of the second transistor. A gate of the first transistor and a gate of the second transistor can be electrically connected to the sixth circuit. The other of the source and the drain of the first transistor and the other of the source and the drain of the second transistor can be electrically connected to the seventh circuit.

The first memory cells arranged in k rows and k columns (k is a natural number of 2 or more) can be provided in the first memory block. The k first memory cells arranged in a column direction can be provided in the first reference memory block.

The second memory cells included in the second memory block, the third memory block, and the second reference memory block can each include a fifth transistor, a sixth transistor, and a second capacitor. One of a source and a drain of the fifth transistor can be electrically connected to a gate of the sixth transistor and one electrode of the second capacitor. The other of the source and the drain of the fifth transistor can be electrically connected to the seventh circuit. The other electrode of the second capacitor can be electrically connected to the ninth circuit. One of a source and a drain of the sixth transistor can be electrically connected to a power supply line.

The second memory block and the third memory block can each include a seventh transistor, an eighth transistor, and a first inverter circuit. One seventh transistor and one eighth transistor can be provided in each row. A gate of the fifth transistor can be electrically connected to one of a source and a drain of the seventh transistor provided in the same row. The other of the source and the drain of the sixth transistor can be electrically connected to one of a source and a drain of the eighth transistor provided in the same row. The other of the source and the drain of the seventh transistor can be electrically connected to the eighth circuit. The other of the source and the drain of the eighth transistor can be electrically connected to the tenth circuit. A gate of the eighth transistor can be electrically connected to an output terminal of the first inverter circuit. A gate of the seventh transistor can be electrically connected to an input terminal of the first inverter circuit.

An input terminal of a second inverter circuit can be electrically connected to the gate of the seventh transistor included in the second memory block. An output terminal of the second inverter circuit can be electrically connected to the gate of the seventh transistor included in the third memory block.

In the second memory cell included in the second reference memory block, the other of the source and the drain of the fifth transistor can be electrically connected to the fourth circuit, the gate of the fifth transistor can be electrically connected to the third circuit, and the other of the source and the drain of the sixth transistor can be electrically connected to the tenth circuit.

The second memory cells arranged in k rows and k columns (k is a natural number of 2 or more) can be provided in the second memory block and the third memory block. The k second memory cells arranged in a row direction can be provided in the second reference memory block.

The first memory cell and the second memory cell each preferably include an oxide semiconductor in a region where a channel is formed. The oxide semiconductor preferably includes In, Zn, and M (M is Al, Ga, Y, or Sn).

According to one embodiment of the present invention, a semiconductor device with an arithmetic processing function can be provided. Alternatively, according to one embodiment of the present invention, a semiconductor device capable of performing arithmetic processing at high speed can be provided. Alternatively, according to one embodiment of the present invention, a low-power semiconductor device can be provided. Alternatively, according to one embodiment of the present invention, a highly integrated semiconductor device can be provided. Alternatively, according to one embodiment of the present invention, a semiconductor device that can be used in a wide temperature range can be provided. Alternatively, according to one embodiment of the present invention, a semiconductor device with high reliability can be provided. Alternatively, according to one embodiment of the present invention, a novel semiconductor device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

In the accompanying drawings:

FIG. 6 is a block diagram illustrating a circuit 20 that performs one-dimensional discrete cosine transform;

FIG. 7 is a circuit diagram illustrating an analog processing circuit;

FIGS. 31A and 31B show cross-sectional TEM images of an a-like OS;

DETAILED DESCRIPTION OF THE INVENTION

Figure 1:
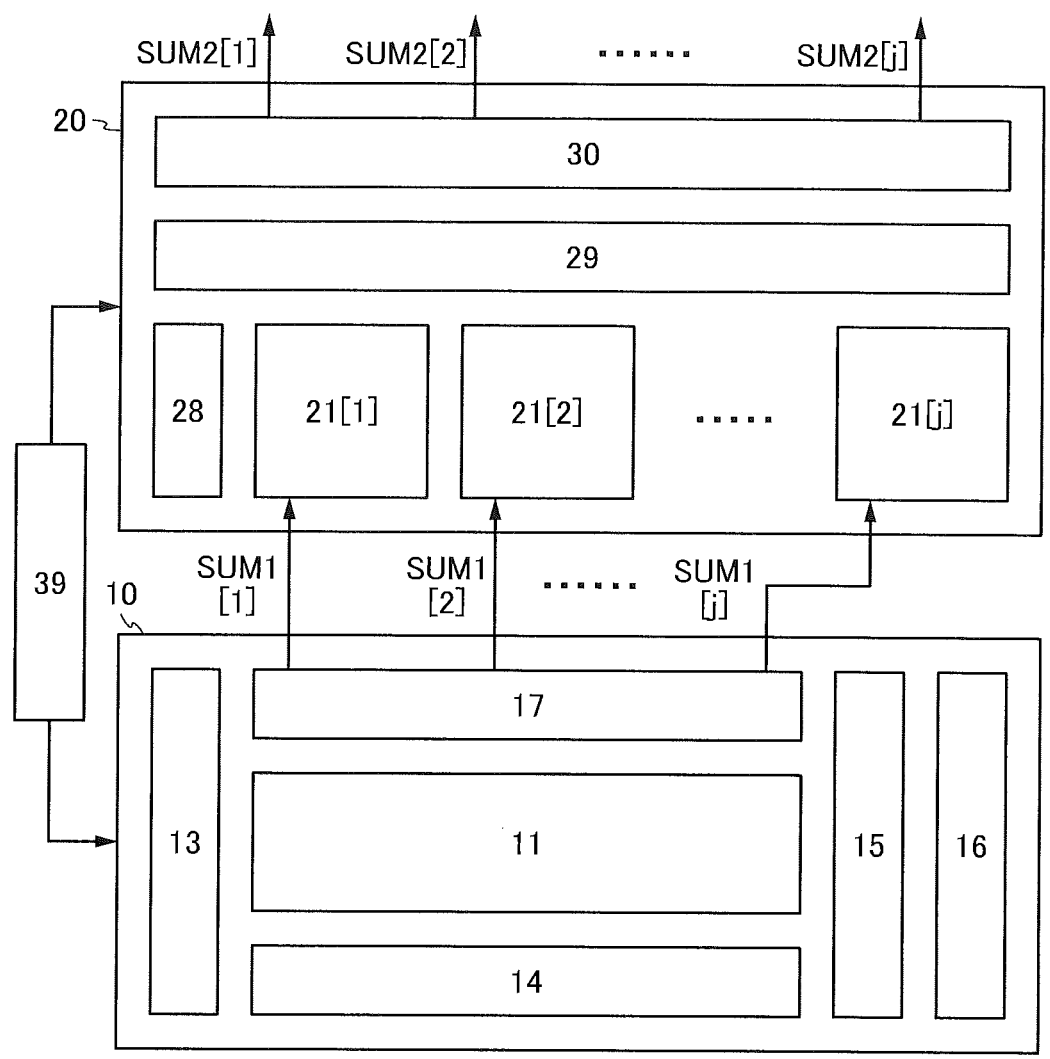
FIG. 1 is a block diagram illustrating a semiconductor device.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. In structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Note that ordinal numbers such as "first" and "second" are used for convenience and do not denote the order of steps or the stacking order of layers. Therefore, for example, the term "first" can be replaced with the term "second," "third," or the like as appropriate. In addition, the ordinal numbers in this specification and the like do not correspond to the ordinal numbers which specify one embodiment of the present invention in some cases.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, each of X and Y denotes an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected."

For example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expressions is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, the term "electrical connection" in this specification also means such a case where one conductive film has functions of a plurality of components.

Note that the terms "film" and "layer" can be interchanged with each other depending on circumstances or conditions. For example, the term "conductive layer" can be changed into the term "conductive film" in some cases. In addition, the term "insulating film" can be changed into the term "insulating layer" in some cases.

Note that in general, a potential (voltage) is relative and is determined depending on the amount relative to a certain potential. Therefore, even when the expression "ground," "GND," or the like is used, the potential is not necessarily 0 V. For example, the "ground potential" or "GND" might be defined using the lowest potential in a circuit as a reference. Alternatively, the "ground potential" or "GND" might be defined using an intermediate potential in a circuit as a reference. In those cases, a positive potential and a negative potential are set using the potential as a reference.

Embodiment 1

In this embodiment, a semiconductor device that is one embodiment of the present invention is described with reference to drawings.

One embodiment of the present invention relates to a circuit structure and an operation method of a semiconductor device that can perform two-dimensional discrete cosine transform on input data.

The semiconductor device includes a first circuit and a second circuit. The first circuit and the second circuit each have a function of performing one-dimensional discrete cosine transform. By directly inputting output data of the first circuit to the second circuit, two-dimensional discrete cosine transform can be performed immediately.

In one embodiment of the present invention, a memory cell array included in the first circuit is divided into several memory blocks. In the case where a selection transistor is provided in the memory block, data processing can be performed in each memory block.

In the second circuit, data processing time can be shortened by parallel processing in which data output from the first circuit are sequentially read to a plurality of memory blocks to perform operation.

As a transistor included in the memory cell array, a transistor that includes an oxide semiconductor in a channel formation region is preferably used. The transistor has low off-state current and therefore facilitates construction of a memory for holding a written signal.

The transistor including an oxide semiconductor in a channel formation region has lower temperature dependence of change in electrical characteristics than a transistor including silicon in an active region or an active layer, and thus can be used in an extremely wide range of temperatures. Therefore, a semiconductor device that includes transistors each including an oxide semiconductor in a channel formation region is suitable for use in automobiles, aircrafts, spacecrafts, and the like.

FIG. 1 is a block diagram illustrating a circuit 10 (first circuit), a circuit 20 (second circuit), and a circuit 39 (control circuit) that are included in a semiconductor device in one embodiment of the present invention. The circuit 10 includes a memory cell array 11, a circuit 13, a circuit 14, a circuit 15, a circuit 16, and a circuit 17. The circuit 20 includes a plurality of operation blocks 21, a circuit 28, a circuit 29, and a circuit 30.

Although an example in which the circuit 39 that supplies control signals is provided outside the circuit 10 and the circuit 20 is illustrated, the circuit 39 may be provided in the circuit 10 or the circuit 20. Alternatively, a plurality of circuits 39 may be provided in each of the circuit 10 and the circuit 20.

Data (SUM1[1] to SUM1[j]) that are subjected to one-dimensional discrete cosine transform by the circuit 10 are output from the circuit 17 and input to the operation blocks 21 of the circuit 20. The data are subjected to one-dimensional discrete cosine transform again by the circuit 20 and output from the circuit 30 to the outside as data (SUM2[1] to SUM2[j]) that are subjected to two-dimensional discrete cosine transform.

The product of determinants ($Y=Z^T \cdot C^T$, $Z=X^T \cdot C^T$ (T means a transposed matrix)) can be used for calculation of two-dimensional discrete cosine transform. Here, X represents first data input to the circuit 10 (data including original data to be subjected to operation); C represents a coefficient used for product-sum operation; and Z represents second data that is subjected to one-dimensional discrete cosine transform by the circuit 10 to be output. In addition, Y represents third data that is subjected to one-dimensional discrete cosine transform by the circuit 20 to be output, that is, data obtained by two-dimensional discrete cosine transform of the original data.

Figure 2:
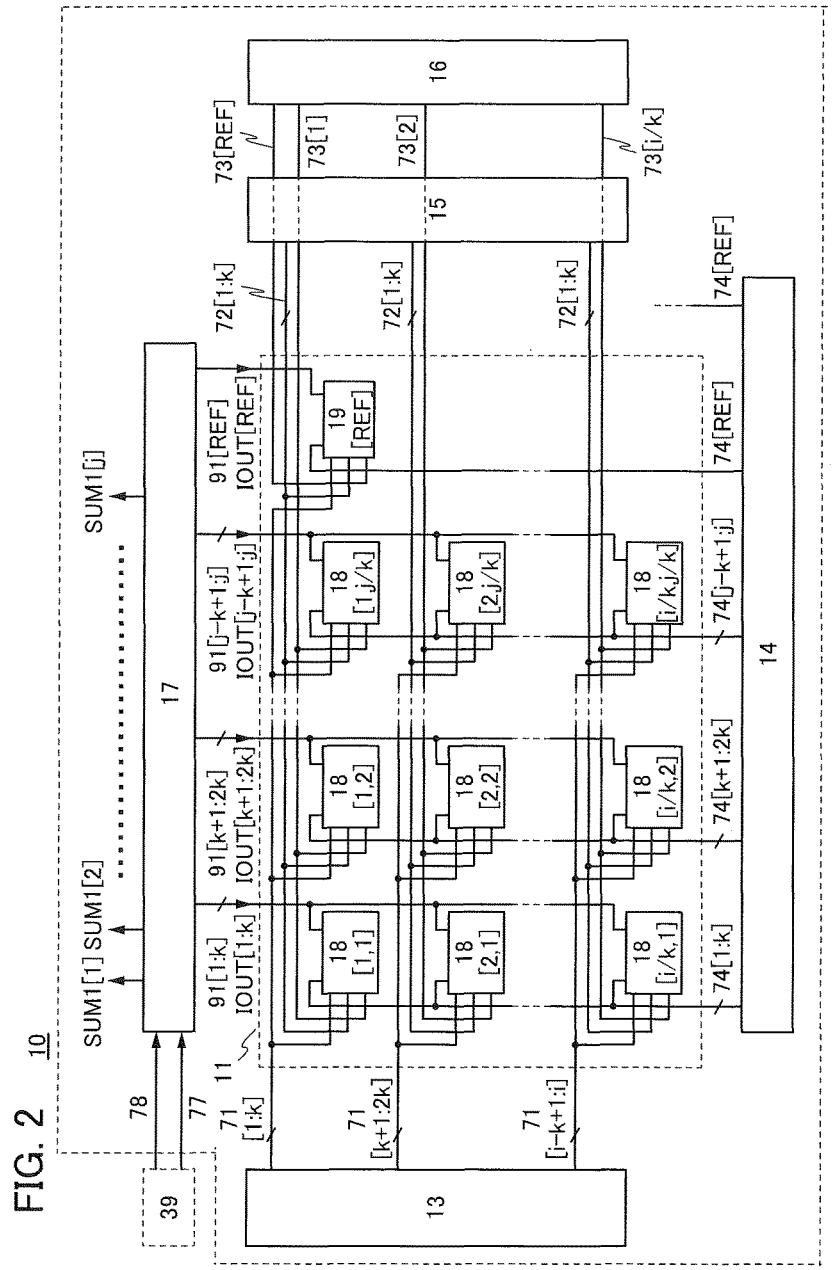
FIG. 2 is a block diagram illustrating a circuit 10 that performs one-dimensional discrete cosine transform.

FIG. 2 is a block diagram illustrating details of the circuit 10. The memory cell array 11 includes first memory blocks 18 arranged in a matrix and a first reference memory block 19.

Here, a memory block means a set including some memory cells. The first memory block 18 is a set of memory cells that store the first data to be subjected to operation. The first reference memory block 19 is a set of memory cells that store a certain value used for operation. In one embodiment of the present invention, operation can be performed in each first memory block 18.

In this embodiment, the memory cells that store the first data are arranged in i rows and j columns. In addition, one first memory block 18 is formed using memory cells arranged in k rows and k columns as one unit. Here, k is preferably $2^n$ (n is a natural number of 1 or more). Furthermore, i and j are preferably multiples of k. Therefore, the first memory blocks 18 arranged in (j/k) rows and (i/k) columns are provided in the memory cell array 11.

The first reference memory block 19 can include k memory cells arranged in k rows and one column.

The circuit 13 can function as a row driver and can sequentially select the memory cells row by row. The circuit 13 selects the row of the memory cell by controlling i wirings 71 (WW).

The circuit 14 can function as a column driver and can write data to memory cells in one row that are selected by the circuit 13 (e.g., j memory cells in the first memory block 18 and one memory cell in the first reference memory block 19) through wirings 74 (WD) connected to the memory cells. Note that a method for writing data to each first memory block 18 does not necessarily use the functions of the row driver and the column driver.

The circuit 15 inputs voltage that corresponds to a coefficient used for product-sum operation to each memory cell. Data of the coefficient C used for product-sum operation can be input to the first memory block 18 and the first reference memory block 19. The circuit 15 is electrically connected to the first memory block 18 through k wirings 72 (RW). The circuit 15 can output k kinds of voltage to one wiring. The circuit 15 is electrically connected to the first reference memory block 19 through k wirings 72 (RW).

The circuit 16 selects a memory block on which product-sum operation is performed. The circuit 16 can select rows of the first reference memory block 19 and the first memory block 18 and selects each memory block by controlling (i/k)+1 wirings 73 (SE).

The circuit 17 performs analog operation. The circuit 17 is electrically connected to j+1 wirings 91 (OUT1) to which memory cells in each column are electrically connected.

Figure 3:
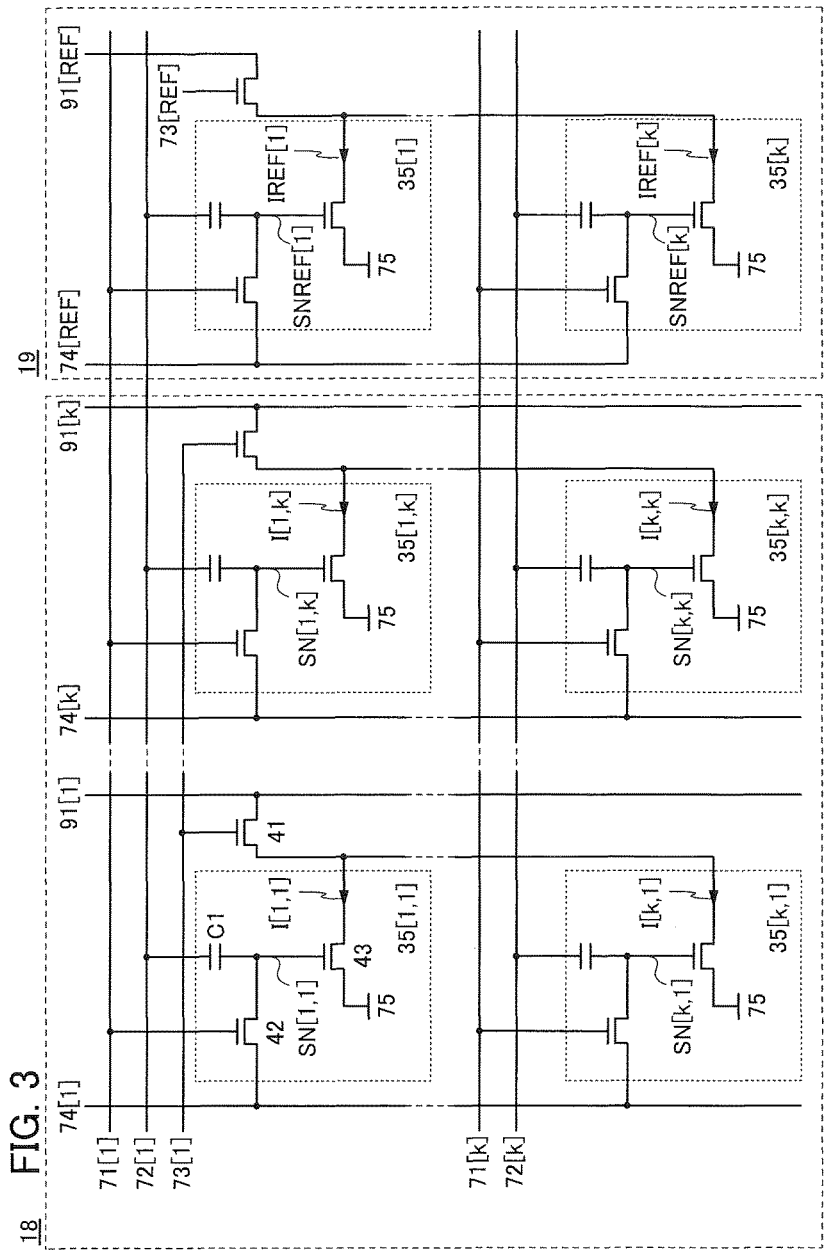
FIG. 3 is a circuit diagram illustrating memory blocks.

FIG. 3 is an example of a circuit diagram of the first memory block 18 and the first reference memory block 19.

The first memory block 18 includes memory cells 35 arranged in k rows and k columns. The first reference memory block 19 includes memory cells 35 arranged in k rows and one column. In addition, the first memory block 18 and the first reference memory block 19 each include a transistor 41 provided in each column.

The memory cell 35 includes a transistor 42, a transistor 43, and a capacitor C1. One of a source and a drain of the transistor 42 is electrically connected to a gate of the transistor 43 and one electrode of the capacitor C1. The other of the source and the drain of the transistor 42 is electrically connected to the wiring 74 (WD). A gate of the transistor 42 is electrically connected to the wiring 71 (WW). The other electrode of the capacitor C1 is electrically connected to the wiring 72 (RW). One of a source and a drain of the transistor 43 is electrically connected to a wiring 75 (VSS). A low power supply potential can be supplied to the wiring 75 (VSS), for example.

The other of the source and the drain of the transistor 43 is electrically connected to one of a source and a drain of the transistor 41 provided in the same column. A gate of the transistor 41 is electrically connected to the wiring 73 (SE).

The other of the source and the drain of the transistor 41 is electrically connected to the wiring 91 (OUT1).

The first data is input to charge retention nodes (SN[1,1], SN[k,1], SN[1,k], and SN[k, k]) of the memory cells 35 in the first memory block 18 from wirings 74 (WD)[1] to 74 (WD)[k] through the transistors 42. In addition, a reference potential is input to charge retention nodes (SNREF[1] and SNREF[k]) of the memory cells 35 in the first reference memory block 19 from a wiring 74 (WD)[REF] through the transistors 42.

Figure 4:
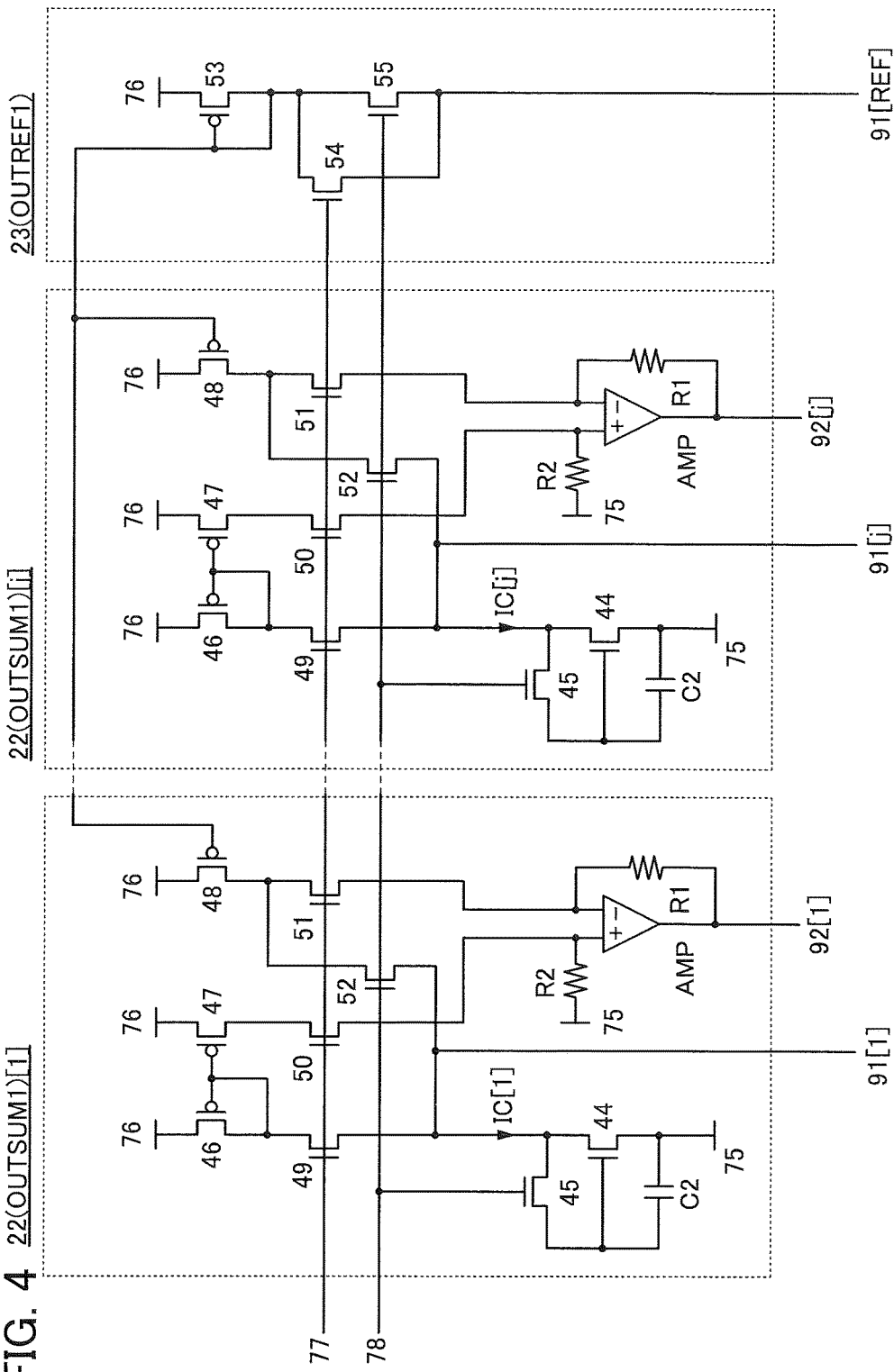
FIG. 4 is a circuit diagram illustrating an analog processing circuit.

FIG. 4 is an example of a circuit diagram illustrating the structure of the circuit 17. The circuit 17 includes circuits 22 (OUTSUM1)[1] to 22 (OUTSUM1)[j] that can function as column output circuits and a circuit 23 (OUTREF) that can function as a reference current circuit. A wiring 76 (VDD) can function as a power supply line that supplies a high power supply potential. A wiring 77 (CSC) and a wiring 78 (OPC) can function as signal lines that supply signals output from the circuit 39.

The circuits 22 (OUTSUM1)[1] to 22 (OUTSUM1)[j] can each include transistors 44 to 52, a capacitor C2, a resistor R1, a resistor R2, and an operational amplifier AMP.

One of a source electrode and a drain electrode of the transistor 44 is electrically connected to one of a source electrode and a drain electrode of the transistor 45. The other of the source electrode and the drain electrode of the transistor 44 is electrically connected to one electrode of the capacitor C2 and the wiring 75 (VSS). The other of the source electrode and the drain electrode of the transistor 45 is electrically connected to a gate electrode of the transistor 44 and the other electrode of the capacitor C2. A gate electrode of the transistor 45 is electrically connected to the wiring 78 (OPC).

Gate electrodes of the transistors 46 and 47 are electrically connected to one of a source electrode and a drain electrode of the transistor 46 to form a current mirror circuit.

One of the source electrode and the drain electrode of the transistor 46 is electrically connected to the one of the source electrode and the drain electrode of the transistor 44 and the wiring 91 (OUT1) through the transistor 49. One of a source electrode and a drain electrode of the transistor 47 is electrically connected to one input terminal (+) of the operational amplifier AMP through the transistor 50. The one input terminal (+) of the operational amplifier AMP is electrically connected to the wiring 75 (VSS) through the resistor R2.

The other of the source electrode and the drain electrode of the transistor 46 and the other of the source electrode and the drain electrode of the transistor 47 are electrically connected to the wiring 76 (VDD). Gate electrodes of the transistors 49 and 50 are electrically connected to the wiring 77 (CSC).

One of a source electrode and a drain electrode of the transistor 48 is electrically connected to the wiring 76 (VDD). The other of the source electrode and the drain electrode of the transistor 48 is electrically connected to the other input terminal (−) of the operational amplifier AMP through the transistor 51. The other input terminal (−) of the operational amplifier AMP is electrically connected to an output terminal of the operational amplifier AMP through the resistor R1. The other of the source electrode and the drain electrode of the transistor 48 is electrically connected to the one of the source electrode and the drain electrode of the transistor 44 and the wiring 91 (OUT1) through the transistor 52.

Here, when potentials are supplied to the wiring 75 (VSS) and the wiring 76 (VDD) and control signals are supplied from the wiring 77 (CSC) and the wiring 78 (OPC), current flows from the wirings 91 (OUT1)[1] to 91 (OUT1)[j] to the memory cells 35 in the first memory block 18, and output signals are output from wirings 92 (SUM1)[1] to 92 (SUM1)[j].

A circuit 23 (OUTREF1) can include transistors 53 to 55.

One of a source electrode and a drain electrode of the transistor 53 is electrically connected to the wiring 76 (VDD). The other of the source electrode and the drain electrode of the transistor 53 is electrically connected to a wiring 91 (OUT1)[REF] through the transistor 55. One of a source electrode and a drain electrode of the transistor 55 is electrically connected to one of a source electrode and a drain electrode of the transistor 54. The other of the source electrode and the drain electrode of the transistor 55 is electrically connected to the other of the source electrode and the drain electrode of the transistor 54. Note that the transistor 53 and the transistor 48 form a current mirror circuit.

When potentials are supplied to the wiring 75 (VSS) and the wiring 76 (VDD) and control signals are supplied from the wiring 77 (CSC) and the wiring 78 (OPC), current flows from the wiring 91 (OUT1)[REF] to the memory cells 35 in the first reference memory block 19. Current source bias voltage obtained from the circuit 23 (OUTREF1) is supplied to the circuits 22 (OUTSUM1)[1] to 22 (OUTSUM1)[j] owing to the current mirror circuit.

In the above structure, the transistors 46, 47, 48, and 53 can be p-channel transistors.

Note that the structures of the first memory block 18, the first reference memory block 19, and the circuit 17 are just examples, and some of the circuits, some of the transistors, some of the capacitors, some of the wirings, or the like might not be included. Alternatively, a circuit, a transistor, a capacitor, a wiring, or the like that is not included in the above structure might be included. Alternatively, connection between some wirings might be different from the above connection.

Figure 5:
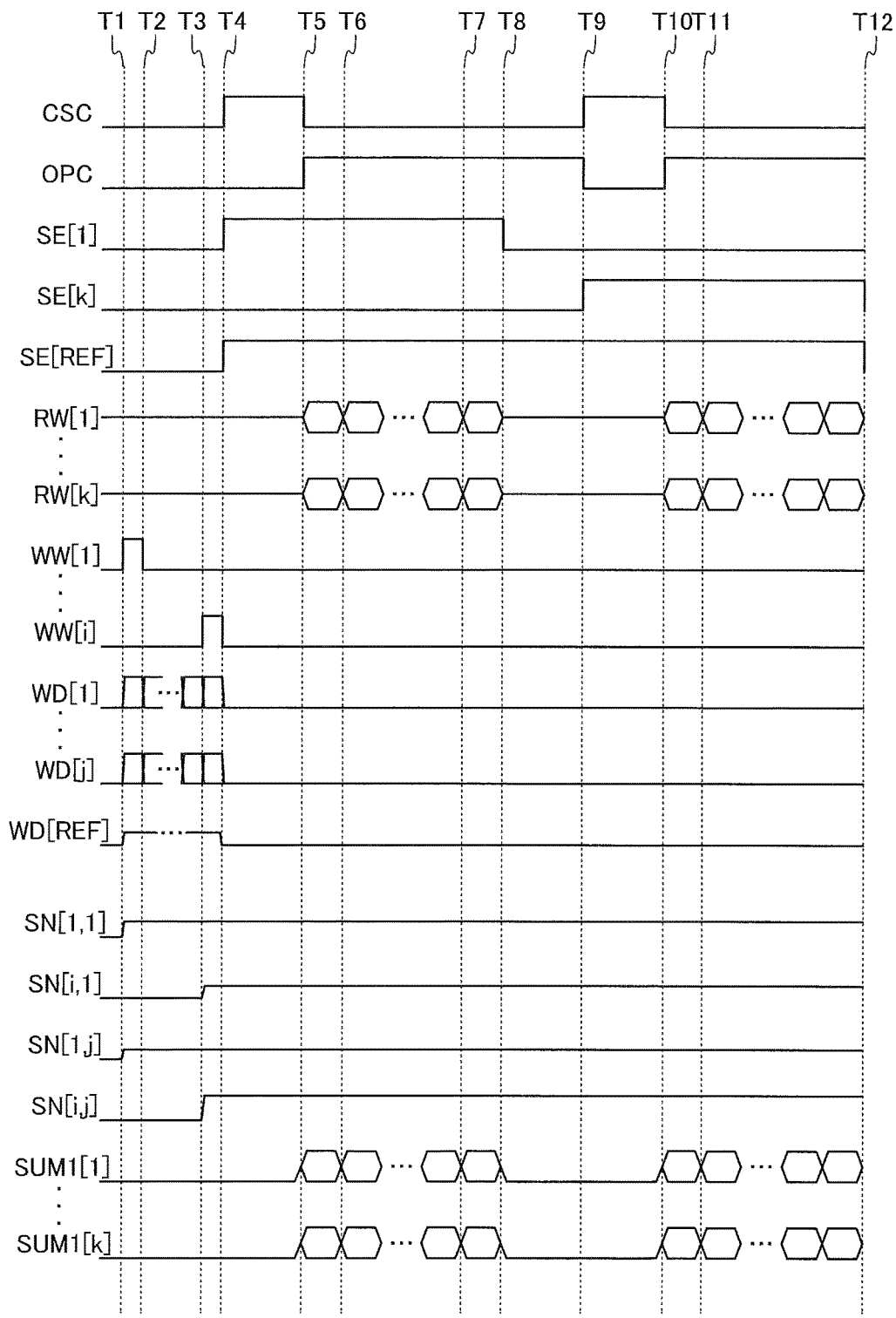
FIG. 5 is a timing chart illustrating operation of the circuit 10.

FIG. 5 is a timing chart illustrating the operation of the circuit 10. CSC represents a potential supplied to the wiring 77 (CSC); OPC represents a potential supplied to the wiring 78 (OPC); SE[1] represents a potential supplied to a wiring 73 (SE)[1]; SE[k] represents a potential supplied to a wiring 73 (SE)[k]; SE[REF] represents a potential supplied to a wiring 73 (SE)[REF]; RW[1] represents a potential supplied to a wiring 72 (RW)[1]; RW[k] represents a potential supplied to a wiring 72 (RW)[k]; WW[1] represents a potential supplied to a wiring 71 (WW)[1]; WW[i] represents a potential supplied to a wiring 71 (WW)[i]; WD[1] represents a potential supplied to the wiring 74 (WD)[1]; WD[j] represents a potential supplied to the wiring 74 (WD)[j]; WD[REF] represents a potential supplied to the wiring 74 (WD)[REF]; SN[1,1] represents the potential of a node SN[1,1] of a memory cell 35 [1,1]; SN[i,1] represents the potential of a node SN[i,1] of a memory cell 35 [i,1]; SN[1,j] represents the potential of a node SN[1,j] of a memory cell 35[1,j]; SN[i,j] represents the potential of a node SN[i,j] of a memory cell 35[i,j]; SUM1[1] represents the potential of the wiring 92 (SUM1)[1]; and SUM1[k] represents the potential of a wiring 92 (SUM1)[k].

First, operation of writing the first data to the node SN of each memory cell 35 is described. In the description of potentials, "H" means a high potential and "L" means a low potential.

When the potential of the wiring 71 (WW)[1] is set to "H" from time T1 to time T2, the first data supplied from the wirings 74 (WD)[1] to 74 (WD)[j] is written to the nodes SN[1,1] to [1,j] of the memory cells 35 in a first row in the first memory block 18.

Here, the first data is processed into VWD[REF]−VWD [1,1] to VWD[REF]−VWD[1,j] in advance. Note that VWD [REF] is a reference potential supplied to the wiring 74 (WD)[REF], and VWD[1,1] to VWD[1,j] are original data to be subjected to transform.

In other words, VWD[REF]−VWD[1,1] that is the potential of the wiring 74 (WD)[1] is written to the node SN[1,1] in a first memory block 18[1,1]. In addition, VWD[REF]−VWD[1,j] that is the potential of the wiring 74 (WD)[j] is written to the node SN[1,k] in a first memory block 18[1,j/k].

Then, data writing is sequentially performed row by row, and the first data is written to the memory cells 35 in an i-th row (last row) from time T3 to time T4.

From the time T1 to the time T4, VWD[REF] is written to the nodes SNREF[1] to SNREF[k] in the memory cells 35 included in the first reference memory block 19 when the wirings 71 (WW)[1] to 71 (WW)[k] are set to "H."

Next, operation of setting correction voltage to the circuits 22 (OUTSUM1)[1] to 22 (OUTSUM1)[j] is described.

From the time T4 to time T5, the potentials of the wiring 77 (CSC), the wiring 73 (SE)[1], and the wiring 73 (SE) [REF] are set to "H" and the potentials of the wirings 72 (RW)[1] to 72 (RW)[k] are kept at VRW[REF]. For example, VRW[REF] can be 0 V.

At this time, the sum IOUT[1] of current (the sum of I[1,1] to I[k,1]) that flows to the memory cells 35 in a first column in the first memory block 18[1,1] flows to the wiring 91 (OUT1)[1]. In addition, the sum IOUT[j] of current (the sum of I[1, k] to I[k, k]) that flows to the memory cells 35 in a k-th column in the first memory block 18[1,j/k] flows to the wiring 91 (OUT1)[j]. Furthermore, the sum IOUT[REF] of current (the sum of I[1] to I[k]) that flows to the memory cells 35 in the first reference memory block 19 flows to the wiring 91 (OUT1)[REF].

If the potential of the wiring 72 (RW)[1] is VW[1], drain current I[1,1] of the transistor 43 in the memory cell 35[1,1] in the first memory block 18 is k(VW[1]−Vth+VWD[REF]−VWD[1,1])$^2$. Drain current IREF[i] of the transistor 43 in a memory cell 35[1] in the first reference memory block 19 is k(VW[1]−Vth+VWD[REF])$^2$. Here, k is a coefficient and Vth is the threshold voltage of the transistor 43. Note that the potential of the wiring 72 (RW)[1] is superimposed on the gate potential of the transistor 43 through the capacitor C1; thus, the change in the potential of the wiring 72 (RW)[1] does not directly increase the gate potential of the transistor 43. Specifically, a potential change obtained by multiplication of a capacitive coupling coefficient that can be calculated from the capacitance of the capacitor C1, the gate capacitance of the transistor 43, and parasitic capacitance by the potential change of the wiring 72 (RW)[1] corresponds to the increase in the gate potential of the transistor 43. Here, for simplicity, a potential obtained by multiplication of the capacitive coupling coefficient is VW[1]; however, actually, a potential supplied to the wiring 72 (RW)[1] is converted as appropriate using the capacitive coupling coefficient.

At this time, if the current I[1] flowing to the wiring 91 (OUT1)[1] is ΣI[1,1] and current IREF flowing to the wiring 91 (OUT1)[REF] is ΣIREF[1], a difference ΔI[1]=IREF−I[1]=ΣIREF[1]−ΣI[1,1]=Σ(k(VW[1]−Vth+VWD[REF])$^2$−k (VW[1]−Vth+VWD[REF]−VWD[1,1])$^2$)=2kΣ(VW[1]·VWD[1,1])−2kΣ(Vth−VWD[REF])·VWD[1,1]−kΣVWD[1,1]$^2$.

The first term 2kΣ(VW[1]·VWD[1,1]) in the above equation corresponds to the sum of products of the potential VW[1] of the wiring 72 (RW)[1] and VWD[1,1] corresponding to the potential component of the node SN[1,1] in the memory cell 35[1,1]. Therefore, the first term can be calculated by subtracting the sum of the second term and the third term −2kΣ(Vth−VWD[REF])·VWD[1,1]−kΣVWD[1,1]$^2$=Ioffset[1] from ΔI[j].

Note that Ioffset[1] corresponds to the difference between the current I[1] flowing to the wiring 91 (OUT1)[1] and the current IREF flowing to the wiring 91 (OUT1)[REF] when VW[1] is 0 V, that is, the potential of the wiring 72 (RW)[1] is 0 V.

At the time T4, the potential of the wiring 77 (CSC) is set to "H" and the potentials of the wirings 72 (RW)[1] to 72 (RW)[k] are kept at 0 V. At this time, the current I[1] flows to the wiring 91 (OUT1)[1], the current IREF flows to the wiring 91 (OUT1), and current IC[1] flows to the transistor 44 in the circuit 22 (OUTSUM1)[1]. The current IREF also flows to the wiring 91 (OUT1)[REF].

In the circuit 22 (OUTSUM1)[1], with the use of the current mirror circuit formed using the transistors 48 and 53, the current (I[1]+IC[1]) flowing through the transistors 48 and 52 is equal to the current IREF flowing through the transistors 53 and 55.

A potential for supplying the current IC[1] is stored in the capacitor C1. Here, since Ioffset[1]=IREF−I[1] and IREF=I[1]+IC[1], the current IC[1] is equal to Ioffset[1]. Therefore, after the potential of the wiring 77 (CSC) is set to "L," the transistor 44 in the circuit 22 (OUTSUM1)[1] functions as a current source for supplying Ioffset[1] owing to the potential held in the capacitor C1. Similarly, the transistor 44 in the circuit 22 (OUTSUM1)[j] functions as a current source for supplying Ioffset[j] owing to the potential held in the capacitor C1.

Next, product-sum operation in the first memory block 18 to which the wiring 73 (SE)[1] is connected is described.

From the time T5 to time T6, the potentials of the wiring 78 (OPC), the wiring 73 (SE)[1], and the wiring 73 (SE) [REF] are set to "H," the potential of the wiring 77 (CSC) is set to "L," and the potentials of the wirings 72 (RW)[1] to 72 (RW)[k] are set to any of k kinds of predetermined potentials VRW[1,1] to VRW[1,k]. At this time, the transistor 44 functions as a current source that supplies the currents IC[1] to IC[j] owing to the potential held in the capacitor C2.

Here, the sum of current flowing to the wiring 91 (OUT1) [1] and the current IC[1] is equal to current flowing to the resistor R2 owing to the current mirror circuit formed using the transistors 46 and 47 included in the circuit 17. On the other hand, current flowing to the wiring 91 (OUT1)[REF] is equal to current flowing to the resistor R1 owing to the current mirror circuit formed using the transistors 48 and 53 included in the circuit 17.

At this time, a signal output from the operational amplifier AMP to the wiring 92 (SUM1)[1] is proportional to IOUT [1]+IC[1]−IOUT[REF]. The value VSUM[1,1] of the signal output to the wiring 92 (SUM1)[1] is the sum of products of the potentials VRW[1,1] to VRW[1,k] input from the wirings 72 (RW)[1] to [k] and potentials that are obtained by subtracting VWD[REF] from potentials VWD[REF]−VWD [1,1] to VWD[REF]−VWD[k,1] written to the nodes SN[1, 1] to SN[k,1] in the first memory block 18[1,1] from the wiring 74 (WD)[1] in product-sum operation. In other words, the value VSUM[1,1] of the signal output to the wiring 92 (SUM1)[1] corresponds to the sum of a product in the first row (VWD[1,1]×VRW[1,1]) to a product in the k-th row (VWD[k,1]×VRW[1, k]).

Similarly, the value VSUM[1,j] of a signal output to the wiring 92 (SUM1)[j] is the sum of products of the potentials VRW[1,1] to VRW[1, k] input from the wirings 72 (RW)[1] to 72 (RW)[k] and potentials that are obtained by subtracting VWD[REF] from potentials VWD[REF]–VWD[1,j] to VWD[REF]–VWD[k,j] written to the nodes SN[1,1] to SN[k,1] in the first memory block 18[1,j/k] from the wiring 74 (WD)[j] in product-sum operation. In other words, the value VSUM[1,j] of the signal output to the wiring 92 (SUM1)[j] corresponds to the sum of a product in the first row (VWD[1,j]×VRW[1,1]) to a product in the k-th row (VWD[k,j]×VRW[1, k]).

From time T7 to time T8, the potentials of the wirings 72 (RW)[1] to 72 (RW)[k] are set to predetermined potentials VRW[k,1] to VRW[k, k]. The value VSUM[1,1] of the signal output to the wiring 92 (SUM1)[1] is the sum of products of the potentials VRW[k,1] to VRW[k, k] input from the wirings 72 (RW)[1] to 72 (RW)[k] and potentials that are obtained by subtracting VWD[REF] from the potentials VWD[REF]–VWD[1,j] to VWD[REF]–VWD[k,j] written to the nodes SN[1, k] to SN[k,k] in the first memory block 18[1,1] from the wiring 74 (WD)[1] in product-sum operation.

Similarly, the value VSUM[k,j] of the signal output to the wiring 92 (SUM1)[j] is the sum of products of the potentials VRW[k,1] to VRW[k,k] input from the wirings 72 (RW)[1] to 72 (RW)[k] and potentials that are obtained by subtracting VWD[REF] from the potentials VWD[REF]–VWD[1,j] to VWD[REF]–VWD[k,j] written to the nodes SN[1,k] to SN[k,k] in the first memory block 18[1,j/k] from the wiring 74 (WD)[j] in product-sum operation.

In other words, in a period from the time T5 to the time T8, the potentials of the wirings 72 (RW)[1] to 72 (RW)[k] are each changed k times, and signals that depend on the potentials of the wirings 72 (RW)[1] to 72 (RW)[k] are output to the wirings 92 (SUM1)[1] to 92 (SUM1)[j] every time. That is, in a period from the time T4 to the time T8, one-dimensional discrete cosine transform is performed on the memory cells 35 in the first memory blocks 18[1,1] to 18[1,j/k] in the first row block by block.

The above is the description of an operation example for performing one-dimensional discrete cosine transform on the first memory block 18 controlled by the wiring 73 (SE)[1].

From time T9 to time T12, operation for performing one-dimensional discrete cosine transform on the first memory block 18 controlled by a wiring 73(SE)[i/k] is shown. The description of the operation for performing one-dimensional discrete cosine transform on the first memory block 18 controlled by the wiring 73 (SE)[1] can be referred to.

At the time T12, data subjected to one-dimensional discrete cosine transform is output to all the memory cells 35 included in the first memory blocks 18 block by block. In other words, the data Z that is a product of the data X input block by block and an inverse matrix of the coefficient C is calculated.

FIG. 6 is a block diagram illustrating details of the circuit 20. Operation blocks 21 are electrically connected to the circuit 17, and the number of operation blocks 21 is equal to the number of wirings 92 (SUM1)[1:j] that are column output wirings of the circuit 17. The operation block 21 includes a second memory block 24[A], a second memory block 24[B], and an inverter circuit 26. The circuit 20 includes a second reference memory block 25.

The second memory blocks 24[A] and 24[B] are a set of memory cells that store the second data to be subjected to operation. The second memory blocks 24[A] and 24[B] can include memory cells arranged in k rows and k columns like the first memory block 18. The second reference memory block 25 can include k memory cells arranged in one row and k columns.

The circuit 28 can function as a row driver and can sequentially select the memory cells row by row. The circuit 28 selects the row of the memory cell by controlling k wirings 571 (WW2).

The circuit 29 inputs data of a matrix C that is a coefficient of the sum of products to the second memory blocks 24[A] and 24[B]. The second memory blocks 24[A] and 24[B] are electrically connected to the circuit 29 through k wirings 572 (RW2A) and k wirings 572 (RW2B). The circuit 29 can output k kinds of voltage to one wiring.

The circuit 29 is electrically connected to the second reference memory block 25 through k wirings 572 (RW2REF). The second reference memory block 25 is a set of memory cells that store a certain value used for operation.

The circuit 29 can change its output in response to signals supplied from the circuit 39 to a wiring 573 (SE2) and a wiring 578 (OPC2). For example, when signals output from the wiring 573 (SE2) and the wiring 578 (OPC2) are "H," k kinds of voltage are output to wirings 572 (RW2B)[1:k]. When a signal output from the wiring 573 (SE2) is "L" and a signal output from the wiring 578 (OPC2) is "H," k kinds of voltage are output to wirings 572 (RW2A)[1:k]. When a signal output from the wiring 578 (OPC2) is "H" regardless of the value of the wiring 573 (SE2), k kinds of voltage are output to a wiring 572 (RW2REF)[1:k]. When a signal output from the wiring 578 (OPC2) is "L," VRW2[REF] is output to the wirings 572 (RW2A)[1:k], the wirings 572 (RW2B)[1:k], and the wiring 572 (RW2REF)[1:k].

The circuit 30 performs analog operation. The circuit 30 is electrically connected to j+1 wirings 93 (OUT2) to which memory cells in each row included in the second memory blocks 24[A] and 24[B] and the second reference memory block 25 are electrically connected. The operation results of the circuit 30 are output from wirings 94 (SUM2)[1] to 94 (SUM2)[j].

The circuit 30 can have a structure similar to that of the circuit 17, as illustrated in FIG. 7. The circuit 30 includes circuits 522 (OUTSUM2)[1] to 522 (OUTSUM2)[j] that can function as column output circuits and a circuit 523 (OUT-REF2) that can function as a reference current circuit. A wiring 577 (CSC2) and the wiring 578 (OPC2) can function as signal lines that supply signals output from the circuit 39.

Figure 8A:
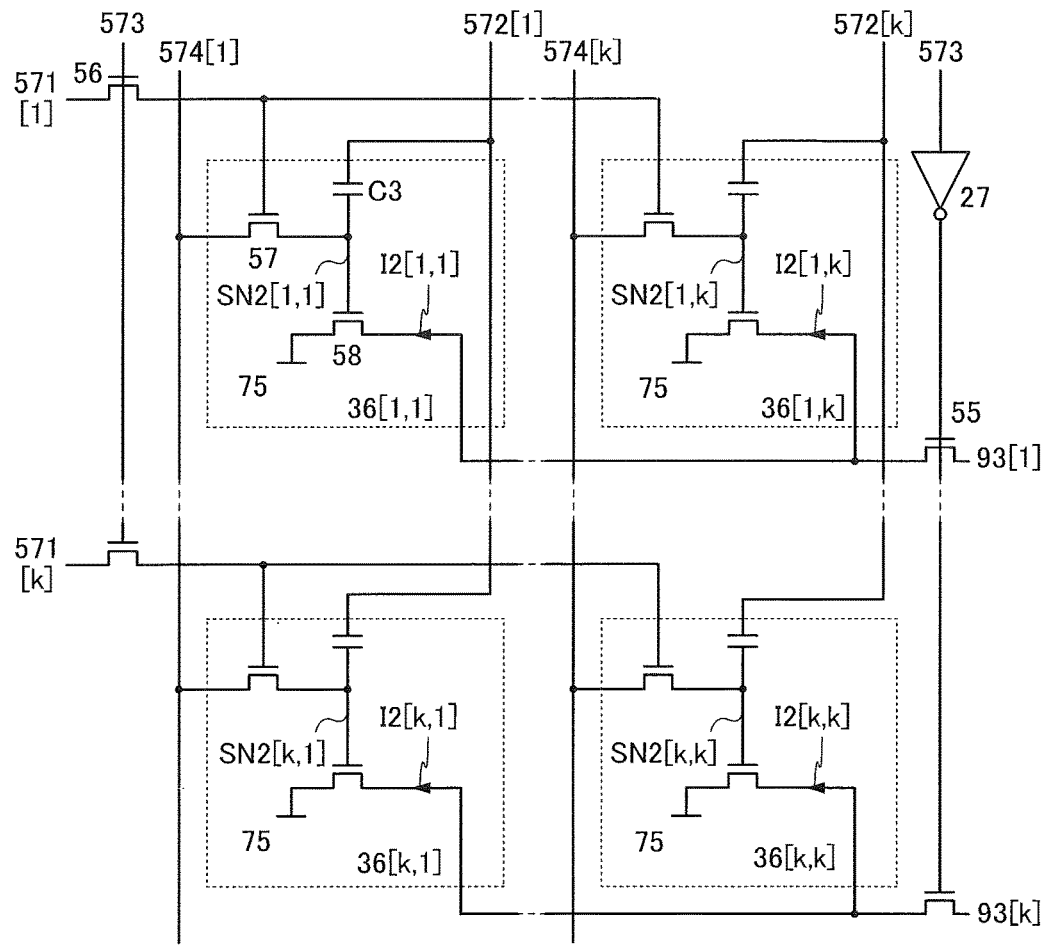
FIGS. 8A and 8B are circuit diagrams illustrating memory blocks.
Figure 8B:
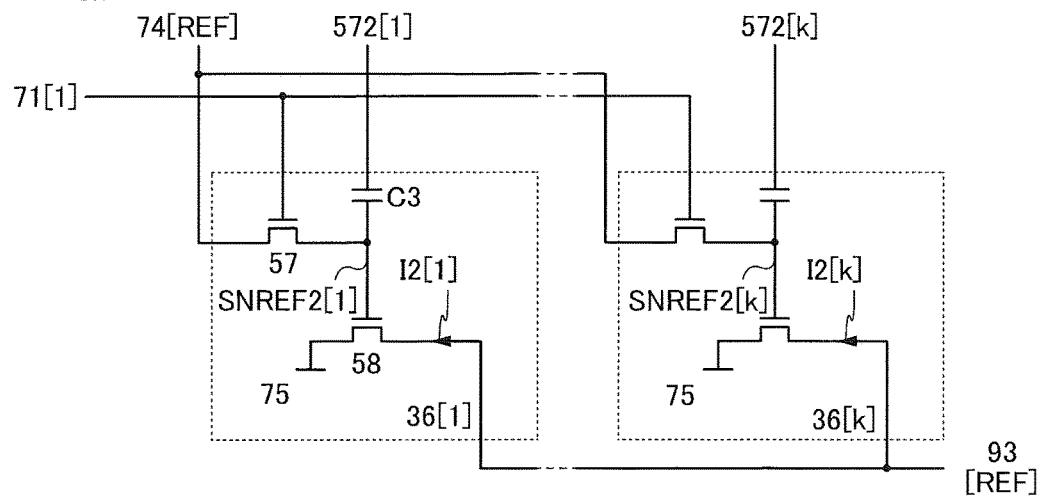

FIG. 8A is an example of a circuit diagram illustrating the second memory blocks 24[A] and 24[B]. FIG. 8B is an example of a circuit diagram illustrating the second reference memory block 25.

The second memory blocks 24[A] and 24[B] include memory cells 36 arranged in k rows and k columns. The second reference memory block 25 includes memory cells 36 arranged in one row and k columns. In addition, the second memory blocks 24[A] and 24[B] each include the transistor 55 and a transistor 56 provided in each row.

The memory cell 36 includes a transistor 57, a transistor 58, and a capacitor C3. One of a source and a drain of the transistor 57 is electrically connected to a gate of the transistor 58 and one electrode of the capacitor C3. The other of the source and the drain of the transistor 57 is electrically connected to a wiring 574 (WD2). The other electrode of the capacitor C3 is electrically connected to a wiring 572 (RW2). One of a source and a drain of the transistor 58 is electrically connected to the wiring 75 (VSS).

A gate of the transistor 57 is electrically connected to one of a source and a drain of the transistor 56 provided in the same row. A gate of the transistor 56 is electrically connected to the wiring 573 (SE2). The other of the source and the drain of the transistor 56 is electrically connected to the wiring 571 (WW2).

The other of the source and the drain of the transistor 58 is electrically connected to one of a source and a drain of the transistor 55 provided in the same row. The other of the source and the drain of the transistor 55 is electrically connected to the wiring 93 (OUT2). A gate of the transistor 55 is electrically connected to an output terminal of an inverter circuit 27. An input terminal of the inverter circuit 27 is electrically connected to the wiring 573 (SE2).

Connection between the transistor 57, the transistor 58, and the capacitor C3 in the second reference memory block 25 is similar to that in the second memory blocks 24[A] and 24[B]. Note that the second reference memory block 25 includes neither the transistor 55 nor the transistor 56, and the gate of the transistor 57 is electrically connected to the wiring 71 (WW)[1]. The other of the source and the drain of the transistor 58 is electrically connected to a wiring 93 (OUT2)[REF]. The other of the source and the drain of the transistor 57 in each memory cell 36 is electrically connected to a wiring 74 (WD2)[REF].

The second data is input to charge retention nodes (SN2 [1,1], SN2[k,1], SN2[1,k], and SN2[k,k]) of the memory cells 36 in the second memory blocks 24[A] and 24[B] from wirings 574 (WD2)[1] to 574 (WD2)[k] through the transistors 57. In addition, a reference potential is input to charge retention nodes (SNREF2[1] and SNREF2[k]) of the memory cells 36 in the second reference memory block 25 from the wiring 74 (WD2)[REF] through the transistors 57.

Figure 9:
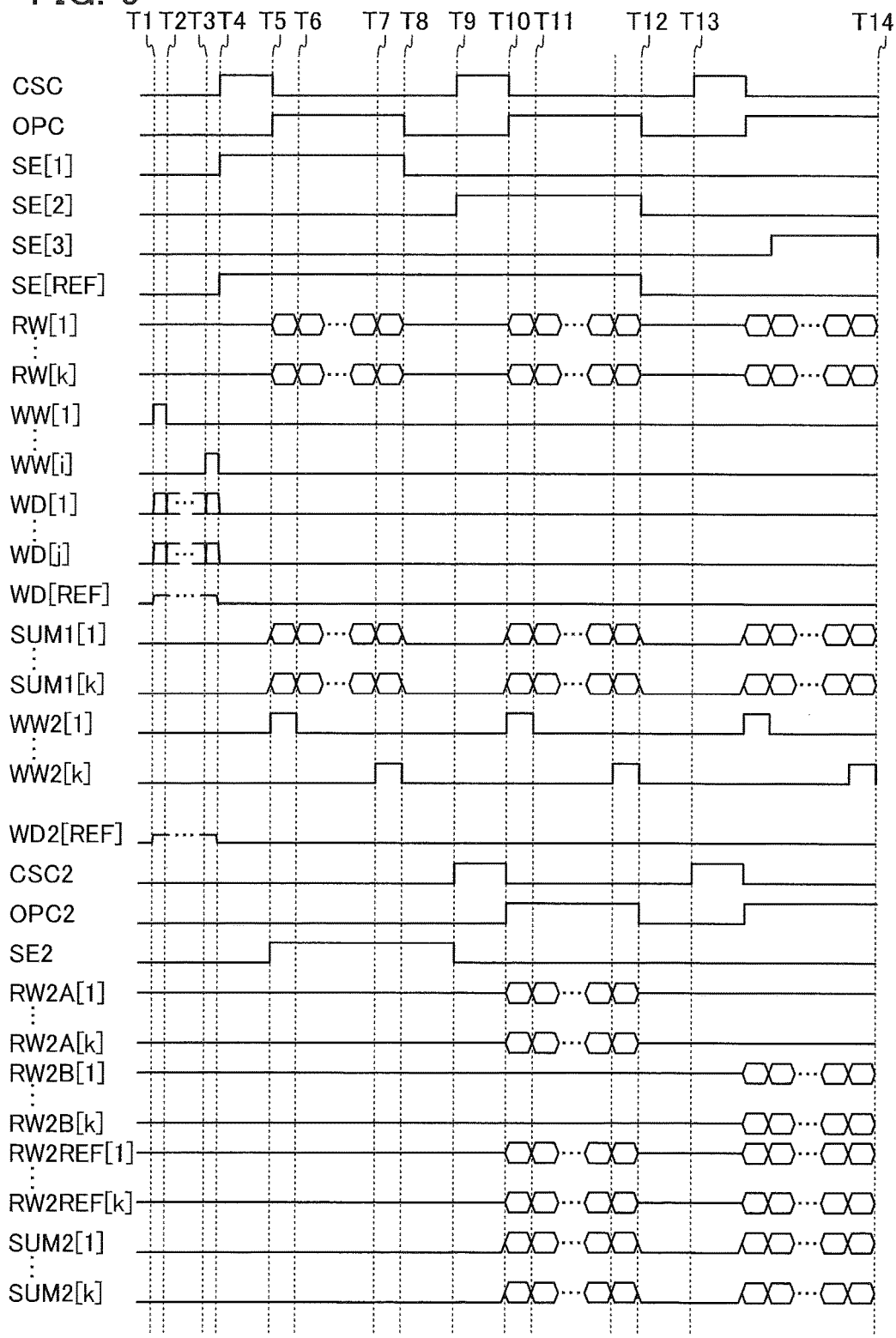
FIG. 9 is a timing chart illustrating operations of the circuit 10 and the circuit 20.

FIG. 9 is a timing chart illustrating the operation of the circuit 20. WW2[1] represents a potential supplied to a wiring 571 (WW2)[1]; WW2[k] represents a potential supplied to a wiring 571 (WW)[k]; CSC2 represents a potential supplied to the wiring 577 (CSC2); OPC2 represents a potential supplied to the wiring 578 (OPC2); SE2 represents a potential supplied to the wiring 573 (SE2); RW2A[1] represents a potential supplied to a wiring 572 (RW2A)[1]; RW2A[k] represents a potential supplied to a wiring 572 (RW2A)[k]; RW2B[1] represents a potential supplied to a wiring 572 (RW2B)[1]; RW2B[k] represents a potential supplied to a wiring 572 (RW2B)[k]; RW2REF[1] represents a potential supplied to a wiring 572 (RW2REF)[1]; RW2REF[k] represents a potential supplied to a wiring 572 (RW2REF)[k]; SUM2[1] represents the potential of the wiring 94 (SUM2)[1]; and SUM1 [k] represents the potential of a wiring 94 (SUM2)[k]. Note that CSC to SUM1 [k] in FIG. 9 show the operation of the circuit 10, and the description of FIG. 5 can be referred to.

Operation in a period from time T1 to time T4 is operation of writing each potential to a node SN, that is, the operation of the circuit 10. In the period, data of WD2[REF] that is a reference potential is written to the memory cell 36 in the second reference memory block 25 when the potential of the wiring 71 (WW)[1] is set to "H." Note that the timing of data writing may be any timing as long as any of the wirings 71 (WW)[1] to 71 (WW)[k] is set to "H."

From time T5 to time T6, the wiring 571 (WW2)[1] and the wiring 573 (SE2) are set to "H," and potentials VSUM1 [1,1] to [1,j] are written to nodes SN2[1,1] to SN2[1,j] in the second memory blocks 24[A] in operation blocks 21[1] to 21[j] through the wirings 574 (WD2)[1] to 574 (WD2)[j].

In other words, the second data output from the wirings 92 (SUM1)[1] to 92 (SUM1)[j] is written to the memory cells 36 to which the wiring 571 (WW2)[1] in the second memory blocks 24[A] is electrically connected.

From time T7 to time T8, a wiring 571 (WW2)[k] and the wiring 573 (SE2) are set to "H," and potentials VSUM1[k,1] to VSUM1[k,j] are written to nodes SN2[k,1] to SN2[k,j] in the second memory blocks 24[A] in the operation blocks 21[1] to 21[j] through the wirings 574 (WD2)[1] to 574 (WD2)[j].

In other words, the second data output from the wirings 92 (SUM1)[1] to 92 (SUM1)[j] is written to the memory cells 36 to which the wiring 571 (WW2)[k] in the second memory blocks 24[A] is electrically connected.

In other words, the second data obtained by operation in the circuit 10 is directly written to a node SN2 in the circuit 20 without a latch circuit or the like.

From time T9 to time T10, the potential of the wiring 577 (CSC2) is set to "H," the potential of the wiring 573 (SE2) is set to "L," and the potentials of the wirings 572 (RW2A) [1] to 572 (RW2A)[k], the wirings 572 (RW2B)[1] to 572 (RW2B)[k], and the wirings 572 (RW2REF)[1] to 572 (RW2REF)[k] are set to VRW2[REF]. Here, current IOUT2 [1] that is the sum of currents I2[1,1] to I2[1,k] flowing to the memory cells 36 in the second memory blocks 24[A] flows to a wiring 93 (OUT2)[1], and current IOUT2[REF] that is the sum of currents IREF2[1] to IREF2[k] flowing to the memory cells 36 in the second reference memory block 25 flows to the wiring 93 (OUT2)[REF].

In other words, operation of setting correction voltage to the circuits 522 (OUTSUM2)[1] to 522 (OUTSUM2)[j] included in the circuit 30 in the second memory blocks 24[A] in operation blocks 21[1] to 21 [j/k] is performed.

From time T10 to time T11, the potentials of the wiring 578 (OPC2) and the wiring 571 (WW2)[1] are set to "H," the potentials of the wiring 573 (SE2) and the wiring 577 (CSC2) are set to "L," the potentials of the wirings 572 (RW2A)[1] to 572 (RW2A)[k] and the wirings 572 (RW2REF)[1] to 572 (RW2REF)[k] are set to predetermined potentials VRW2[1,1] to VRW2[1,k], and the potentials of the wirings 572 (RW2B)[1] to 572 (RW2B)[k] are set to VRW2[REF].

Here, the value VSUM2[1,1] of a signal output to the wiring 94 (SUM2)[1] is the sum of products of the potentials VRW2[1,1] to VRW2[1,k] input from the wirings 572 (RW2A)[1] to 572 (RW2A)[k] and potentials that are obtained by subtracting VWD2[REF] from the potential VSUM[1,1] to a potential VSUM[1,k] written to the nodes SN2[1,1] to SN2[1,k] in the second memory blocks 24[A] from the wiring 574 (WD2)[1] in product-sum operation. In other words, the value VSUM2[1,1] of the signal output to the wiring 94 (SUM2)[1] corresponds to the sum of a product in the first column (VSUM[1,1]×VRW2[1,1]) to a product in the k-th column (VSUM[1,k]×VRW2[1,k]).

Potentials VSUM1[k+1,1] to VSUM1[k+1,j] are written to the nodes SN2[1,1] to SN2[1,j] in the second memory blocks 24[B] in the operation blocks 21[1] to 21[j] through the wirings 574 (WD2)[1] to 574 (WD2)[j].

In other words, the second data output from the wirings 92 (SUM1)[1] to 92 (SUM1)[j] is written to the memory cells 36 to which the wiring 571 (WW2)[1] in the second memory blocks 24[B] is electrically connected. At this time, data of the wirings 572 (RW2B)[1] to 572 (RW2B)[k] connected to the second memory blocks 24[B] is VRW2[REF].

From time T11 to time T12, the potentials of the wiring 578 (OPC2) and the wiring 571 (WW2)[k] are set to "H," the potentials of the wiring 573 (SE2) and the wiring 577 (CSC2) are set to "L," the potentials of the wirings 572 (RW2A)[1] to 572 (RW2A)[k] and the wirings 572 (RW2REF)[1] to 572 (RW2REF)[k] are set to predetermined potentials VRW2[k,1] to VRW2[k,k], and the potentials of the wirings 572 (RW2B)[1] to 572 (RW2B)[k] are set to VRW2[REF].

Here, the value VSUM2[k,1] of a signal output to the wiring 94 (SUM2)[1] is the sum of products of the potentials VRW2[k,1] to VRW2[k,k] input from the wirings 572 (RW2A)[1] to 572 (RW2A)[k] and potentials that are obtained by subtracting VWD2[REF] from potentials VSUM[k,1] to VSUM[k,k] written to the nodes SN2[1,1] to SN2[1,k] in the second memory blocks 24[A] from the wiring 574 (WD2)[1] in product-sum operation. In other words, the value VSUM2[k,1] of the signal output to the wiring 94 (SUM2)[1] corresponds to the sum of a product in the first column (VSUM[k,1]×VRW2[k,1]) to a product in the k-th column (VSUM[k,k]×VRW2[k,k]).

The potentials VSUM1[k+1,1] to VSUM1[k+1,j] are written to the nodes SN2[k,1] to SN2[k,j] in the second memory blocks 24[B] in the operation blocks 21[1] to 21[j] through the wirings 574 (WD2)[1] to 574 (WD2)[j].

In other words, the second data output from the wirings 92 (SUM1)[1] to 92 (SUM1)[j] is written to the memory cells 36 to which the wiring 571 (WW2)[k] in the second memory blocks 24[B] is electrically connected.

In other words, the wiring 573 (SE2) is electrically connected to the gate of the transistor 56 included in the second memory blocks 24[A] and 24[B] and is electrically connected to one of the second memory blocks 24[A] and 24[B] through the inverter circuit 26. Thus, when the potential of the wiring 573 (SE2) is set to "H" or "L," the second data can be written to one of the second memory blocks 24[A] and 24[B].

The wiring 573 (SE2) is electrically connected to the gate of the transistor 55 included in the second memory blocks 24[A] and 24[B] through the inverter circuit 27. Thus, while the second data is written to one of the second memory blocks 24[A] and 24[B], the other of the second memory blocks 24[A] and 24[B] is connected to the circuit 30, so that product-sum operation of the second data that has been written can be performed.

In the semiconductor device in one embodiment of the present invention, when the potential of the wiring 573 (SE2) is alternately switched between "H" and "L," writing of data and operation of the data can be performed in parallel in the second memory blocks 24[A] and 24[B]. In other words, two-dimensional discrete cosine transform can be performed at high speed.

Figure 10A:
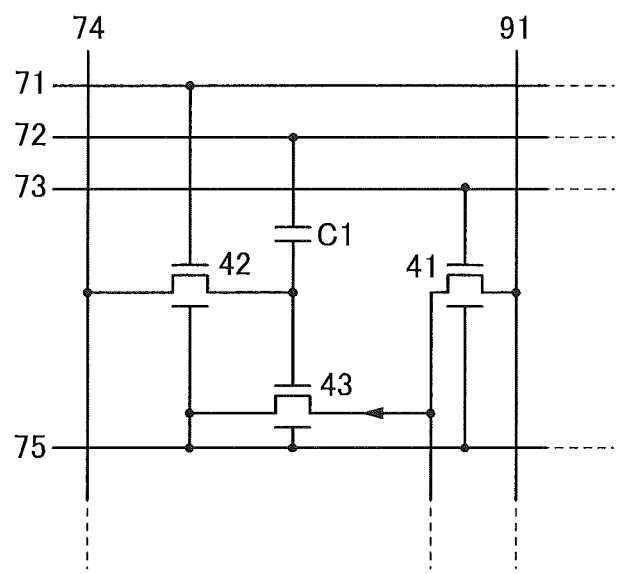
FIGS. 10A and 10B are circuit diagrams each illustrating a memory cell.
Figure 10B:
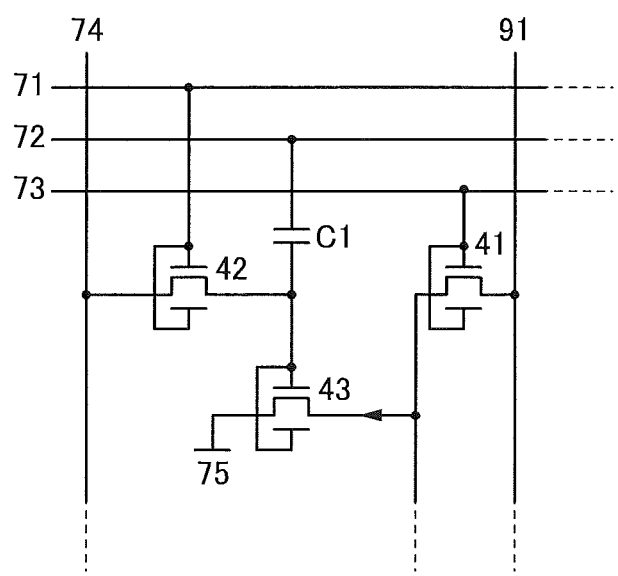

The transistors used in the circuits 10 and 20 may include back gates. For example, FIGS. 10A and 10B each illustrate a structure where the transistors 41 to 43 included in the first memory block 18 in FIG. 3 include back gates. FIG. 10A illustrates a structure in which a constant potential is applied to the back gates, which enables control of the threshold voltage. The back gates are connected to the wiring 75 (VSS) that supplies a low potential in the example of FIG. 10A, but may be connected to another wiring. FIG. 10B illustrates a structure in which the same potential is applied to the front gate and the back gate, which enables an increase in on-state current and a decrease in off-state current. The structures of FIGS. 10A and 10B and the like may be combined such that desired transistors can have appropriate electrical characteristics. Note that a transistor without a back gate may be provided. Other transistors used in the circuits 10 and 20 can include back gates.

Figure 11A:
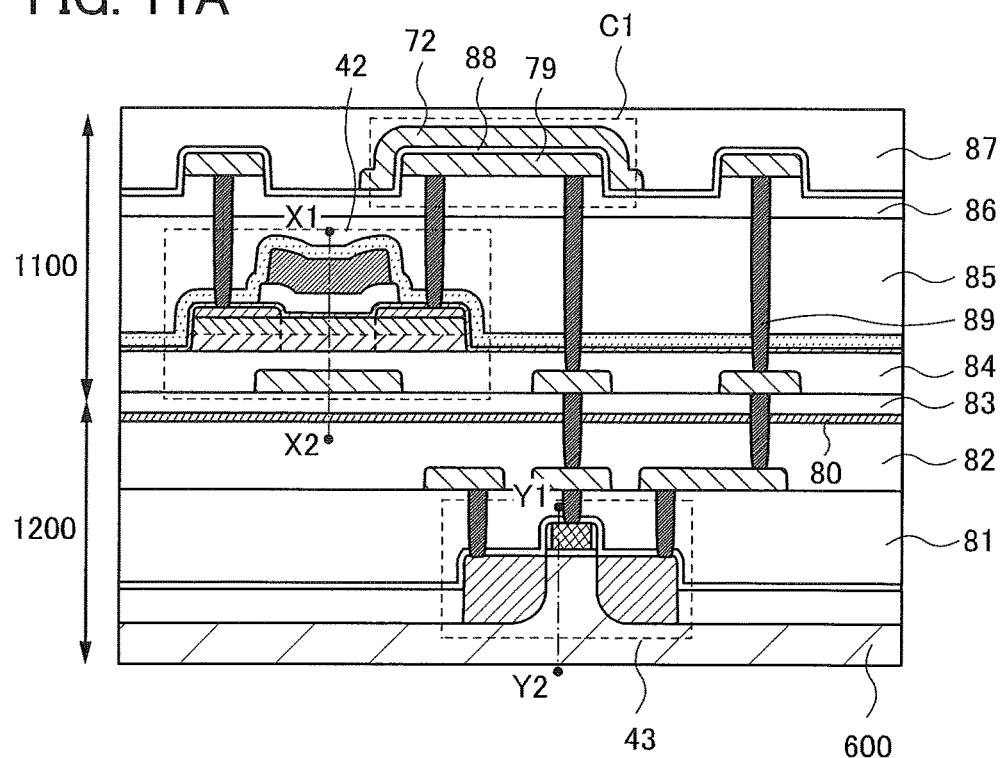
FIGS. 11A to 11C are cross-sectional views illustrating the memory cell.
Figure 11B:
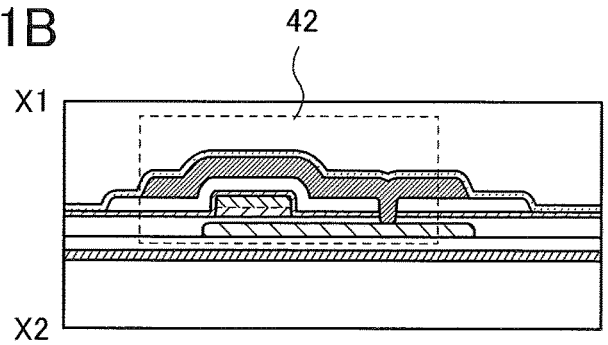
Figure 11C:
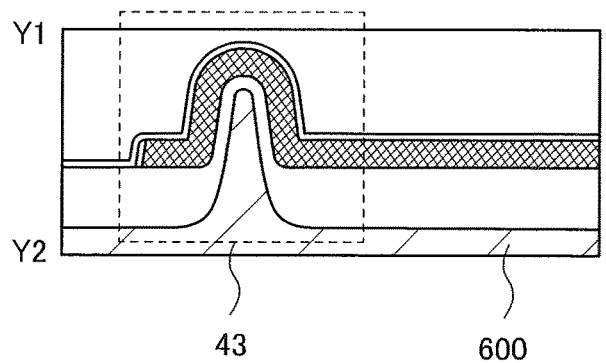

Specific structure examples of the semiconductor device in one embodiment of the present invention are described with reference to drawings. FIGS. 11A and 11B illustrate an example of specific connection between the transistor 42, the transistor 43, and the capacitor C1 that are included in the first memory block 18 in FIG. 3. FIG. 11A is a cross-sectional view in the channel length direction of the transistor 42. FIG. 11B is a cross-sectional view in the channel width direction of the transistor 42 taken along dashed-dotted line X1-X2 in FIG. 11A. FIG. 11C is a cross-sectional view in the channel width direction of the transistor 43 taken along dashed-dotted line Y1-Y2 in FIG. 11A.

As the transistor 42, it is preferable to use a transistor with extremely low off-state current that includes an oxide semiconductor in a channel formation region (hereinafter such a transistor is referred to as an OS transistor). With the use of the OS transistor, the potential of the node SN is held for a long time when the transistor 42 is off.

The transistor 43 preferably has a high amplification factor as a read transistor; thus, it is preferable to use a transistor including silicon (hereinafter such a transistor is referred to as a Si transistor). For example, a substrate 600 can be a silicon substrate, and the transistor 43 can be formed using the substrate 600.

Furthermore, the substrate 600 is not limited to a bulk silicon substrate and can be a substrate made of germanium, silicon germanium, silicon carbide, gallium arsenide, aluminum gallium arsenide, indium phosphide, gallium nitride, or an organic semiconductor.

A stacked structure of a layer 1100 including the transistor 42 and the capacitor C1 and a layer 1200 including the transistor 43 can be employed, as illustrated in FIG. 11A. Such a structure can reduce the area of the semiconductor device. Note that a component (e.g., an insulating layer, a wiring, or a contact plug) provided near a boundary between the two layers may be provided in either of the layers. Alternatively, part of the component in one of the layers may be provided in the other of the layers.

For example, the capacitor C1 can be provided over the transistor 42 with insulating layers 85 and 86 positioned therebetween. A conductive layer 79, the wiring 72 (RW), and an insulating layer 88 can be provided in the layer 1100 as one electrode, the other electrode, and a dielectric, respectively. An inorganic insulating film such as a silicon oxide film or a silicon oxynitride film can be used as the insulating layer 88, for example. Note that the capacitor C1 may be provided in the layer 1200.

Although the wirings, the electrodes, and contact plugs (conductors 89) are illustrated as independent components in cross-sectional views in this embodiment, some of them are provided as one component in some cases when they are electrically connected to each other. In addition, a structure in which the wiring is connected to the electrode through the conductor 89 is only an example, and the wiring may be directly connected to the electrode.

Insulating layers 81 to 87 and the like that function as protective films, interlayer insulating films, or planarization films are provided over the components. For example, an inorganic insulating film such as a silicon oxide film or a silicon oxynitride film can be used as each of the insulating layers 81 to 87 and the like. Alternatively, an organic insulating film such as an acrylic resin film or a polyimide resin film may be used. Top surfaces of the insulating layers 81 to 87 and the like may be planarized by chemical mechanical polishing (CMP) or the like as necessary.

In some cases, one or more of the wirings and the like illustrated in the drawing are not provided or a wiring, a transistor, or the like that is not illustrated in the drawing is included in each layer. In addition, a layer that is not illustrated in the drawing might be included. Furthermore, one or more of the layers illustrated in the drawing are not included in some cases.

Although the transistor 42 includes a back gate in FIG. 11A, the transistor 42 does not necessarily include a back gate. The back gate might be electrically connected to a front gate of the transistor that faces the back gate. Alternatively, different fixed potentials might be supplied to the back gate and the front gate. Note that the presence or absence of the back gate can also be applied to another circuit described in this embodiment.

Figure 12A:
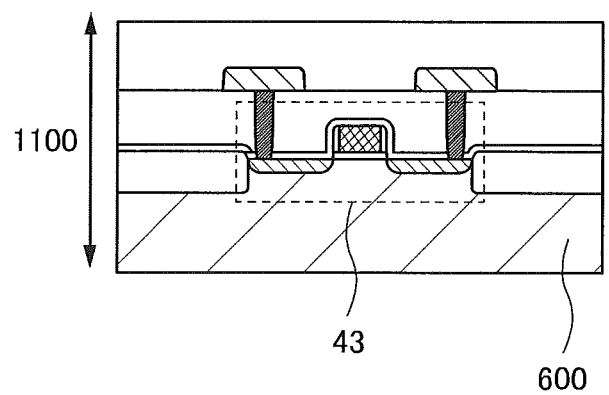
FIGS. 12A to 12C are cross-sectional views illustrating the memory cell.
Figure 12B:
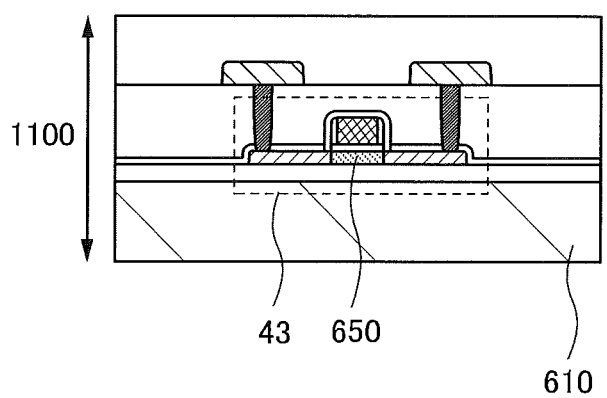
Figure 12C:
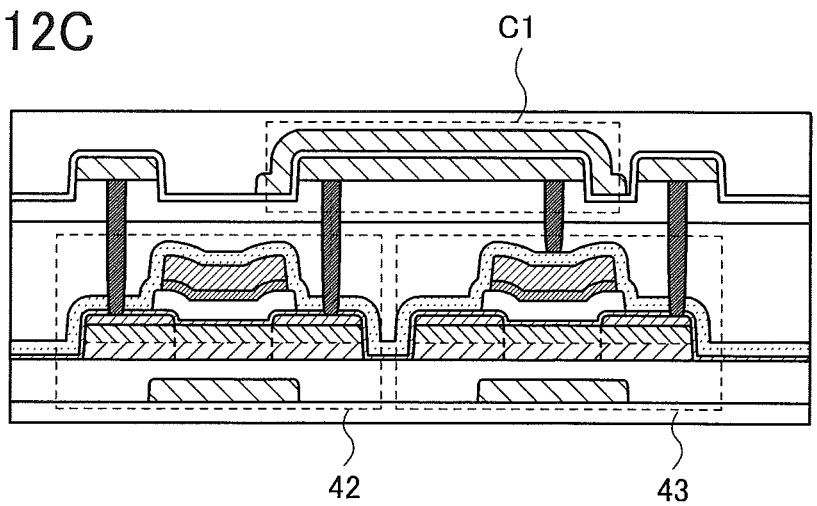

Although FIGS. 11A and 11C illustrate the Si transistors of a fin type, the transistors may be of a planar type as illustrated in FIG. 12A. As illustrated in FIG. 12B, the transistors may each be a transistor including an active layer 650 formed using a silicon thin film. The active layer 650 can be formed using polycrystalline silicon or single crystal silicon of a silicon-on-insulator (SOI) structure. In the structure of FIG. 12B, a glass substrate or the like can be used as a substrate 610. As illustrated in FIG. 12C, the transistor 43 may be an OS transistor. Alternatively, both the transistors 42 and 43 can be Si transistors.

As illustrated in FIG. 11A, an insulating layer 80 is provided between a region including an OS transistor and a region including a Si transistor.

Dangling bonds of silicon are terminated with hydrogen in an insulating layer provided in the vicinity of the active region of the transistor 43. Therefore, hydrogen has an effect of improving the reliability of the transistor 43. Meanwhile, hydrogen in an insulating layer provided in the vicinity of an oxide semiconductor layer that is the active layer of the transistor 42 causes generation of carriers in the oxide semiconductor layer. Therefore, hydrogen might reduce the reliability of the transistor 42. Consequently, in the case where one layer including the transistor formed using a silicon-based semiconductor material and the other layer including the OS transistor are stacked, it is preferable that the insulating layer 80 having a function of preventing diffusion of hydrogen be provided between the layers. Hydrogen is confined in the one layer by the insulating layer 80, so that the reliability of the transistor 43 or the like can be improved. Furthermore, diffusion of hydrogen from the one layer to the other layer is inhibited, so that the reliability of the transistor 42 or the like can also be improved.

The insulating layer 80 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

In this embodiment, one embodiment of the present invention has been described. Other embodiments of the present invention are described in the other embodiments. Note that one embodiment of the present invention is not limited thereto. In other words, various embodiments of the invention are described in this embodiment and the other embodiments, and one embodiment of the present invention is not limited to a particular embodiment. Although an example in which one embodiment of the present invention is applied to semiconductor device is described, one embodiment of the present invention is not limited thereto. Depending on circumstances or conditions, one embodiment of the present invention is not necessarily applied to a semiconductor device. One embodiment of the present invention may be applied to a semiconductor device with another function, for example. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor.

This embodiment can be combined with any of the structures described in the other embodiments as appropriate.

Embodiment 2

In this embodiment, a semiconductor device in which an imaging element is provided in the circuit 10 described in Embodiment 1 is described. Note that circuits other than the memory cell array 11, the circuit 13, the circuit 14, and the circuit 39 can have the same structures as those in Embodiment 1, and the description thereof is not repeated.

Figure 13:
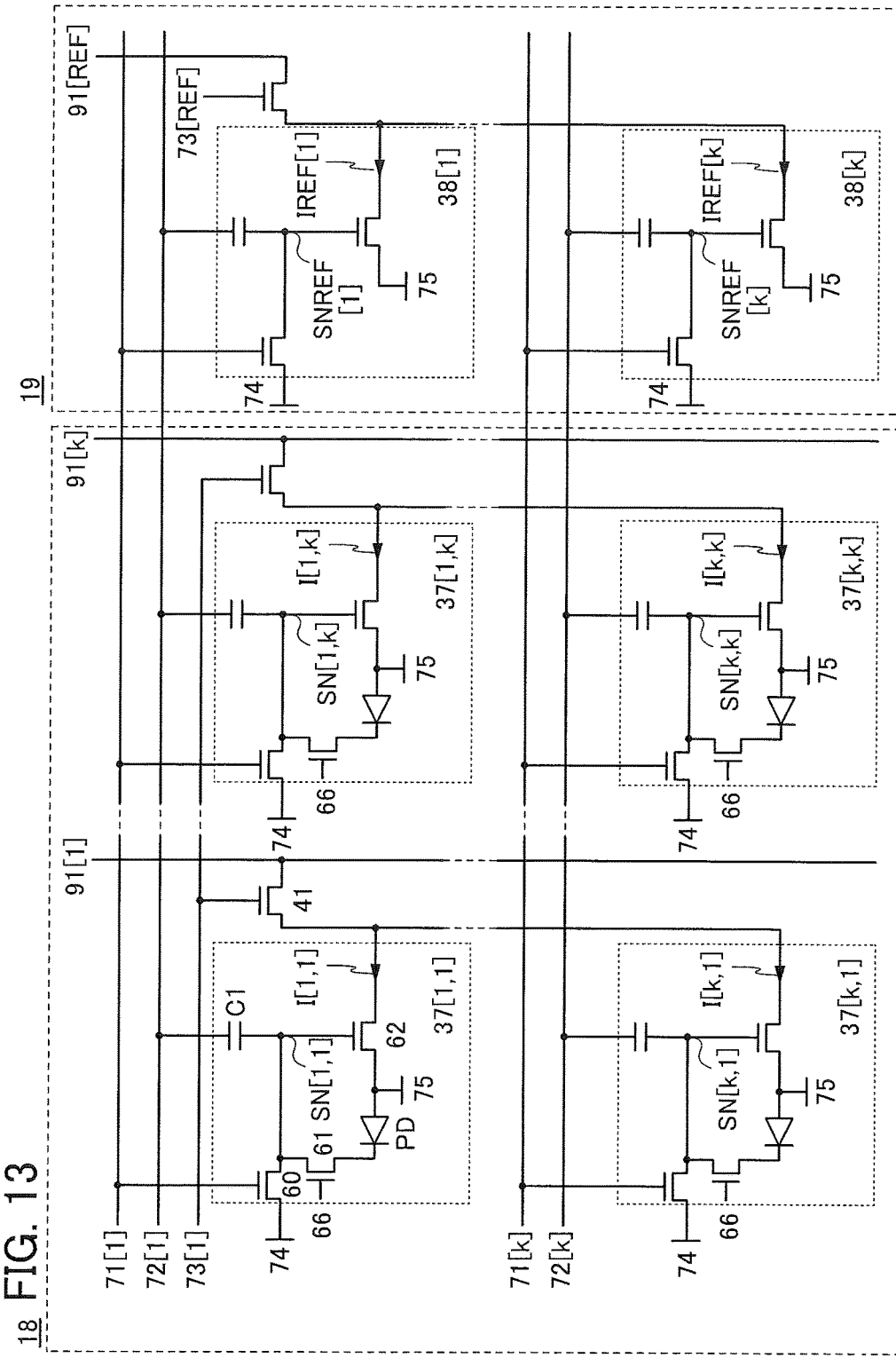
FIG. 13 is a circuit diagram illustrating memory cells with an imaging function.

FIG. 13 is an example of a circuit diagram of the first memory block 18 and the first reference memory block 19 that is different from the example in Embodiment 1. The first memory block 18 described in Embodiment 1 inputs data to be subjected to operation from the outside to the node SN; however, the first memory block 18 described in this embodiment includes an imaging element and determines the potential of the node SN by exposure.

The first memory block 18 in FIG. 13 includes memory cells 37 arranged in k rows and k columns. The first reference memory block 19 includes memory cells 38 arranged in k rows and one column. In addition, the first memory block 18 and the first reference memory block 19 each include the transistor 41 provided in each column.

The memory cell 37 includes a transistor 60, a transistor 61, a transistor 62, the capacitor C1, and a photoelectric conversion element PD. One of a source and a drain of the transistor 60 is electrically connected to one of a source and a drain of the transistor 61. The one of the source and the drain of the transistor 61 is electrically connected to a gate of the transistor 62 and one electrode of the capacitor C1. The other of the source and the drain of the transistor 61 is electrically connected to one electrode of the photoelectric conversion element PD.

The other of the source and the drain of the transistor 60 is electrically connected to the wiring 74 (WD). A gate of the transistor 60 is electrically connected to the wiring 71 (WW). The other electrode of the capacitor C1 is electrically connected to the wiring 72 (RW). The other electrode of the photoelectric conversion element PD and one of a source and a drain of the transistor 62 are electrically connected to the wiring 75 (VSS). A low power supply potential can be supplied to the wiring 75 (VSS), for example.

The other of the source and the drain of the transistor 62 is electrically connected to the one of the source and the drain of the transistor 41 provided in the same column. The gate of the transistor 41 is electrically connected to the wiring 73 (SE). The other of the source and the drain of the transistor 41 is electrically connected to the wiring 91 (OUT1).

A circuit structure other than the circuit structure in FIG. 13 may be used as long as the potential of the node SN is changed by the photoelectric conversion element PD.

The first reference memory block 19 described in this embodiment can have the same structure as the first reference memory block 19 described in Embodiment 1. In other words, the memory cell 35 and the memory cell 38 have the same structure.

The circuit 13 described in Embodiment 1 has a function of selecting each row of the memory cell 35; however, the circuit 13 described in this embodiment does not necessarily have a function of selecting a row because a reference potential VPR is written to all the memory cells 37 in this embodiment. In other words, the circuit 13 described in this embodiment may have a function of outputting a signal for controlling the on/off state of the transistor 60. Alternatively, it may be possible to eliminate the circuit 13 and control the on/off state of the transistor 60 by the circuit 39.

The circuit 14 described in Embodiment 1 has a function of supplying data to be subjected to operation; however, the circuit 14 described in this embodiment may have a function of supplying the reference potential VPR to the first memory block 18, the first reference memory block 19, and the second reference memory block 25 through the wiring 74 (WD).

In addition, in this embodiment, the circuit 39 that outputs control signals has a function of supplying a signal for controlling the on/off state of the transistor 61 through a wiring 66 (TX).

Data that is processed into VWD[REF]–VWD[1,1] to VWD[REF]–VWD[1,j] in advance is supplied from the circuit 14 to the memory cells 35 in the first row in each first memory block 18 described in Embodiment 1, and arithmetic processing is performed on the data.

On the other hand, the reference potential VPR is first stored in the memory cells 37 in the first row in each first memory block 18 described in this embodiment, and data of VWD[1,1] to VWD[1,j] is determined by release of electric charge with the photoelectric conversion element PD. In addition, the reference potential VPR is stored in the memory cells 38 in the first reference memory block 19. In other words, data of VPR–VWD[1,1] to VPR–VWD[1,j] is stored in the memory cells 37, and arithmetic processing similar to that in Embodiment 1 can be performed.

The release of electric charge with the photoelectric conversion element PD can be controlled by the on/off state of the transistor 61. The circuit 39 is electrically connected to a gate of the transistor 61 through the wiring 66 (TX), and the release of electric charge with the photoelectric conversion element PD is performed at almost the same time in all the memory cells 37 by control signals output from the circuit 39. In other words, imaging operation with a global shutter system is performed.

An OS transistor is preferably used as each of the transistors 60 and 61. The potential of the node SN can be held for a long time owing to low off-state current characteristics of the OS transistor, and imaging with a global shutter system can be achieved.

Moreover, the OS transistor has higher drain breakdown voltage than the Si transistor. To utilize avalanche multiplication, the photoelectric conversion element PD in which a selenium-based material is used for a photoelectric conversion layer is preferably operated while comparatively high voltage (e.g., 10 V or higher) is applied. Therefore, by combination of the OS transistor and the photoelectric conversion element PD in which the selenium-based material is used for the photoelectric conversion layer, a highly reliable imaging device can be obtained.

The photoelectric conversion element PD including a selenium-based material has high external quantum efficiency with respect to visible light. Furthermore, the selenium-based material has a high light absorption coefficient, which leads to an advantage that a photoelectric conversion layer 561 is easily formed to be thin. The photoelectric conversion element PD including a selenium-based material can be a highly sensitive sensor in which the amount of amplification is large because of avalanche multiplication. In other words, with the use of a selenium-based material for the photoelectric conversion layer 561, a sufficient amount of photocurrent can be obtained even when the pixel area is reduced. Thus, the photoelectric conversion element PD including a selenium-based material is also suitable for imaging in a low-illuminance environment.

Amorphous selenium or crystalline selenium can be used as a selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity and a higher absorption coefficient to visible light than amorphous selenium.

Furthermore, a compound of copper, indium, and selenium (CIS) may be used as a selenium-based material. Alternatively, a compound of copper, indium, gallium, and selenium (CIGS) may be used. With CIS or CIGS, the photoelectric conversion element PD that utilizes avalanche multiplication in a manner similar to that of a single layer of selenium can be formed.

Alternatively, a PIN diode element or the like formed using an amorphous silicon film, a microcrystalline silicon film, or the like may be used as the photoelectric conversion element PD. Alternatively, a PN photodiode including a silicon substrate as a photoelectric conversion layer may be used.

Accordingly, by using the semiconductor device in this embodiment, operations from imaging to two-dimensional discrete cosine transform can be performed at high speed with low power consumption. In addition, circuit area can be reduced because it is not necessary to provide an additional memory or the like for retaining imaging data.

This embodiment can be combined with any of the structures described in the other embodiments as appropriate.

Embodiment 3

In this embodiment, a transistor including an oxide semiconductor that can be used in one embodiment of the present invention is described with reference to drawings. In the drawings in this embodiment, some components are enlarged, reduced in size, or omitted for easy understanding.

Figure 14A:
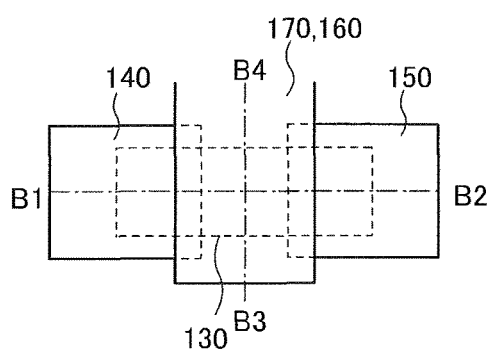
FIGS. 14A to 14F are top views and cross-sectional views illustrating transistors.
Figure 14B:
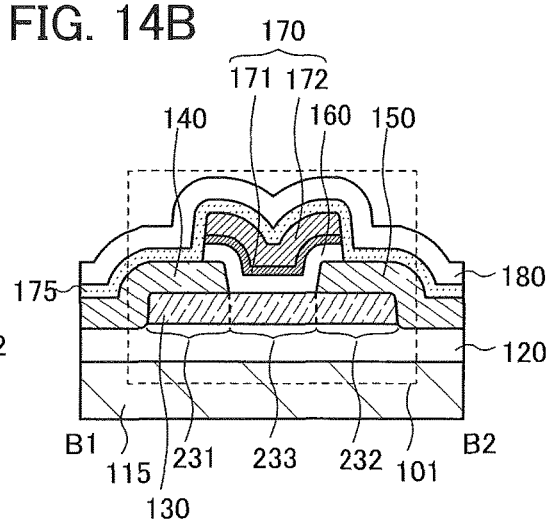
Figure 16A:
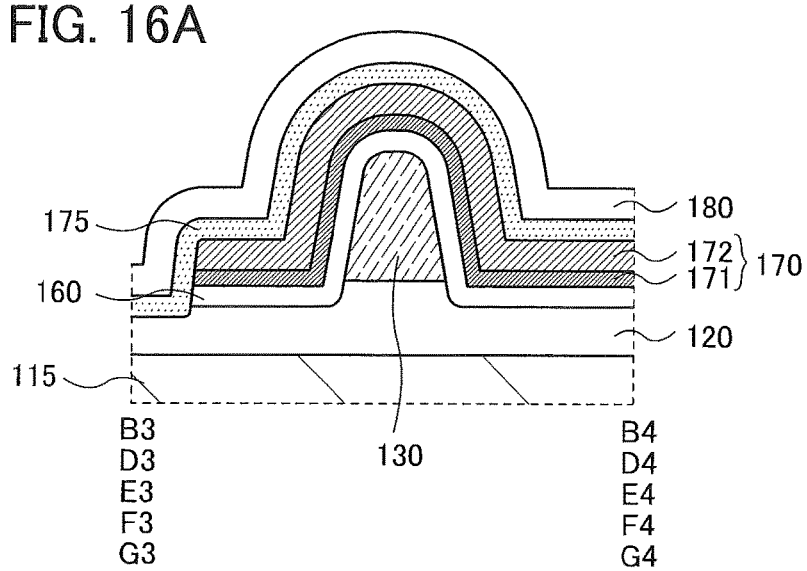
FIGS. 16A to 16D each illustrate a cross section of a transistor in a channel width direction.

FIGS. 14A and 14B are a top view and a cross-sectional view illustrating a transistor 101 in one embodiment of the present invention. FIG. 14A is a top view, and a cross section in the direction of dashed-dotted line B1-B2 in FIG. 14A is illustrated in FIG. 14B. A cross section in the direction of dashed-dotted line B3-B4 in FIG. 14A is illustrated in FIG. 16A. The direction of dashed-dotted line B1-B2 is referred to as a channel length direction, and the direction of dashed-dotted line B3-B4 is referred to as a channel width direction.

The transistor 101 includes an insulating layer 120 in contact with a substrate 115; an oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; a conductive layer 170 in contact with the insulating layer 160; an insulating layer 175 in contact with the conductive layers 140 and 150, the insulating layer 160, and the conductive layer 170; and an insulating layer 180 in contact with the insulating layer 175. The insulating layer 180 may function as a planarization film as necessary.

The conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 14B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of an opposite conductivity type is used or when the direction of current flow is changed in circuit operation, for example. Therefore, the terms "source" and "drain" can be interchanged with each other in this specification. In addition, the term "electrode layer" can be changed into the term "wiring."

The conductive layer 170 includes two layers, conductive layers 171 and 172, but also may be a single layer or a stack of three or more layers. The same applies to other transistors described in this embodiment.

Each of the conductive layers 140 and 150 is a single layer, but also may be a stack of two or more layers. The same applies to other transistors described in this embodiment.

Figure 14C:
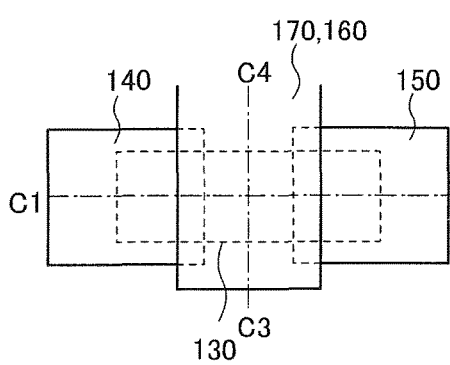
Figure 14D:
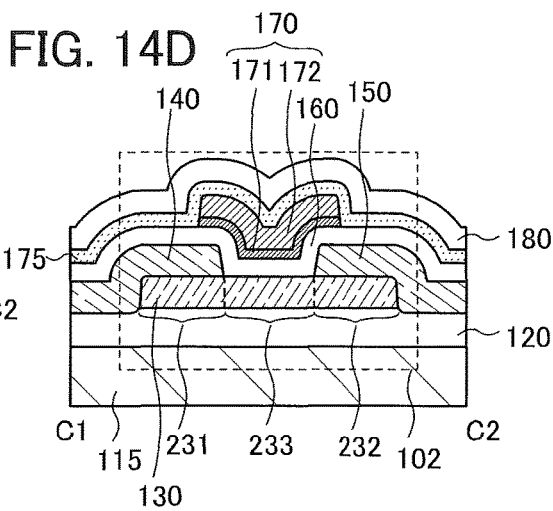
Figure 16B:
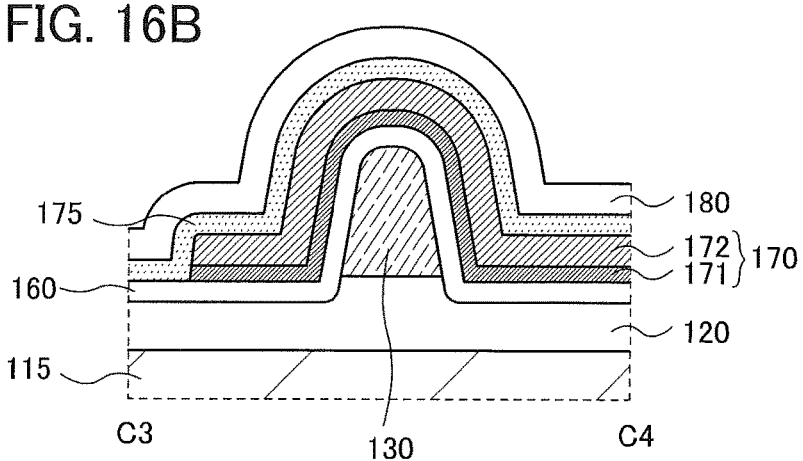

The transistor in one embodiment of the present invention may have a structure illustrated in FIGS. 14C and 14D. FIG. 14C is a top view of a transistor 102. A cross section in the direction of dashed-dotted line C1-C2 in FIG. 14C is illustrated in FIG. 14D. A cross section in the direction of dashed-dotted line C3-C4 in FIG. 14C is illustrated in FIG. 16B. The direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has low gate leakage current.

The transistors 101 and 102 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with high on-state current can be easily formed.

Figure 14E:
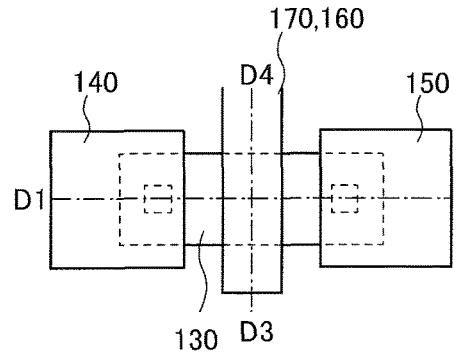
Figure 14F:
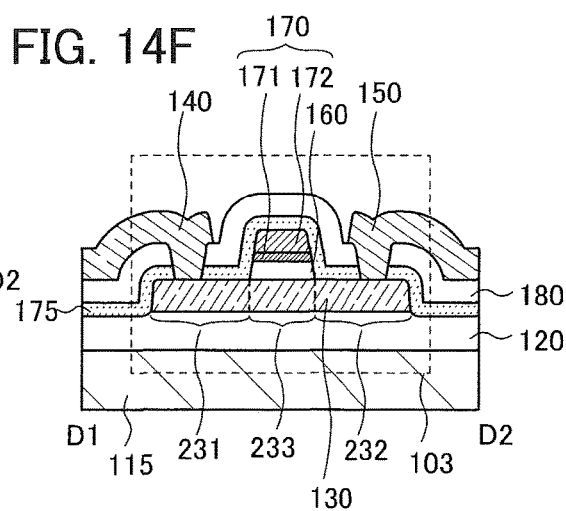

The transistor in one embodiment of the present invention may have a structure illustrated in FIGS. 14E and 14F. FIG. 14E is a top view of a transistor 103. A cross section in the direction of dashed-dotted line D1-D2 in FIG. 14E is illustrated in FIG. 14F. A cross section in the direction of dashed-dotted line D3-D4 in FIG. 14E is illustrated in FIG. 16A. The direction of dashed-dotted line D1-D2 is referred to as a channel length direction, and the direction of dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

The conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 14F can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

Figure 15A:
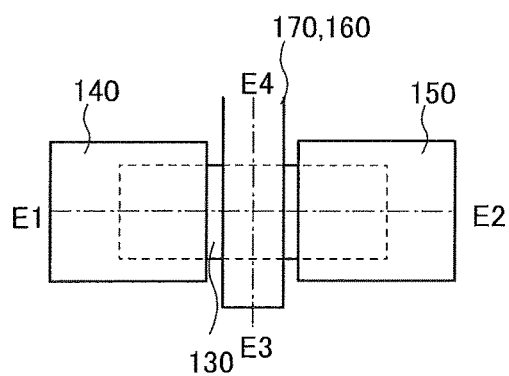
FIGS. 15A to 15F are top views and cross-sectional views illustrating transistors.
Figure 15B:
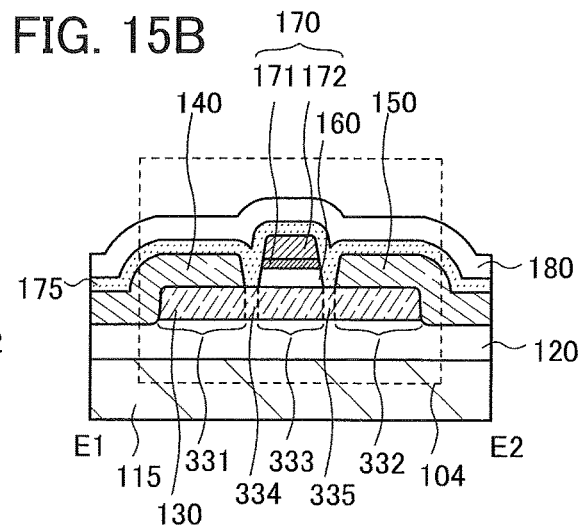

The transistor in one embodiment of the present invention may have a structure illustrated in FIGS. 15A and 15B. FIG. 15A is a top view of a transistor 104. A cross section in the direction of dashed-dotted line E1-E2 in FIG. 15A is illustrated in FIG. 15B. A cross section in the direction of dashed-dotted line E3-E4 in FIG. 15A is illustrated in FIG. 16A. The direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 are in contact with the oxide semiconductor layer 130 to cover end portions of the oxide semiconductor layer 130.

In FIG. 15B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the length of the regions 334 and 335 in the channel length direction is less than or equal to 100 nm, preferably less than or equal to 50 nm, a gate electric field prevents a significant decrease in on-state current. Therefore, a reduction in resistance of the regions 334 and 335 is not performed in some cases.

The transistors 103 and 104 each have a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

Figure 15C:
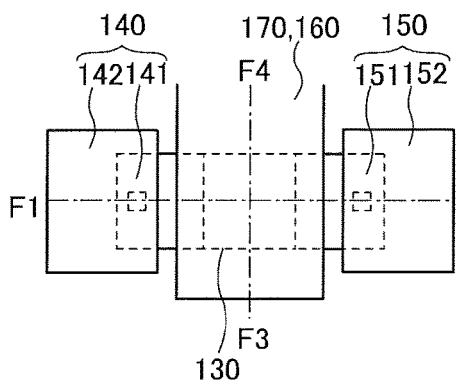
Figure 15D:
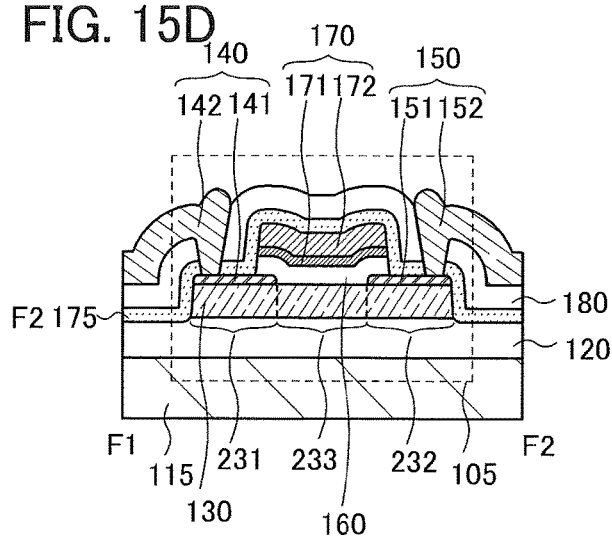

The transistor in one embodiment of the present invention may have a structure illustrated in FIGS. 15C and 15D. FIG. 15C is a top view of a transistor 105. A cross section in the direction of dashed-dotted line F1-F2 in FIG. 15C is illustrated in FIG. 15D. A cross section in the direction of dashed-dotted line F3-F4 in FIG. 15C is illustrated in FIG. 16A. The direction of dashed-dotted line F1-F2 is referred to as a channel length direction, and the direction of dashed-dotted line F3-F4 is referred to as a channel width direction.

The transistor 105 includes the insulating layer 120 in contact with the substrate 115; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

The conductive layers 141 and 151 are in contact with the top surface of the oxide semiconductor layer 130 and are not in contact with side surfaces of the oxide semiconductor layer 130.

The transistor 105 has the same structure as the transistor 101 except that the conductive layers 141 and 151 are provided, that openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

Figure 15E:
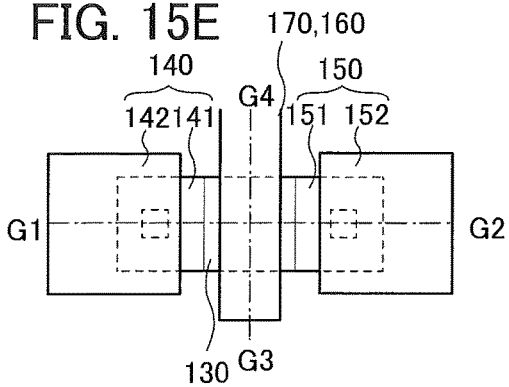
Figure 15F:
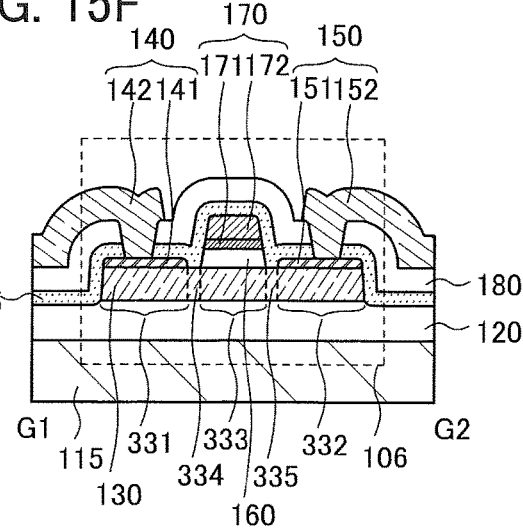

The transistor in one embodiment of the present invention may have a structure illustrated in FIGS. 15E and 15F. FIG. 15E is a top view of a transistor 106. A cross section in the direction of dashed-dotted line G1-G2 in FIG. 15E is illustrated in FIG. 15F. A cross section in the direction of dashed-dotted line G3-G4 in FIG. 15E is illustrated in FIG. 16A. The direction of dashed-dotted line G1-G2 is referred to as a channel length direction, and the direction of dashed-dotted line G3-G4 is referred to as a channel width direction.

The transistor 106 includes the insulating layer 120 in contact with the substrate 115; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

The conductive layers 141 and 151 are in contact with the top surface of the oxide semiconductor layer 130 and are not in contact with side surfaces of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 103 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band.

Consequently, an oxide conductor can be formed. Here, an oxide conductor refers to an oxide semiconductor having become a conductor. Note that the oxide conductor has a light-transmitting property in a manner similar to the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 16C:
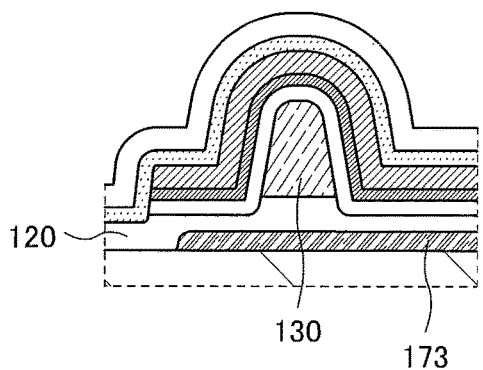
Figure 16D:
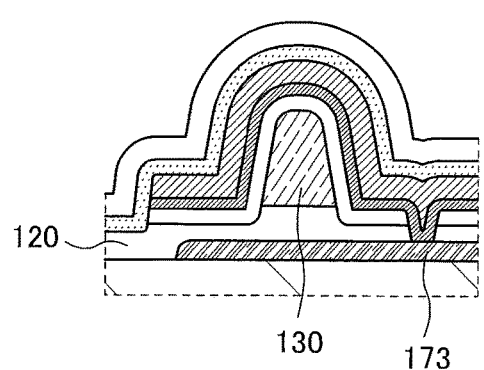
Figure 17A:
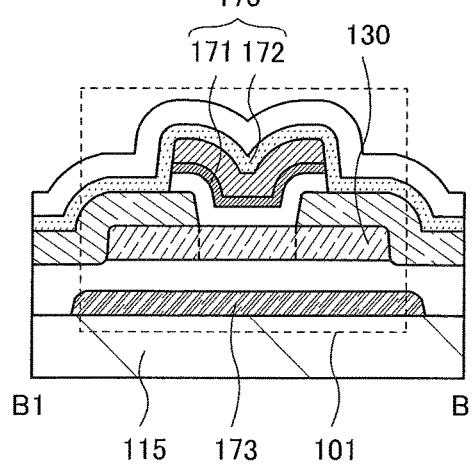
FIGS. 17A to 17F each illustrate a cross section of a transistor in a channel length direction.
Figure 17B:
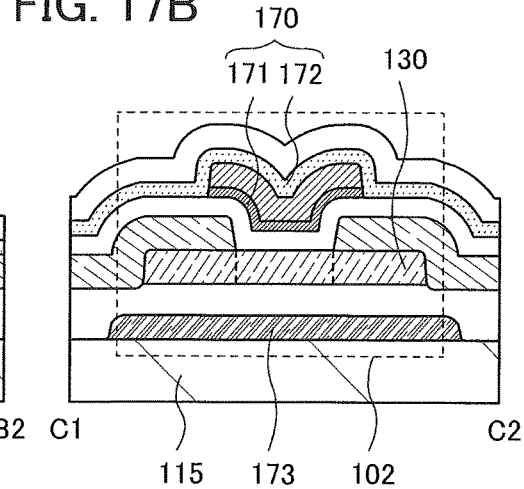
Figure 17C:
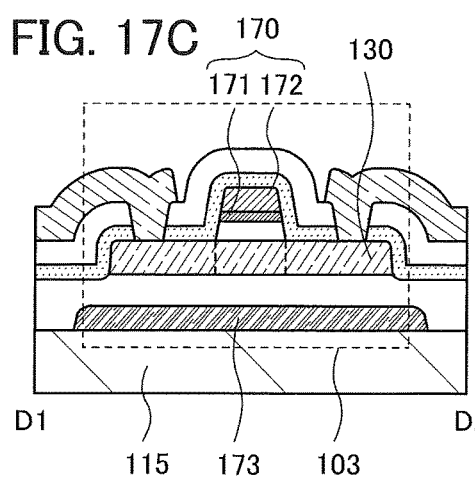
Figure 17D:
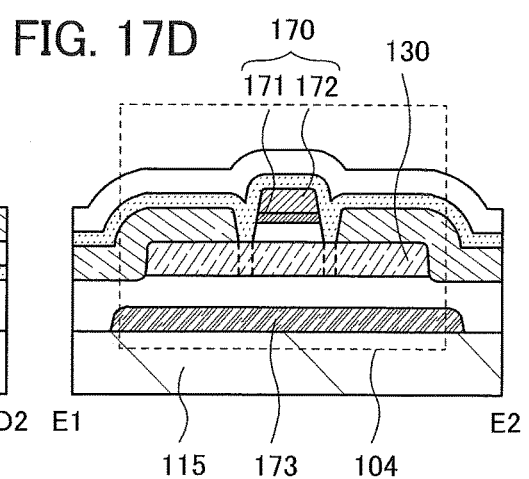
Figure 17E:
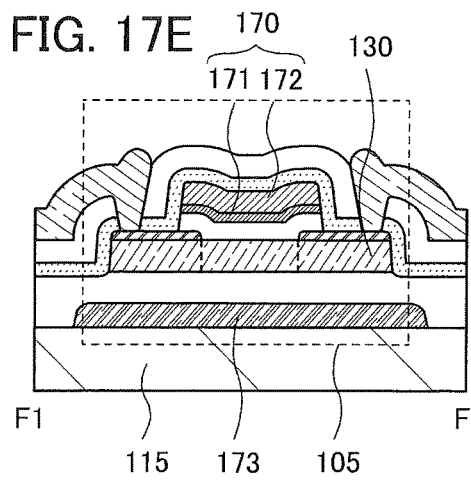
Figure 17F:
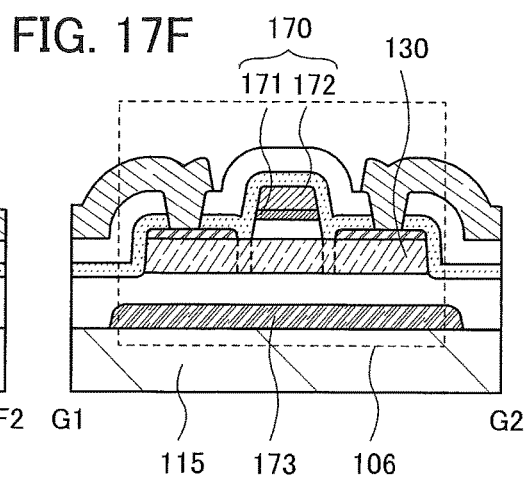

The transistor in one embodiment of the present invention may include a conductive layer 173 between the oxide semiconductor layer 130 and the substrate 115 as illustrated in cross-sectional views in the channel length direction in FIGS. 17A to 17F and cross-sectional views in the channel width direction in FIGS. 16C and 16D. When the conductive layer 173 is used as a second gate electrode layer (back gate), the on-state current can be increased or the threshold voltage can be controlled. In the cross-sectional views in FIGS. 17A to 17F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 at the same potential, for example, as illustrated in FIG. 16D, the conductive layers 170 and 173 may be electrically connected to each other through a contact hole.

Although the transistors 101 to 106 in FIGS. 14A to 14F and FIGS. 15A to 15F are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIG. 18B, 18C, 18D, or 18E.

Figure 18A:
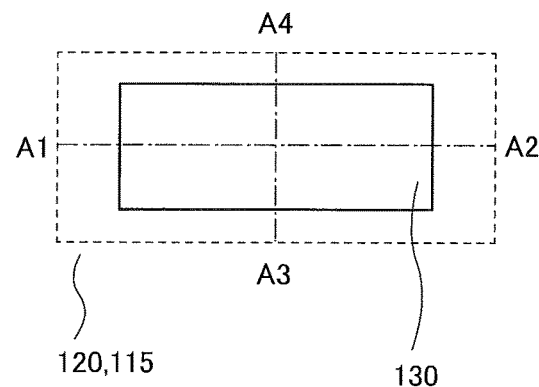
FIGS. 18A to 18E are a top view and cross-sectional views each illustrating a semiconductor layer.
Figure 18B:
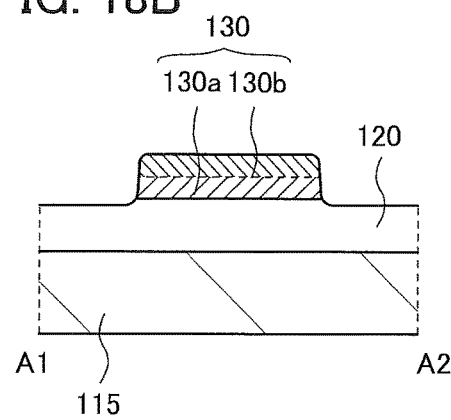
Figure 18D:
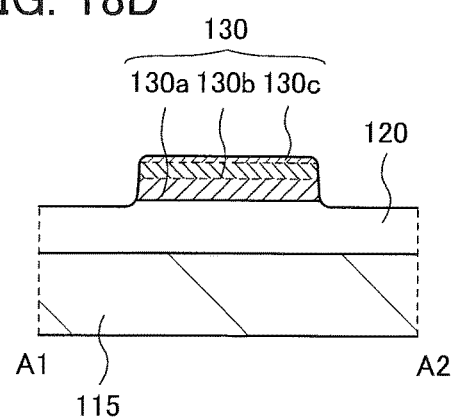
Figure 18C:
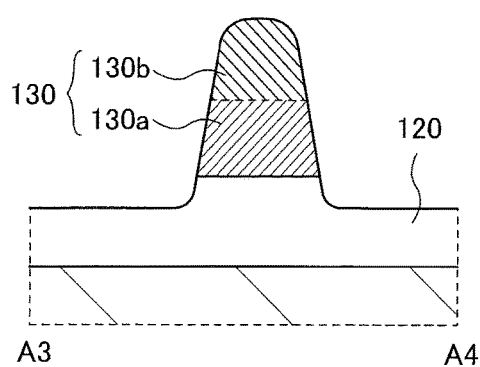
Figure 18E:
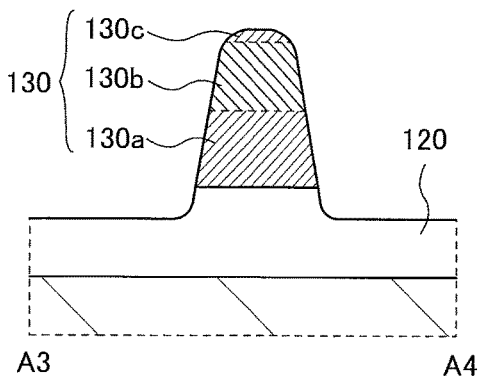

FIG. 18A is a top view of the oxide semiconductor layer 130, and FIGS. 18B and 18C are cross-sectional views of the oxide semiconductor layer 130 with a two-layer structure. FIGS. 18D and 18E are cross-sectional views of the oxide semiconductor layer 130 with a three-layer structure.

Oxide semiconductor layers with different compositions, for example, can be used as an oxide semiconductor layer 130a, an oxide semiconductor layer 130b, and an oxide semiconductor layer 130c.

Figure 19A:
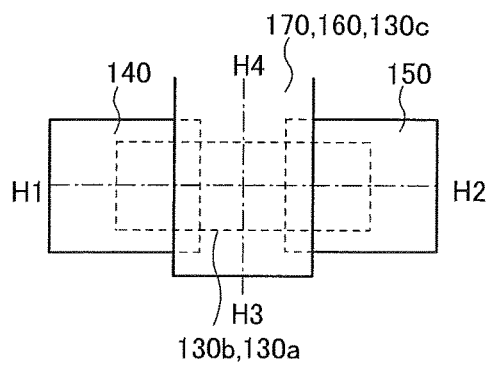
FIGS. 19A to 19F are top views and cross-sectional views illustrating transistors.
Figure 19B:
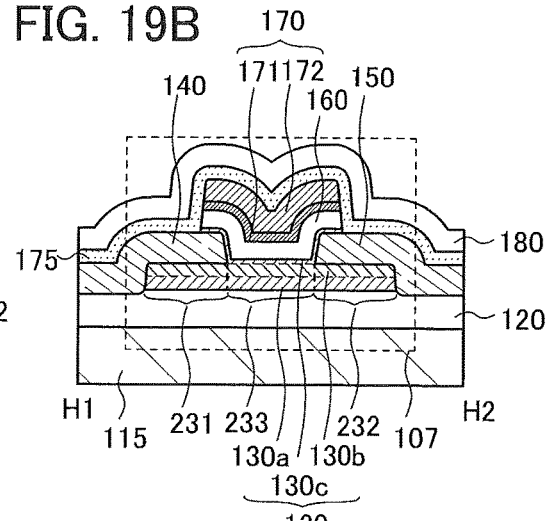
Figure 21A:
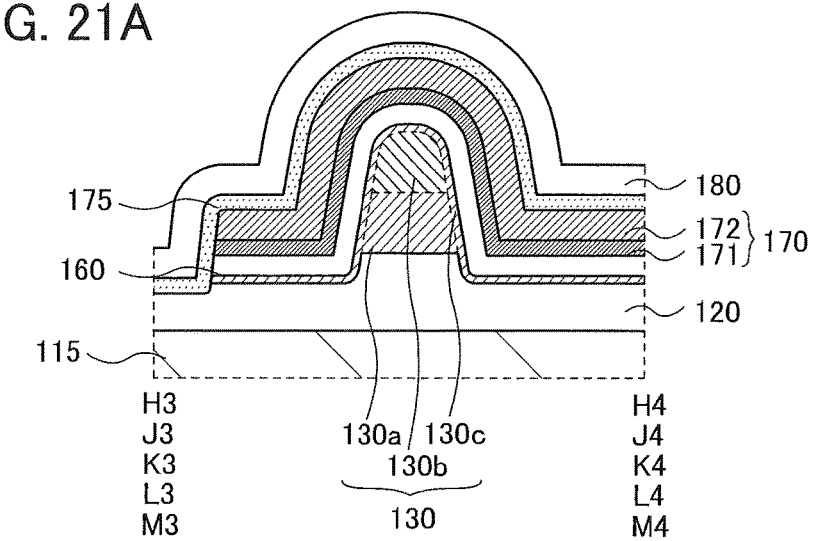
FIGS. 21A to 21D each illustrate a cross section of a transistor in a channel width direction.

The transistor in one embodiment of the present invention may have a structure illustrated in FIGS. 19A and 19B. FIG. 19A is a top view of a transistor 107. A cross section in the direction of dashed-dotted line H1-H2 in FIG. 19A is illustrated in FIG. 19B. A cross section in the direction of dashed-dotted line H3-H4 in FIG. 19A is illustrated in FIG. 21A. The direction of dashed-dotted line H1-H2 is referred to as a channel length direction, and the direction of dashed-dotted line H3-H4 is referred to as a channel width direction.

The transistor 107 includes the insulating layer 120 in contact with the substrate 115; a stack of the oxide semiconductor layers 130a and 130b in contact with the insulating layer 120; the conductive layers 140 and 150 electrically connected to the stack; the oxide semiconductor layer 130c in contact with the stack and the conductive layers 140 and 150; the insulating layer 160 in contact with the oxide semiconductor layer 130c; the conductive layer 170 in contact with the insulating layer 160; the insulating layer 175 in contact with the conductive layers 140 and 150, the oxide semiconductor layer 130c, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 140 and 150.

Figure 19C:
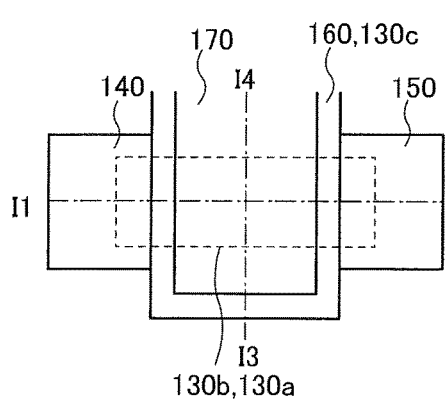
Figure 19D:
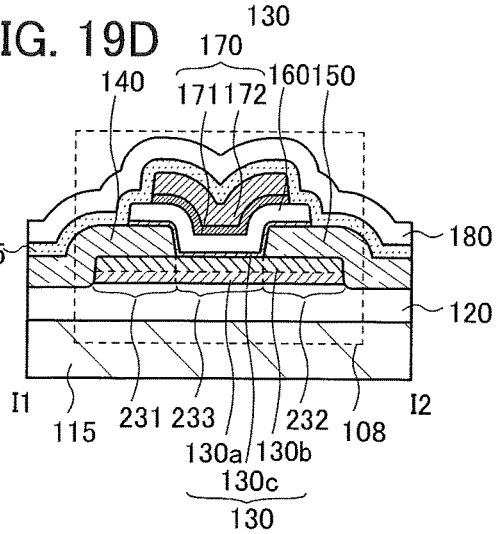
Figure 21B:
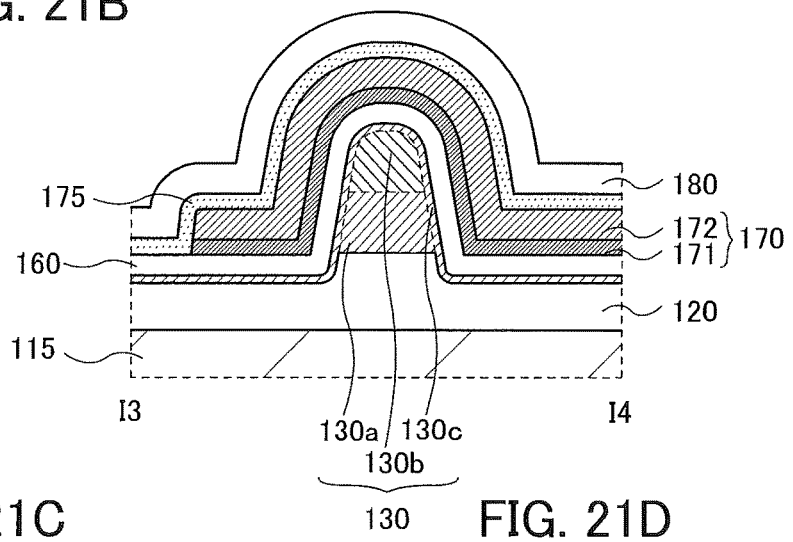

The transistor in one embodiment of the present invention may have a structure illustrated in FIGS. 19C and 19D. FIG. 19C is a top view of a transistor 108. A cross section in the direction of dashed-dotted line I1-I2 in FIG. 19C is illustrated in FIG. 19D. A cross section in the direction of dashed-dotted line I3-I4 in FIG. 19C is illustrated in FIG. 21B. The direction of dashed-dotted line I1-I2 is referred to as a channel length direction, and the direction of dashed-dotted line I3-I4 is referred to as a channel width direction.

The transistor 108 differs from the transistor 107 in that end portions of the insulating layer 160 and the oxide semiconductor layer 130c are not aligned with the end portion of the conductive layer 170.

Figure 19E:
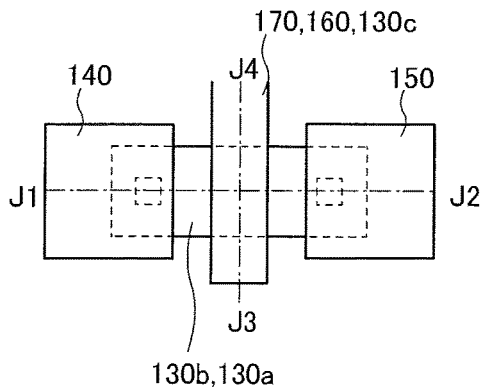
Figure 19F:
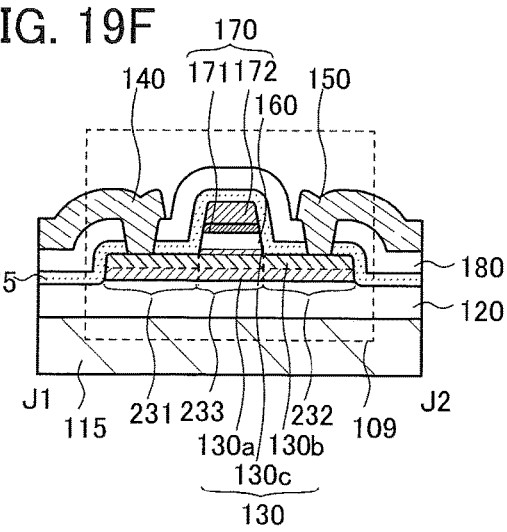

The transistor in one embodiment of the present invention may have a structure illustrated in FIGS. 19E and 19F. FIG. 19E is a top view of a transistor 109. A cross section in the direction of dashed-dotted line J1-J2 in FIG. 19E is illustrated in FIG. 19F. A cross section in the direction of dashed-dotted line J3-J4 in FIG. 19E is illustrated in FIG. 21A. The direction of dashed-dotted line J1-J2 is referred to as a channel length direction, and the direction of dashed-dotted line J3-J4 is referred to as a channel width direction.

The transistor 109 includes the insulating layer 120 in contact with the substrate 115; a stack of the oxide semiconductor layers 130a and 130b in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 20A:
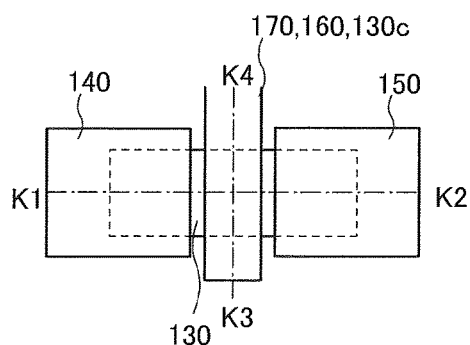
FIGS. 20A to 20F are top views and cross-sectional views illustrating transistors.
Figure 20B:
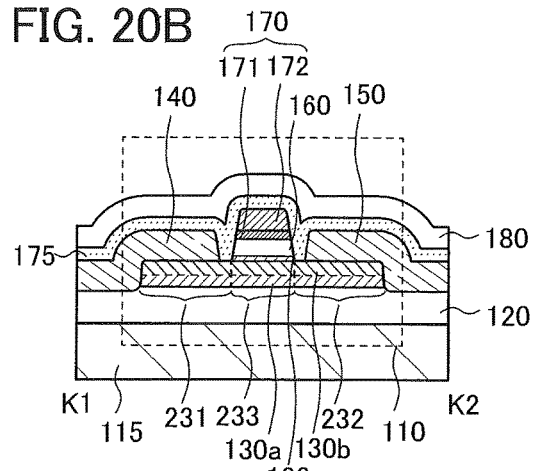

The transistor in one embodiment of the present invention may have a structure illustrated in FIGS. 20A and 20B. FIG. 20A is a top view of a transistor 110. A cross section in the direction of dashed-dotted line K1-K2 in FIG. 20A is illustrated in FIG. 20B. A cross section in the direction of dashed-dotted line K3-K4 in FIG. 20A is illustrated in FIG. 21A. The direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130a and 130b) in the regions 331 and 332 and that the oxide semiconductor layer 130 includes three layers (the oxide semiconductor layers 130a to 130c) in the region 333.

Figure 20C:
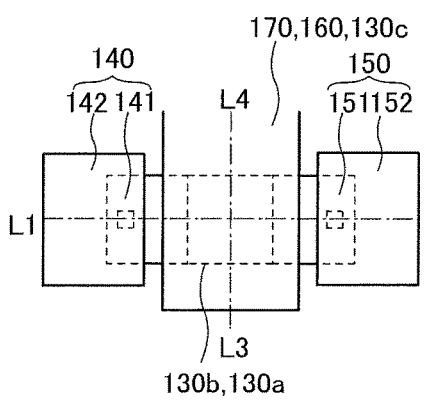
Figure 20D:
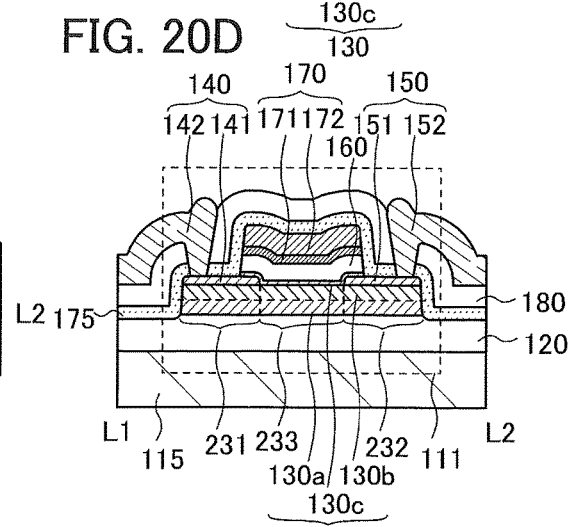

The transistor in one embodiment of the present invention may have a structure illustrated in FIGS. 20C and 20D. FIG. 20C is a top view of a transistor 111. A cross section in the direction of dashed-dotted line L1-L2 in FIG. 20C is illustrated in FIG. 20D. A cross section in the direction of dashed-dotted line L3-L4 in FIG. 20C is illustrated in FIG. 21A. The direction of dashed-dotted line L1-L2 is referred to as a channel length direction, and the direction of dashed-dotted line L3-L4 is referred to as a channel width direction.

The transistor 111 includes the insulating layer 120 in contact with the substrate 115; a stack of the oxide semiconductor layers 130a and 130b in contact with the insulating layer 120; the conductive layers 141 and 151 electrically connected to the stack; the oxide semiconductor layer 130c in contact with the stack and the conductive layers 141 and 151; the insulating layer 160 in contact with the oxide semiconductor layer 130c; the conductive layer 170 in contact with the insulating layer 160; the insulating layer 175 in contact with the stack, the conductive layers 141 and 151, the oxide semiconductor layer 130c, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 141 and 151.

Figure 20E:
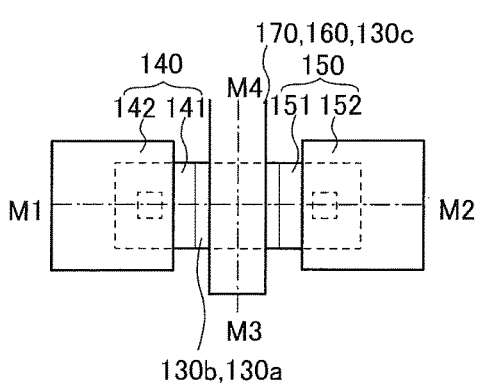
Figure 20F:
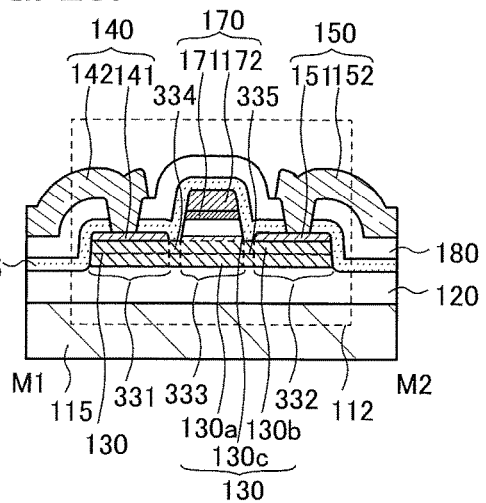

The transistor in one embodiment of the present invention may have a structure illustrated in FIGS. 20E and 20F. FIG. 20E is a top view of a transistor 112. A cross section in the direction of dashed-dotted line M1-M2 in FIG. 20E is illustrated in FIG. 20F. A cross section in the direction of dashed-dotted line M3-M4 in FIG. 20E is illustrated in FIG. 21A. The direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130a and 130b) in the regions 331, 332, 334, and 335 and that the oxide semiconductor layer 130 includes three layers (the oxide semiconductor layers 130a to 130c) in the region 333.

Figure 21C:
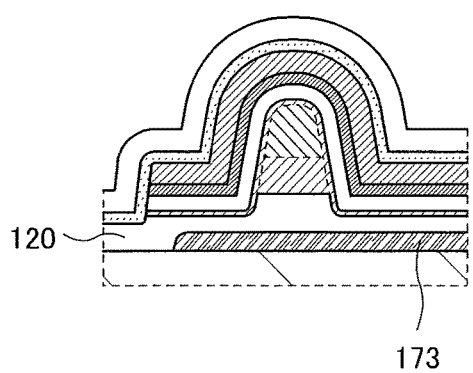
Figure 21D:
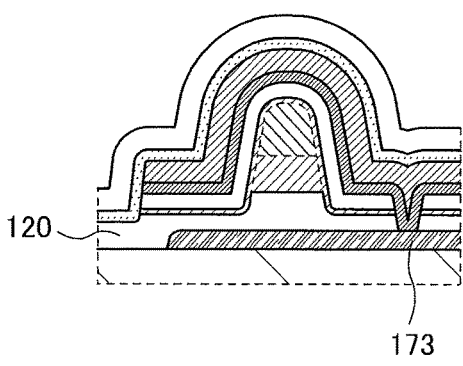
Figure 22A:
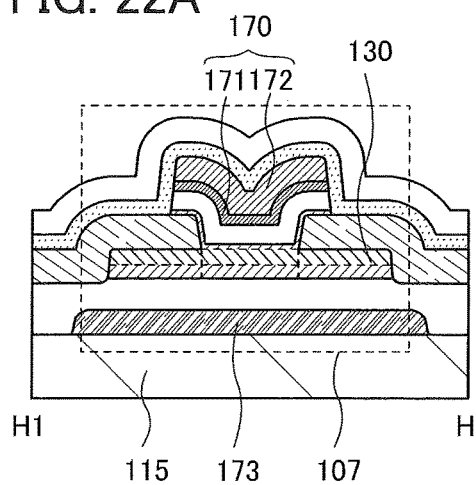
FIGS. 22A to 22F each illustrate a cross section of a transistor in a channel length direction.
Figure 22B:
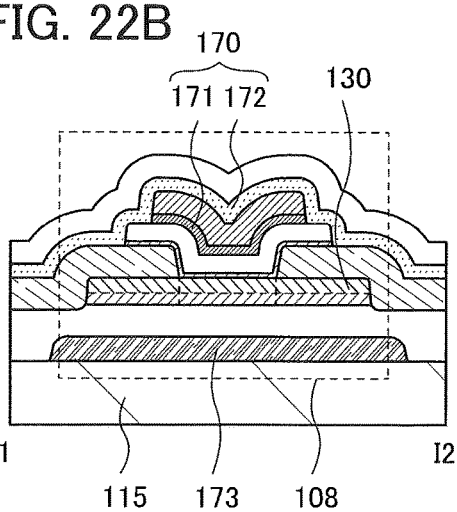
Figure 22C:
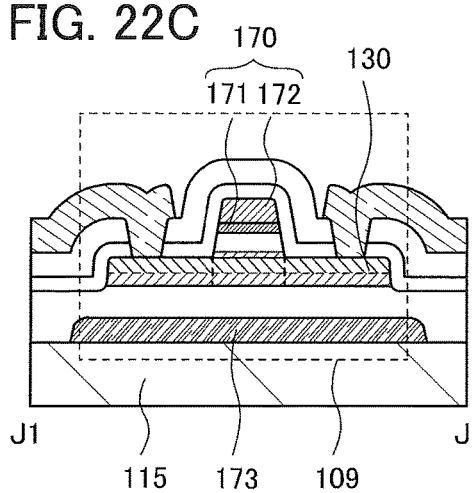
Figure 22D:
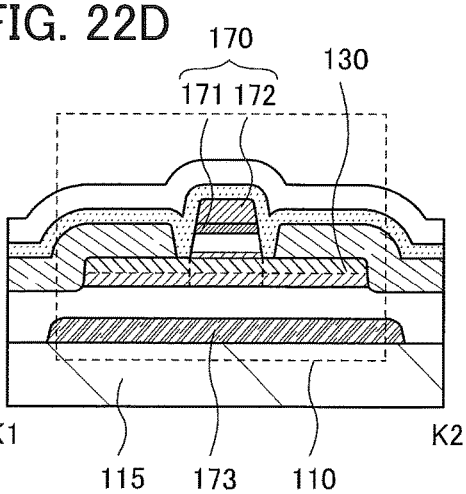
Figure 22E:
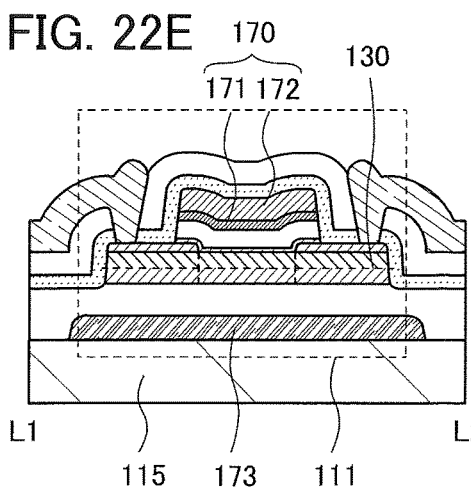
Figure 22F:
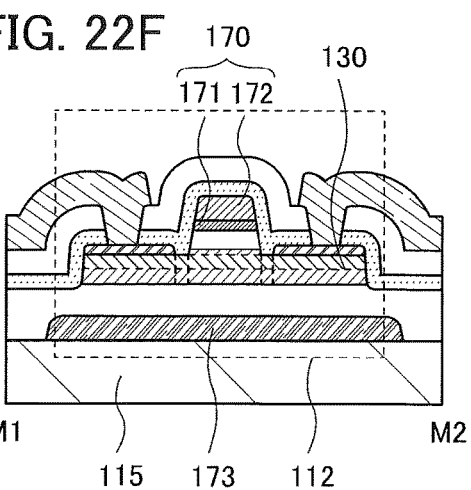

The transistor in one embodiment of the present invention may include the conductive layer 173 between the oxide semiconductor layer 130 and the substrate 115 as illustrated in cross-sectional views in the channel length direction in FIGS. 22A to 22F and cross-sectional views in the channel width direction in FIGS. 21C and 21D. When the conductive layer is used as a second gate electrode layer (back gate), the on-state current can be increased or the threshold voltage can be controlled. In the cross-sectional views in FIGS. 22A to 22F, the width of the conductive layer 173 may be shorter than that of the oxide semiconductor layer 130. Moreover, the width of the conductive layer 173 may be shorter than that of the conductive layer 170.

Figure 23A:
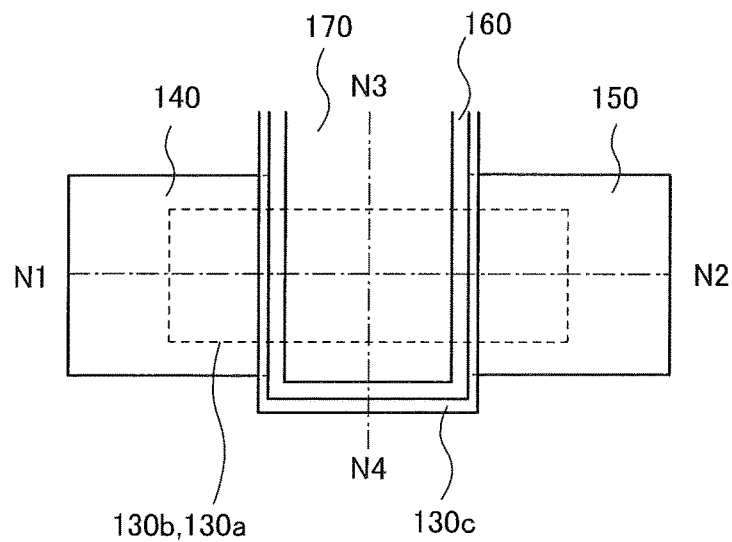
FIGS. 23A and 23B are a top view and a cross-sectional view illustrating a transistor.
Figure 23B:
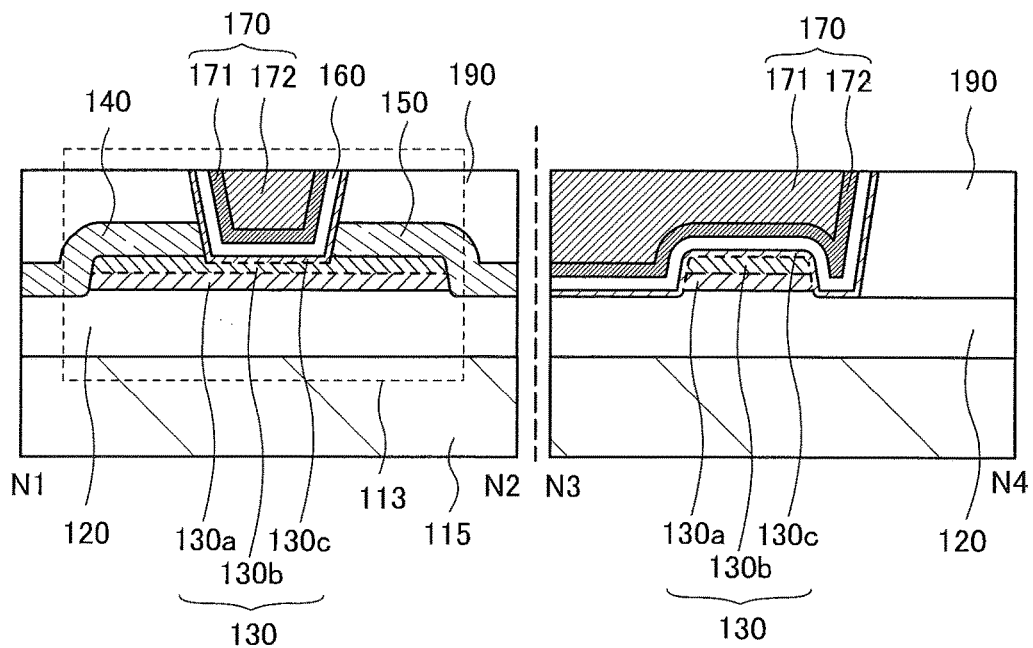

The transistor in one embodiment of the present invention can have a structure illustrated in FIGS. 23A and 23B. FIG. 23A is a top view and FIG. 23B is a cross-sectional view taken along dashed-dotted line N1-N2 and dashed-dotted line N3-N4 in FIG. 23A. Note that for simplification of the drawing, some components are not illustrated in the top view in FIG. 23A.

A transistor 113 in FIGS. 23A and 23B includes the substrate 115, the insulating layer 120 over the substrate 115, the oxide semiconductor layer 130 (the oxide semiconductor layers 130a to 130c) over the insulating layer 120, the conductive layers 140 and 150 that are in contact with the oxide semiconductor layer 130 and are apart from each other, the insulating layer 160 in contact with the oxide semiconductor layer 130c, and the conductive layer 170 in contact with the insulating layer 160. Note that the oxide semiconductor layer 130c, the insulating layer 160, and the conductive layer 170 are provided in an opening that is provided in the insulating layer 190 over the transistor 113 and reaches the oxide semiconductor layers 130a and 130b and the insulating layer 120.

The transistor 113 has a smaller region in which a conductor serving as a source or a drain overlaps with a conductor serving as a gate electrode than the other transistors described above; thus, parasitic capacitance in the transistor 113 can be reduced. Therefore, the transistor 113 is preferable as a component of a circuit that needs high-speed operation. As illustrated in FIG. 23B, a top surface of the transistor 113 is preferably planarized by chemical mechanical polishing (CMP) or the like, but is not necessarily planarized.

Figure 24A:
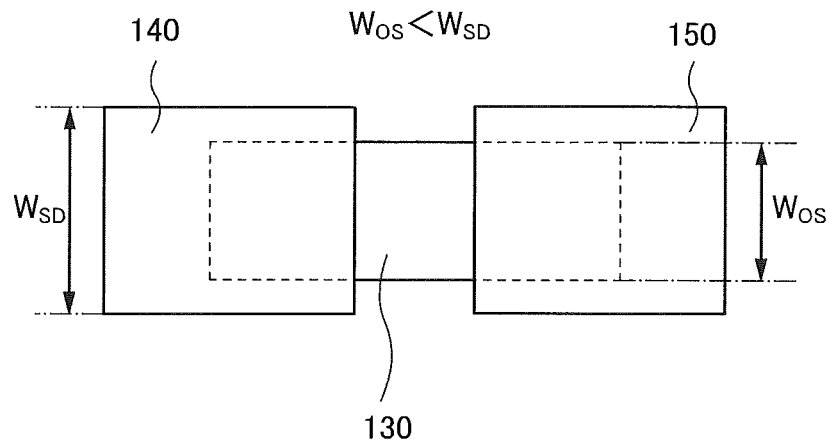
FIGS. 24A to 24C are top views each illustrating a transistor.
Figure 24B:
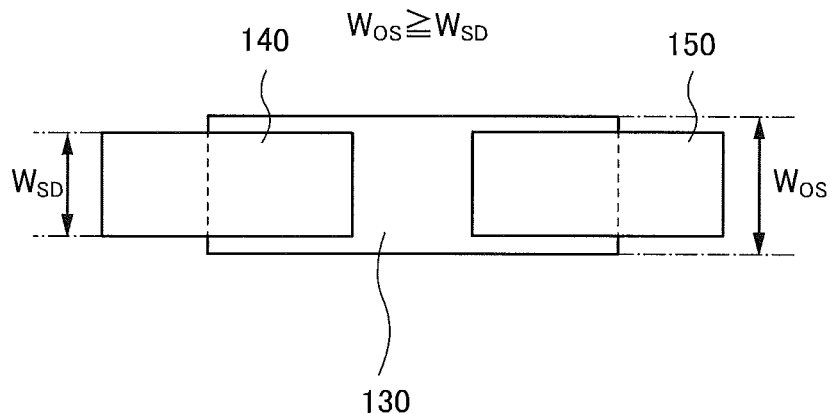
Figure 24C:
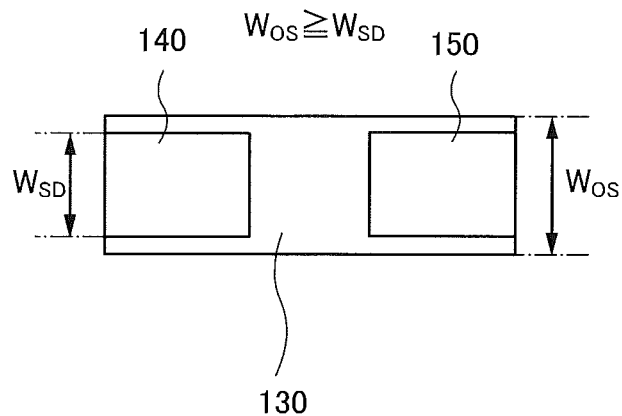

As illustrated in FIGS. 24A and 24B (illustrating only the oxide semiconductor layer 130, the conductive layer 140, and the conductive layer 150), the width ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved. As illustrated in FIG. 24C, the conductive layers 140 and 150 may be formed only in a region that overlaps with the oxide semiconductor layer 130.

In the transistor in one embodiment of the present invention (any of the transistors 101 to 113), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers fainting the oxide semiconductor layer 130 makes current flow to the oxide semiconductor layer 130*b*. Since current flows to the oxide semiconductor layer 130*b*, the current is hardly influenced by interface scattering, leading to high on-state current. Therefore, increasing the thickness of the oxide semiconductor layer 130*b* might increase the on-state current.

With the above structure, electrical characteristics of the transistor can be improved.

The structure described in this embodiment can be combined with any of the structures described in the other embodiments as appropriate.

Embodiment 4

In this embodiment, components of the transistors described in Embodiment 3 are described in detail.

As the substrate 115, a glass substrate, a quartz substrate, a semiconductor substrate, a ceramic substrate, a metal substrate having a surface subjected to insulation treatment, or the like can be used. The substrate 115 can be a silicon substrate provided with a transistor and/or a photodiode; and an insulating layer, a wiring, a conductor functioning as a contact plug, and the like that are provided over the silicon substrate. Note that when p-channel transistors are formed using the silicon substrate, a silicon substrate with n$^-$-type conductivity is preferably used. Alternatively, an SOI substrate including an n$^-$-type or i-type silicon layer may be used. In the case where a p-channel transistor is formed using the silicon substrate, a surface of the silicon substrate where the transistor is formed preferably has a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and more preferably, the insulating layer 120 is an insulating film containing oxygen in which the oxygen content is higher than that in the stoichiometric composition. The insulating layer 120 is a film in which the amount of released oxygen when converted into oxygen atoms is preferably greater than or equal to $1.0 \times 10^{19}$ atoms/cm$^3$ in TDS analysis. In the TDS analysis, the film surface temperature is higher than or equal to 100° C. and lower than or equal to 700° C., preferably higher than or equal to 100° C. and lower than or equal to 500° C. In the case where the substrate 115 is provided with another device, the insulating layer 120 also functions as an interlayer insulating film. In that case, the insulating layer 120 is preferably subjected to planarization treatment such as CMP so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

The oxide semiconductor layer 130 of the transistor can have a three-layer structure in which the oxide semiconductor layers 130*a* to 130*c* are sequentially stacked from the insulating layer 120 side.

Note that in the case where the oxide semiconductor layer 130 is a single layer, a layer corresponding to the oxide semiconductor layer 130*b* described in this embodiment is used.

In the case where the oxide semiconductor layer 130 has a two-layer structure, a stack in which a layer corresponding to the oxide semiconductor layer 130*a* and a layer corresponding to the oxide semiconductor layer 130*b* are sequentially stacked from the insulating layer 120 side is used. In such a case, the oxide semiconductor layers 130*a* and 130*b* can be replaced with each other.

For the oxide semiconductor layer 130*b*, for example, an oxide semiconductor whose electron affinity (an energy difference between a vacuum level and the conduction band minimum) is higher than those of the oxide semiconductor layers 130*a* and 130*c* is used.

In such a structure, when an electric field is applied to the conductive layer 170, a channel is formed in the oxide semiconductor layer 130*b* whose conduction band minimum is the lowest in the oxide semiconductor layer 130. Therefore, the oxide semiconductor layer 130*b* can be regarded as having a region serving as a semiconductor, while the oxide semiconductor layer 130*a* and the oxide semiconductor layer 130*c* can be regarded as having a region serving as an insulator or a semi-insulator.

An oxide semiconductor that can be used for each of the oxide semiconductor layers 130*a* to 130*c* preferably contains at least In or Zn. Both In and Zn are preferably contained. In order to reduce variations in electrical characteristics of the transistor including the oxide semiconductor, the oxide semiconductor preferably contains a stabilizer such as Al, Ga, Y, or Sn in addition to In and Zn.

The oxide semiconductor layers 130*a* to 130*e* preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor film Therefore, in a region of the oxide semiconductor film that is in contact with any of the above materials, oxygen is released from the oxide semiconductor layer and an oxygen vacancy is formed. Hydrogen slightly contained in the film and the oxygen vacancy are bonded to each other, so that the region is markedly changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, N, Zr, or the like as an impurity.

An example of a stacked structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, the insulating layer 160 using hafnium oxide or aluminum oxide can have larger thickness than the insulating layer 160 using silicon oxide, so that leakage current due to tunnel current can be reduced. That is, a transistor with low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with low off-state current. Examples of the crystal structure include a monoclinic crystal structure and a cubic crystal structure. Note that one embodiment of the present invention is not limited to the above examples.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide becomes high in some cases. For the insulating layers 120 and 160, for example, an oxide insulating layer such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typically greater than or equal to $1\times10^{18}$ cm$^{-3}$ and less than or equal to $5\times10^{19}$ cm$^{-3}$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, W, or the like can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. For example, tantalum nitride is used for the conductive layer 171 and tungsten is used for the conductive layer 172 to form the conductive layer 170. The conductive layer 170 may be formed using only tantalum nitride because tantalum nitride has a high hydrogen barrier property.

As the conductive layer 170, an oxide conductive layer of an In—Ga—Zn oxide, zinc oxide, indium oxide, tin oxide, indium tin oxide, or the like may be used.

As the insulating layer 175, a silicon nitride film, an aluminum nitride film, or the like containing hydrogen can be used. In the transistors 103, 104, 106, 109, 110, and 112 described in Embodiment 3, when an insulating film containing hydrogen is used as the insulating layer 175, part of the oxide semiconductor layer can have n-type conductivity. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 3. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120.

The insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, miniaturization of a transistor tends to cause deterioration of electrical characteristics of the transistor. For example, a decrease in channel width causes a reduction in on-state current.

In the transistors 107 to 112 in one embodiment of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and effective channel width is increased, leading to a further increase in the on-state current.

Although the variety of films such as the metal films, the semiconductor films, and the inorganic insulating films that are described in this embodiment typically can be formed by sputtering or plasma-enhanced CVD, such films may be formed by another method such as thermal CVD. Examples of thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide) hafnium) are used.

For example, in the case where an aluminum oxide film is formed by a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film Note that an $SiH_4$ gas may be used instead of a $B_2H_6$ gas.

For example, in the case where an oxide semiconductor film, e.g., an In—Ga—Zn—O film is formed by a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas which is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in a film can be reduced. In addition, the use of the facing-target-type sputtering apparatus enables low-pressure deposition. Accordingly, the concentration of impurities (e.g., hydrogen, a rare gas (e.g., argon), or water) in a deposited oxide semiconductor layer can be lowered.

The structure described in this embodiment can be combined with any of the structures described in the other embodiments as appropriate.

Embodiment 5

In this embodiment, the material of an oxide semiconductor that can be used for one embodiment of the present invention is described.

An oxide semiconductor preferably contains at least indium or zinc. In particular, indium and zinc are preferably contained. In addition, aluminum, gallium, yttrium, tin, or the like is preferably contained as an element M. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained as the element M.

Here, the case where an oxide semiconductor contains indium, the element M, and zinc is considered.

First, preferred ranges of the atomic ratio of indium, the element M, and zinc contained in an oxide semiconductor according to the present invention are described with reference to FIGS. 25A to 25C. Note that the proportion of oxygen atoms is not shown. The terms of the atomic ratio of indium, the element M, and zinc contained in the oxide semiconductor are denoted by [In], [M], and [Zn], respectively.

Figure 25A:
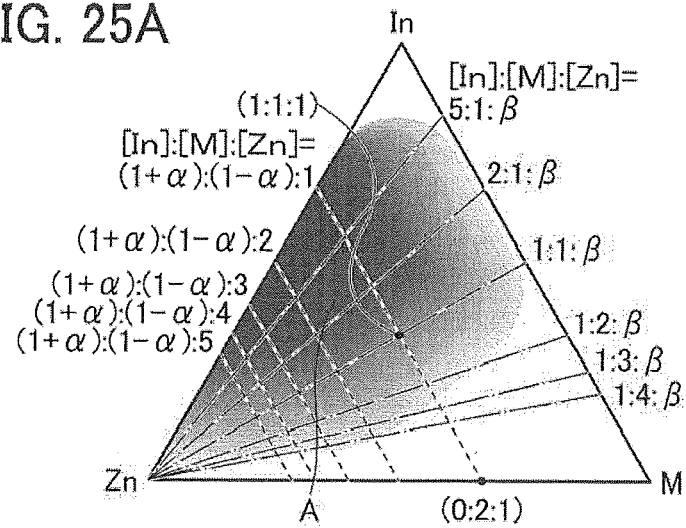
FIGS. 25A to 25C each show the range of the atomic ratio of an oxide semiconductor.
Figure 25B:
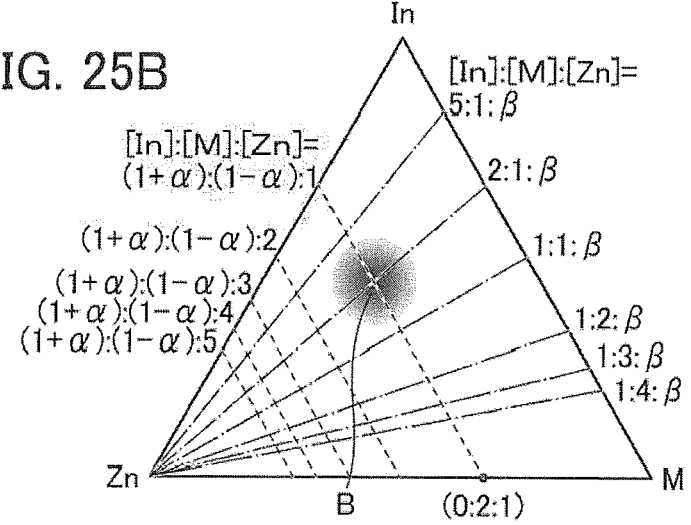
Figure 25C:
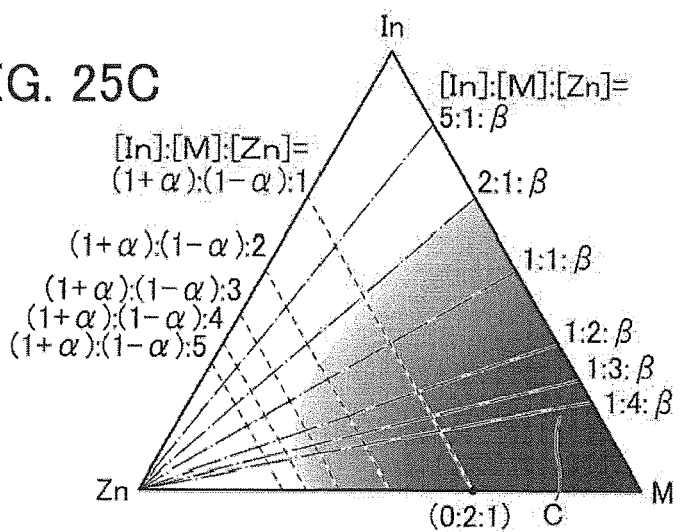

In FIGS. 25A to 25C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:M:[Zn] is $(1+\alpha):(1-\alpha):5$.

Dashed-dotted lines indicate a line where the atomic ratio [In]:[M]:[Zn] is $1:1:\beta$, where $\beta \geq 0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:M:[Zn] is $5:1:\beta$.

An oxide semiconductor with an atomic ratio of [In]:[M]:[Zn]=0:2:1 or vicinity thereof in FIGS. 25A to 25C is likely to have a spinel crystal structure.

FIGS. 25A and 25B show examples of the preferred ranges of the atomic ratio of indium, the element M, and zinc contained in an oxide semiconductor in one embodiment of the present invention.

Figure 26:
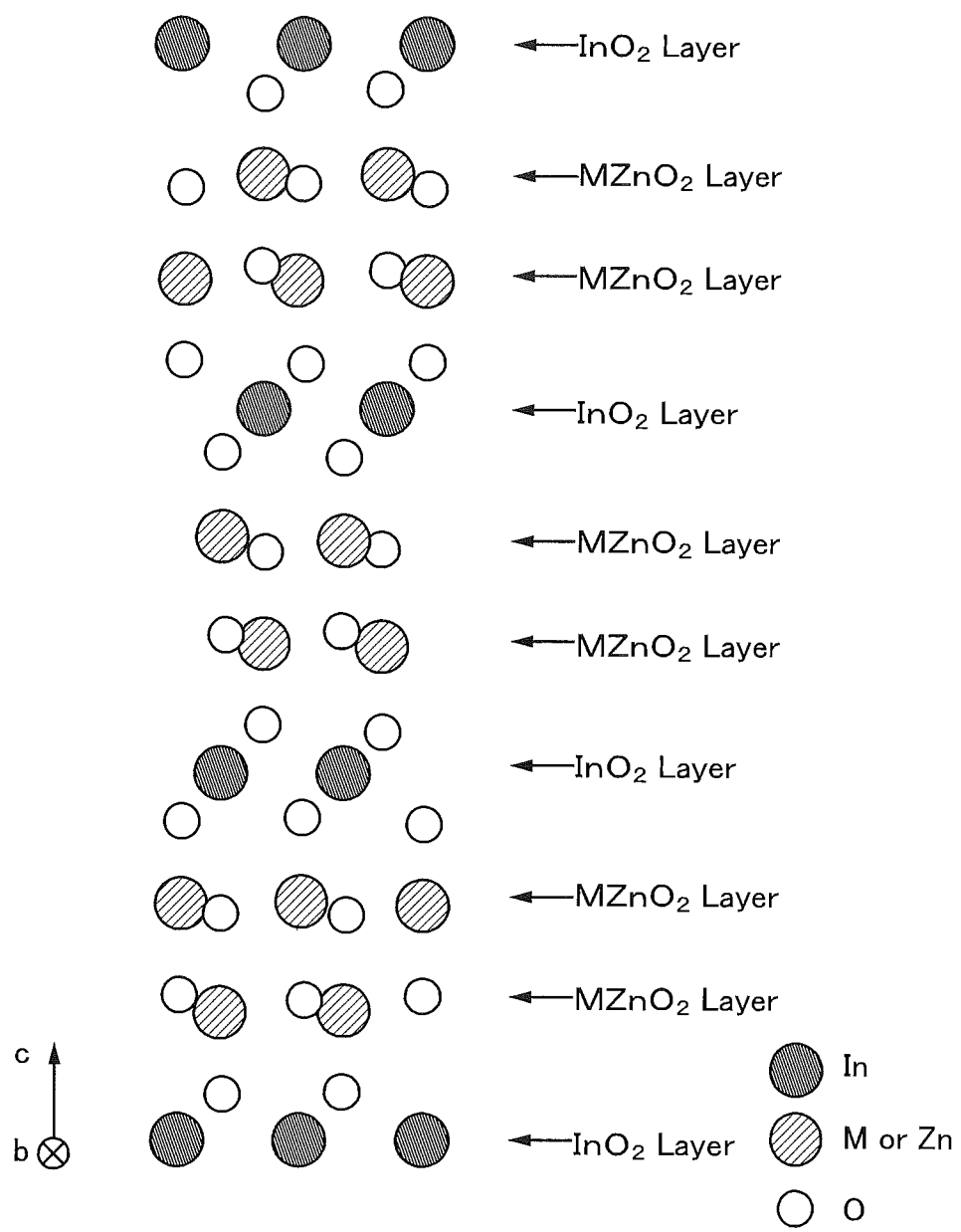
FIG. 26 shows the crystal structure of InMZnO$_4$.

FIG. 26 shows an example of the crystal structure of $InMZnO_4$ whose atomic ratio [In]:[M]:[Zn] is 1:1:1. The crystal structure shown in FIG. 26 is $InMZnO_4$ observed from a direction parallel to a b-axis. Note that a metal element in a layer that contains M, Zn, and oxygen (hereinafter, this layer is referred to as an "(M,Zn) layer") in FIG. 26 represents the element M or zinc. In that case, the proportion of the element M is the same as the proportion of zinc. The element M and zinc can be replaced with each other, and their arrangement is random.

$InMZnO_4$ has a layered crystal structure (also referred to as a layered structure) and includes one layer that contains indium and oxygen (hereinafter referred to as an In layer) with respect to two (M,Zn) layers that contain the element M, zinc, and oxygen, as shown in FIG. 26.

Indium and the element M can be replaced with each other. Therefore, when the element M in the (M,Zn) layer is replaced with indium, the layer can also be referred to as an (In,M,Zn) layer. In that case, a layered structure that contains one In layer with respect to two (In,M,Zn) layers is obtained.

An oxide semiconductor whose atomic ratio [In]:[M]:[Zn] is 1:1:2 has a layered structure that contains one In layer with respect to three (M,Zn) layers. In other words, if [Zn] is larger than [In] and [M], the proportion of the (M,Zn) layer to the In layer becomes higher when the oxide semiconductor is crystallized.

Note that in the case where the number of (M,Zn) layers with respect to one In layer is not an integer in the oxide semiconductor, the oxide semiconductor might have plural kinds of layered structures where the number of (M,Zn) layers with respect to one In layer is an integer. For example, in the case of [In]:[M]:[Zn]=1:1:1.5, the oxide semiconductor might have the following layered structures: a layered structure of one In layer with respect to two (M,Zn) layers and a layered structure of one In layer with respect to three (M,Zn) layers.

For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of indium atoms are increased; therefore, an oxide semiconductor having a high content of indium has higher carrier mobility than an oxide semiconductor having a low content of indium.

In contrast, when the indium content and the zinc content in an oxide semiconductor become lower, carrier mobility becomes lower. Thus, with an atomic ratio of [In]:[M]:[Zn]=0:1:0 and the vicinity thereof (e.g., a region C in FIG. 25C), insulation performance becomes better.

Accordingly, an oxide semiconductor in one embodiment of the present invention preferably has an atomic ratio represented by a region A in FIG. 25A. With the atomic ratio, a layered structure with high carrier mobility and a few grain boundaries is easily obtained.

A region B in FIG. 25B represents an atomic ratio of [In]:[M]:[Zn]=4:2:3 or 4:2:4.1 and the vicinity thereof. The vicinity includes an atomic ratio of [In]:[M]:[Zn]=5:3:4. An oxide semiconductor with an atomic ratio represented by the region B is an excellent oxide semiconductor that has particularly high crystallinity and high carrier mobility.

Note that a condition where an oxide semiconductor forms a layered structure is not uniquely determined by an atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which an oxide semiconductor has a layered structure, and boundaries of the regions A to C are not clear.

Next, the case where the oxide semiconductor is used for a transistor is described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8 \times 10^{11}/cm^3$, preferably lower than $1 \times 10^{11}/cm^3$, more preferably lower than $1 \times 10^{10}/cm^3$, and greater than or equal to $1 \times 10^{-9}/cm^3$ is used.

A highly purified intrinsic or substantially highly purified intrinsic oxide semiconductor has few carrier generation sources and thus can have a low carrier density. The highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, a transistor whose channel region is formed in an oxide semiconductor having a high density of trap states has unstable electrical characteristics in some cases.

In order to obtain stable electrical characteristics of the transistor, it is effective to reduce the concentration of impurities in the oxide semiconductor. In addition, in order to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor is described.

When silicon or carbon that is one of Group 14 elements is contained in the oxide semiconductor, defect states are formed. Thus, the oxide semiconductor is formed to have a region where the concentration of silicon or carbon (measured by secondary ion mass spectrometry (SIMS)) is controlled to be lower than or equal to $2 \times 10^{18}$ atoms/cm$^3$, preferably lower than or equal to $2 \times 10^{17}$ atoms/cm$^3$ in the oxide semiconductor or around an interface with a layer in contact with the oxide semiconductor.

When the oxide semiconductor contains alkali metal or alkaline earth metal, defect states are formed and carriers are generated, in some cases. Thus, a transistor including an oxide semiconductor that contains alkali metal or alkaline earth metal is likely to be normally-on. Therefore, it is preferable to reduce the concentration of alkali metal or alkaline earth metal in the oxide semiconductor. Specifically, the oxide semiconductor is formed to have a region where the concentration of alkali metal or alkaline earth metal measured by SIMS is controlled to be lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. Accordingly, it is preferable that nitrogen in the oxide semiconductor be reduced as much as possible. Specifically, the oxide semiconductor is formed to have a region where the concentration of nitrogen measured by SIMS is controlled to be lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the oxide semiconductor is formed to have a region where the concentration of hydrogen measured by SIMS is controlled to be lower than $1 \times 10^{20}$ atoms/cm$^3$, preferably lower than $1 \times 10^{19}$ atoms/cm$^3$, more preferably lower than $5 \times 10^{18}$ atoms/cm$^3$, still more preferably lower than $1 \times 10^{18}$ atoms/cm$^3$.

When an oxide semiconductor with sufficiently reduced impurity concentration is used for a channel formation region in a transistor, the transistor can have stable electrical characteristics. A transistor in which a highly purified oxide semiconductor is used for a channel formation region exhibits extremely low off-state current. When voltage between a source and a drain is set to about 0.1 V, 5 V, or 10 V, for example, the off-state current per channel width of the transistor can be as low as several yoctoamperes per micrometer to several zeptoamperes per micrometer.

Next, the case where the oxide semiconductor has a two-layer structure or a three-layer structure is described. A band diagram of insulators that are in contact with a stacked structure of an oxide semiconductor S1, an oxide semiconductor S2, and an oxide semiconductor S3 and a band diagram of insulators that are in contact with a stacked structure of the oxide semiconductor S2 and the oxide semiconductor S3 are described with reference to FIGS. 27A and 27B. Note that the oxide semiconductor S1, the oxide semiconductor S2, and the oxide semiconductor S3 correspond to the oxide semiconductor layer 130a, the oxide semiconductor layer 130b, and the oxide semiconductor layer 130c, respectively.

Figure 27A:
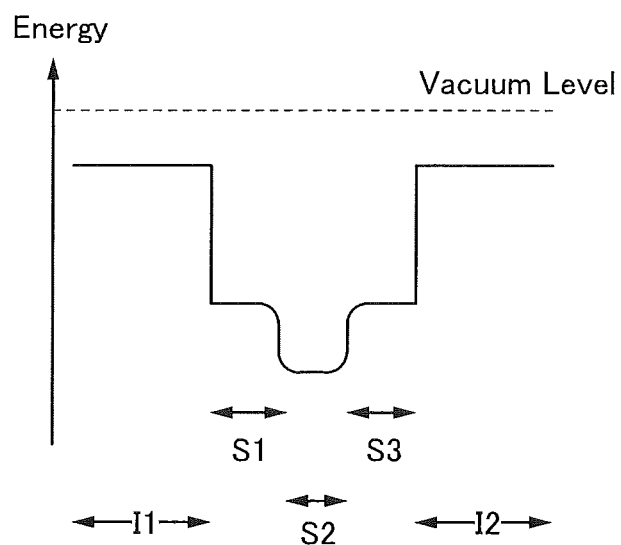
FIGS. 27A and 27B are band diagrams of stacked structures of oxide semiconductors.
Figure 27B:
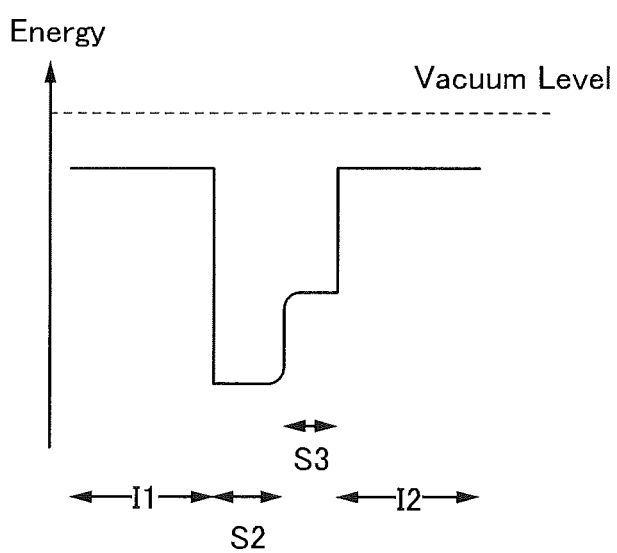

FIG. 27A is an example of a band diagram of a stacked structure including an insulator I1, the oxide semiconductor S1, the oxide semiconductor S2, the oxide semiconductor S3, and an insulator I2 in a film thickness direction. FIG. 27B is an example of a band diagram of a stacked structure including the insulator I1, the oxide semiconductor S2, the oxide semiconductor S3, and the insulator I2 in a film thickness direction. Note that for easy understanding, the band diagrams show the energy level of the conduction band minimum (Ec) of each of the insulator I1, the oxide semiconductor S1, the oxide semiconductor S2, the oxide semiconductor S3, and the insulator I2.

The energy level of the conduction band minimum of each of the oxide semiconductors S1 and S3 is closer to the vacuum level than that of the oxide semiconductor S2. Typically, a difference in energy level between the conduction band minimum of the oxide semiconductor S2 and the conduction band minimum of each of the oxide semiconductors S1 and S3 is preferably greater than or equal to 0.15 eV or greater than or equal to 0.5 eV, and less than or equal to 2 eV or less than or equal to 1 eV. That is, it is preferable that the electron affinity of the oxide semiconductor S2 be higher than the electron affinity of each of the oxide semiconductors S1 and S3, and the difference between the electron affinity of each of the oxide semiconductors S1 and S3 and the electron affinity of the oxide semiconductor S2 be greater than or equal to 0.15 eV or greater than or equal to 0.5 eV, and less than or equal to 2 eV or less than or equal to 1 eV.

As shown in FIGS. 27A and 27B, the energy level of the conduction band minimum of each of the oxide semiconductors S1 to S3 is gradually varied. In other words, the energy level of the conduction band minimum is continuously varied or continuously connected. In order to obtain such a band diagram, the density of defect states in a mixed layer formed at an interface between the oxide semiconductors S1 and S2 or an interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. In that case, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 25C may be used as the oxide semiconductors S1 and S3.

In the case where an oxide semiconductor with the atomic ratio represented by the region A is used as the oxide semiconductor S2, it is particularly preferable to use an oxide semiconductor with an atomic ratio where [M]/[In] is greater than or equal to 1, preferably greater than or equal to 2 as each of the oxide semiconductors S1 and S3. In addition, it is suitable to use an oxide semiconductor with sufficiently high insulation performance and an atomic ratio where [M]/([Zn]+[In]) is greater than or equal to 1 as the oxide semiconductor S3.

The structure described in this embodiment can be combined with any of the structures described in the other embodiments as appropriate.

Embodiment 6

The structure of an oxide semiconductor that can be used for one embodiment of the present invention is described below.

In this specification, the term "parallel" indicates that the angle formed between two straight lines is greater than or equal to −10° and less than or equal to 10°, and accordingly includes the case where the angle is greater than or equal to −5° and less than or equal to 5°. The term "perpendicular" indicates that an angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

<Structure of Oxide Semiconductor>

The structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is an oxide semiconductor having a plurality of c-axis aligned crystal parts (also referred to as pellets).

Figure 28A:
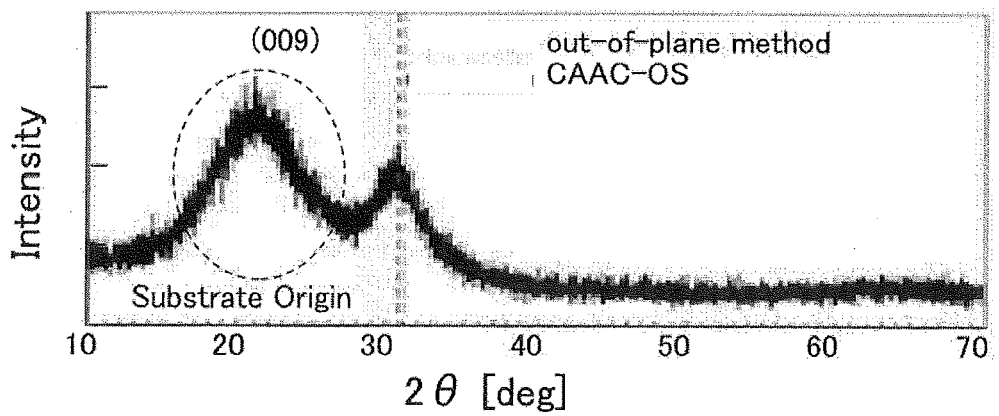
FIGS. 28A to 28E show structural analysis results of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 28A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 28B:
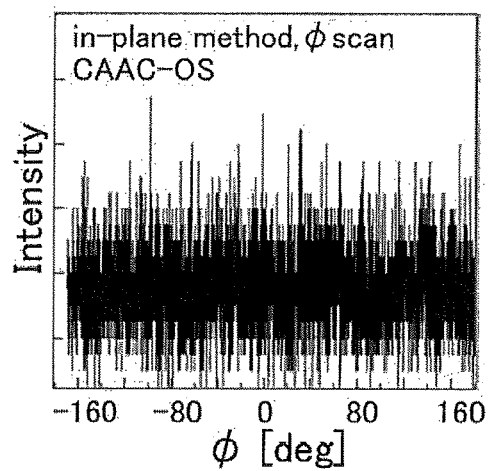
Figure 28C:
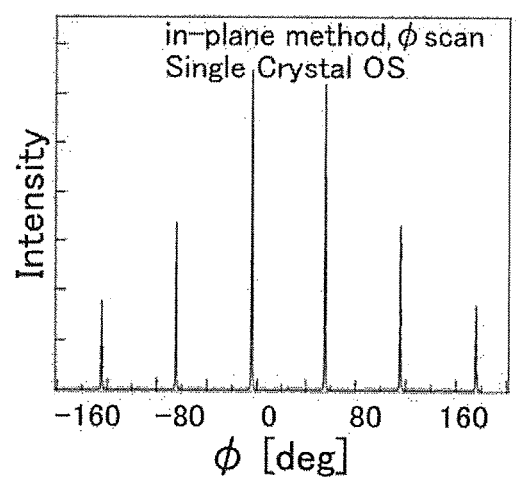

On the other hand, in structural analysis of the CAAC-OS by an in-plane method in which an X-ray is incident on the CAAC-OS in a direction parallel to the formation surface, a peak appears at a 2θ of around 56°. This peak is derived from the (110) plane of the InGaZnO$_4$ crystal. When analysis (φ scan) is performed with 2θ fixed at around 56° and with the sample rotated using a normal vector to the sample surface as an axis (φ axis), as shown in FIG. 28B, a peak is not clearly observed. In contrast, in the case where single crystal InGaZnO$_4$ is subjected to φ scan with 2θ fixed at around 56°, as shown in FIG. 28C, six peaks which are derived from crystal planes equivalent to the (110) plane are observed. Accordingly, the structural analysis using XRD shows that the directions of a-axes and b-axes are irregularly oriented in the CAAC-OS.

Figure 28D:
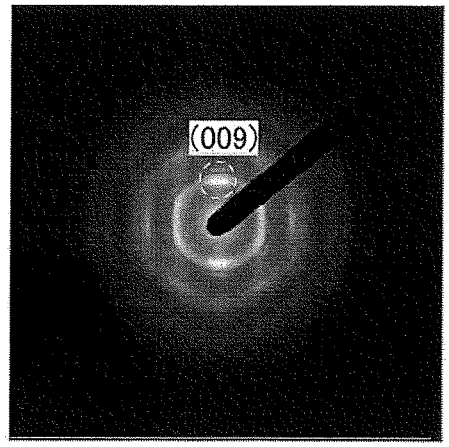
Figure 28E:
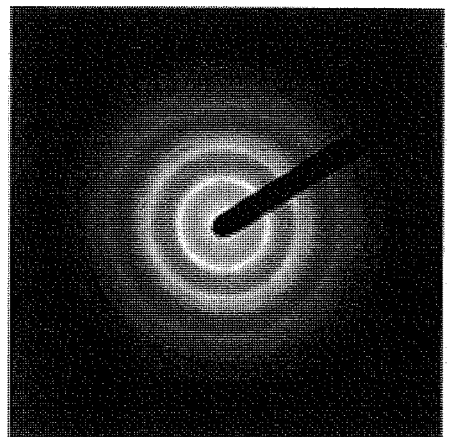

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 28D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 28E shows a diffraction pattern obtained in such a manner that an electron beam with a probe diameter of 300 nm is incident on the same sample in a direction perpendicular to the sample surface. As shown in FIG. 28E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 28E is considered to be derived from the (010) plane, the (100) plane, and the like of the InGaZnO$_4$ crystal. The second ring in FIG. 28E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 29A:
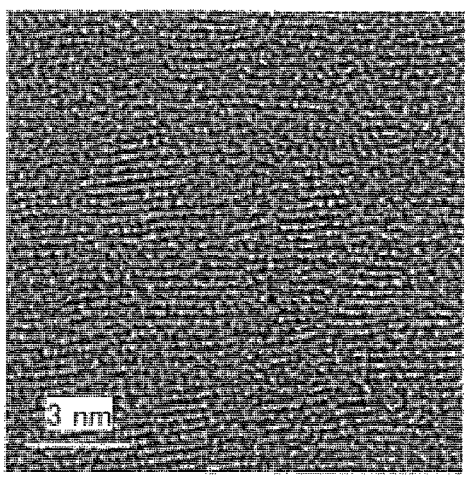
FIGS. 29A to 29E show a cross-sectional TEM image and plan-view TEM images of a CAAC-OS and images obtained through analysis thereof.

FIG. 29A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 29A shows pellets in which metal atoms are arranged in a layered manner. FIG. 29A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 29B:
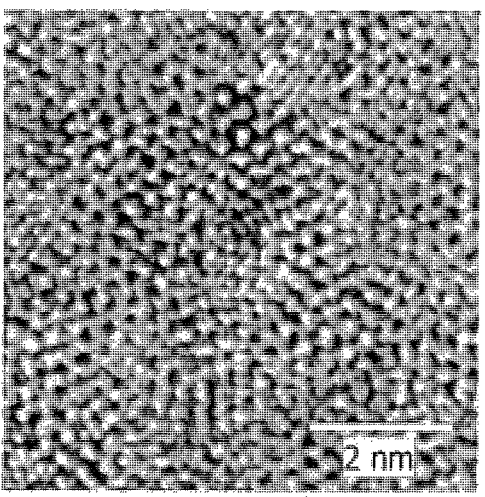
Figure 29C:
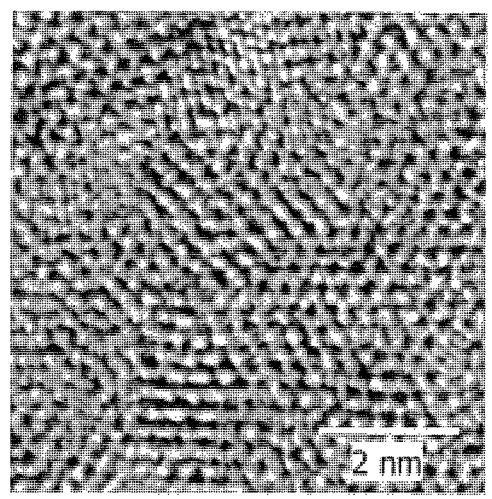
Figure 29D:
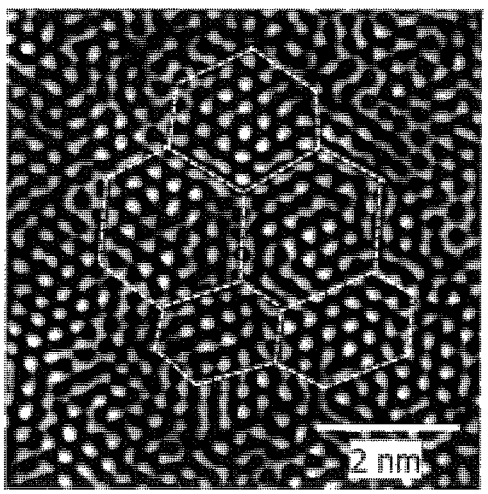
Figure 29E:
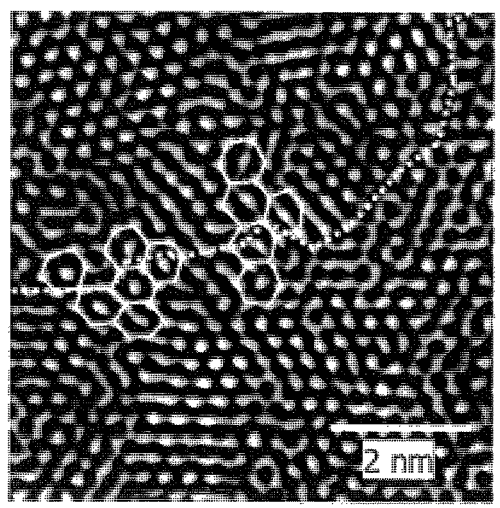

FIGS. 29B and 29C show Cs-corrected high-resolution TEM images of a plane of the CAAC-OS observed from a direction substantially perpendicular to the sample surface. FIGS. 29D and 29E are images obtained through image processing of FIGS. 29B and 29C. The method of image processing is as follows. The image in FIG. 29B is subjected to fast Fourier transform (FFT), so that an FFT image is obtained. Then, mask processing is performed such that a range of from 2.8 to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 29D, a portion where a lattice arrangement is broken is shown by a dashed line. A region surrounded by a dashed line is one pellet. The portion shown by the dashed line is a junction of pellets. The dashed line draws a hexagon, which means that the pellet has a hexagonal shape. Note that the shape of the pellet is not always a regular hexagon but is a non-regular hexagon in many cases.

In FIG. 29E, a dotted line denotes a portion between a region where a lattice arrangement is well aligned and another region where a lattice arrangement is well aligned. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of interatomic distance in an a-b plane direction, an interatomic distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}$ cm$^{-3}$, preferably lower than $1\times10^{11}$ cm$^3$, more preferably lower than $1\times10^{10}$ cm$^{-3}$, and is higher than or equal to $1\times10^{-9}$ cm$^{-3}$). Such an oxide semiconductor is referred to as a highly purified intrinsic or substantially highly purified intrinsic oxide semiconductor. A CAAC-OS has a low impurity concentration and a low density of defect states. That is, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, for example, a peak indicating orientation does not appear. That is, a crystal of an nc-OS does not have orientation.

Figure 30A:
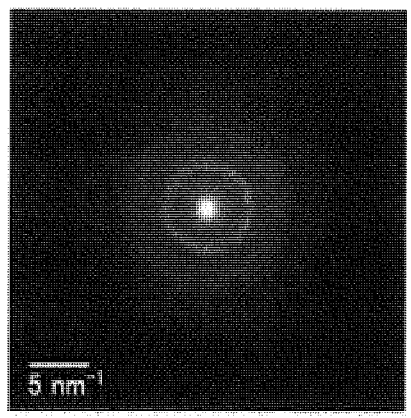
FIGS. 30A to 30D show electron diffraction patterns and a cross-sectional TEM image of an nc-OS.
Figure 30B:
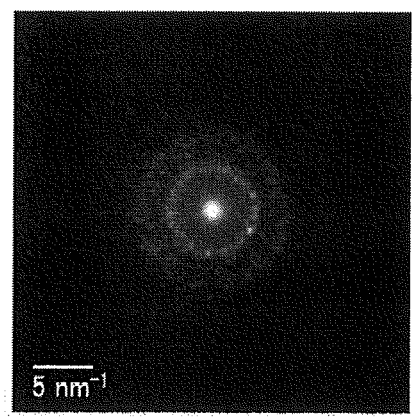

For example, when an electron beam with a probe diameter of 50 nm is incident on a 34-nm-thick region of a thinned nc-OS including an $InGaZnO_4$ crystal in a direction parallel to the formation surface, a ring-shaped diffraction pattern (nanobeam electron diffraction pattern) shown in FIG. 30A is observed. FIG. 30B shows a diffraction pattern obtained when an electron beam with a probe diameter of 1 nm is incident on the same sample. As shown in FIG. 30B, a plurality of spots are observed in a ring-like region. In other words, ordering in an nc-OS is not observed with an electron beam with a probe diameter of 50 nm but is observed with an electron beam with a probe diameter of 1 nm.

Figure 30C:
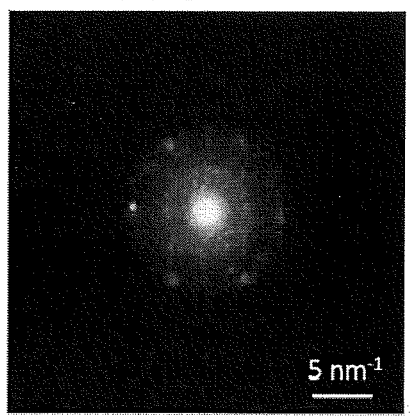

Furthermore, an electron diffraction pattern in which spots are arranged in an approximately regular hexagonal shape is observed in some cases as shown in FIG. 30C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 30D:
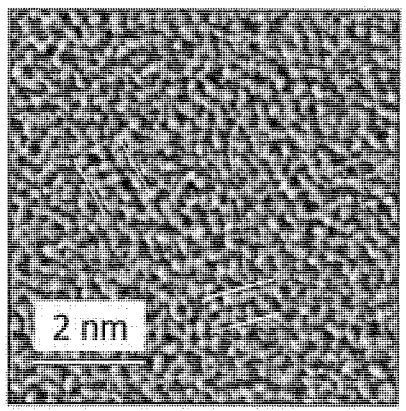

FIG. 30D shows a Cs-corrected high-resolution TEM image of a cross section of an nc-OS observed from the direction substantially parallel to the formation surface. In a high-resolution TEM image, an nc-OS has a region in which a crystal part is observed, such as a part indicated by additional lines in FIG. 30D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS might be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has high regularity than an amorphous oxide semiconductor. Thus, the nc-OS has a lower density of defect states than the a-like OS and the amorphous oxide semiconductor. Note that there is no regularity of crystal orientation between different pellets in the nc-OS; thus, the nc-OS has a higher density of defect states than the CAAC-OS.

<a-like OS>

An a-like OS is an oxide semiconductor having a structure between the nc-OS and the amorphous oxide semiconductor.

FIGS. 31A and 31B are high-resolution cross-sectional IBM images of an a-like OS. FIG. 31A is the high-resolution cross-sectional TEM image of the a-like OS at the start of electron irradiation. FIG. 31B is the high-resolution cross-sectional TEM image of a-like OS after electron ($e^-$) irradiation at $4.3 \times 10^8$ $e^-/nm^2$. FIGS. 31A and 31B show that stripe-like bright regions extending vertically are observed in the a-like OS from the start of electron irradiation. It can be also found that the shape of the bright region changes after electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of the $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as a d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 32:
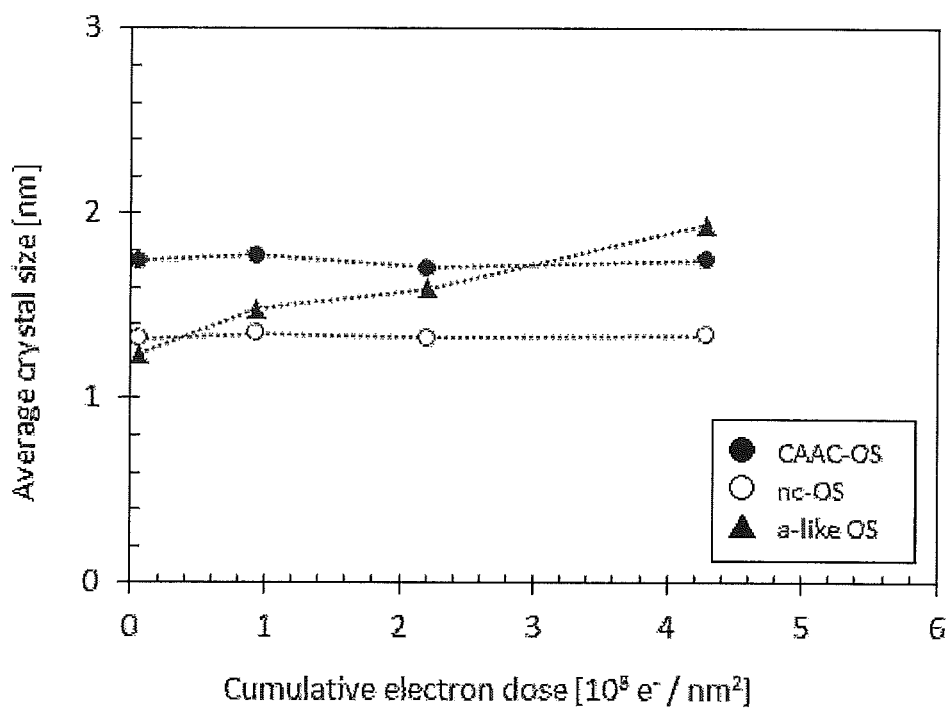
FIG. 32 shows changes in crystal parts of In—Ga—Zn oxides induced by electron irradiation.

FIG. 32 shows a change in the average size of crystal parts (at 22 to 30 points) in each sample. Note that the crystal part size corresponds to the length of the lattice fringe. FIG. 32 indicates that the crystal part size in the a-like OS increases with an increase in the cumulative electron dose in obtaining TEM images, for example. As shown in FIG. 32, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part sizes in the nc-OS and the CAAC-OS show little change from the start of electron irradiation to a cumulative electron dose of $4.2 \times 10^8$ $e^-/nm^2$. As shown in FIG. 32, the crystal part sizes in the nc-OS and the CAAC-OS are approximately 1.3 nm and approximately 1.8 nm, respectively, regardless of the cumulative electron dose. For electron beam irradiation and TEM observation, a Hitachi H-9000NAR transmission electron microscope was used. The conditions of electron beam irradiation were as follows: accelerating voltage was 300 kV; current density was $6.7 \times 10^5$ $e^-/(nm^2 \cdot s)$; and the diameter of an irradiation region was 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor with an atomic ratio of In:Ga:Zn=1:1:1, the density of an a-like OS is higher than or equal to 5.0 g/cm$^3$ and lower than 5.9 g/cm$^3$. In addition, for example, in the case of the oxide semiconductor with an atomic ratio of In:Ga:Zn=1:1:1, the density of an nc-OS or a CAAC-OS is higher than or equal to 5.9 g/cm$^3$ and lower than 6.3 g/cm$^3$.

Note that in the case where single crystals with the same composition do not exist, by combining single crystals with different compositions at a given proportion, it is possible to estimate density that corresponds to the density of a single crystal with a desired composition. The density of the single crystal with a desired composition may be estimated using weighted average with respect to the combination ratio of the single crystals with different compositions. Note that it is preferable to combine as few kinds of single crystals as possible for density estimation.

As described above, oxide semiconductors have various structures and various properties. An oxide semiconductor may be a stacked film including two or more of an amorphous oxide semiconductor, an a-like OS, an nc-OS, and a CAAC-OS, for example.

The structure described in this embodiment can be combined with any of the structures described in the other embodiments as appropriate.

Embodiment 7

In this embodiment, an example of a package that includes a chip including the circuit described in Embodiment 1 or a chip including the circuit with an imaging function described in Embodiment 2 is described.

Figure 33A:
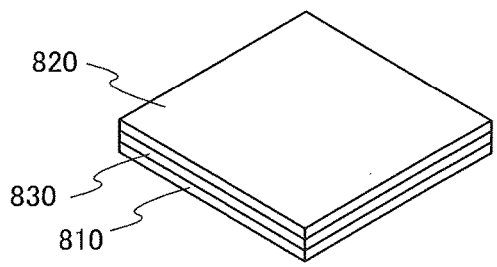
FIGS. 33A to 33D illustrate a package.
Figure 33B:
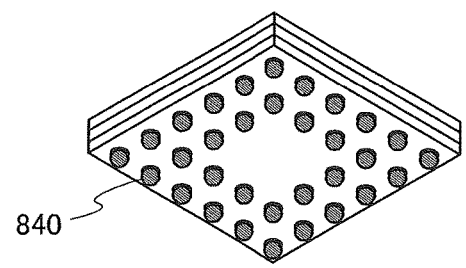
Figure 33C:
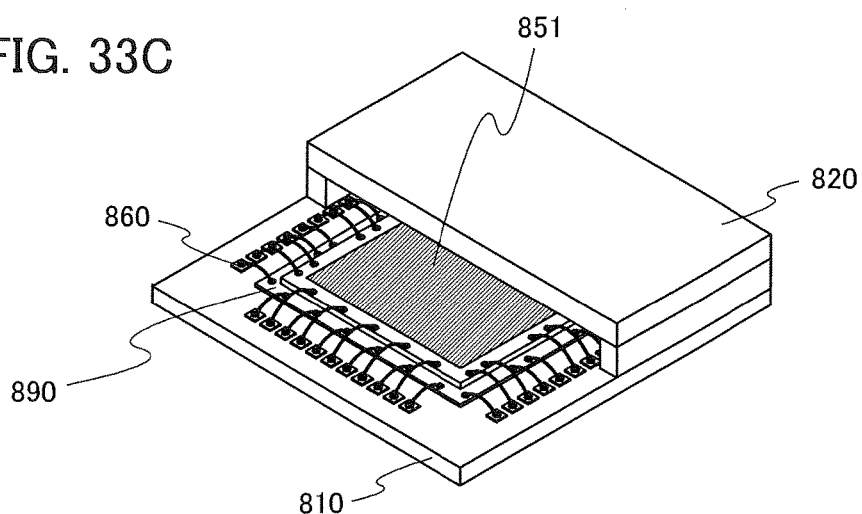
Figure 33D:
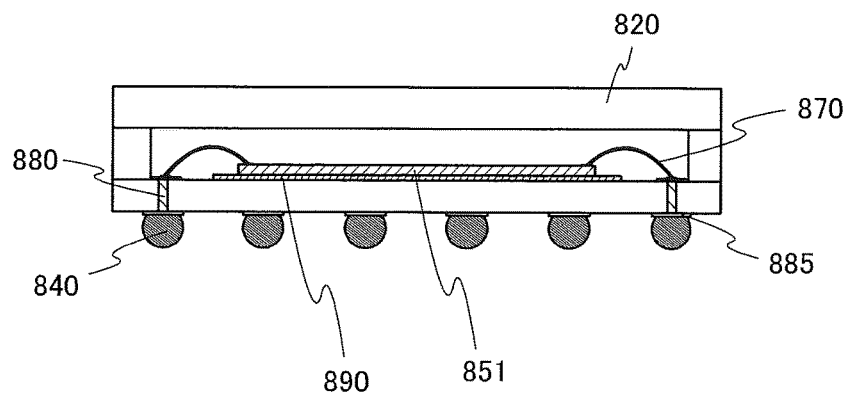

FIG. 33A is an external perspective view showing the top surface side of the package. FIG. 33B is an external perspective view showing the bottom surface side of the package. FIG. 33C is a perspective view of the package, in which parts of the package are partly illustrated. FIG. 33D is a cross-sectional view of the package.

The package includes a package substrate 810 to which a chip 850 is fixed, a cover 820, and the like. Furthermore, a chip 890 is provided between the package substrate 810 and a chip 851. Thus, a system in package (SiP) is formed.

For example, the chip 851 may include the memory cell array 11 and the like, and the chip 890 may include the circuits 13 to 17, the circuit 20, the circuit 39, and the like. In the case where the chip 851 has an imaging function, a light-transmitting material may be used for the cover 820.

On the bottom surface of the package, ball grid array (BGA) including solder balls as bumps 840 is formed. Although BGA is employed here, land grid array (LGA), pin grid array (PGA), or the like may be alternatively employed. Alternatively, a quad flat no-lead package (QFN), a quad flat package (QFP), or the like may be employed.

Electrode pads 860 are formed over the package substrate 810, and electrically connected to the bumps 840 through through-holes 880 and lands 885. The electrode pads 860 are electrically connected to electrodes of the chip 851 or 890 through wires 870.

The chip including the circuit described in Embodiment 1 or the chip including the circuit with an imaging function described in Embodiment 2 can be easily mounted by being provided in the package with the above structure, and can be incorporated into a variety of semiconductor devices or electronic devices.

The structure described in this embodiment can be combined with any of the structures described in the other embodiments as appropriate.

Embodiment 8

Examples of an electronic device that can use the semiconductor device in one embodiment of the present invention include display devices, personal computers, image storage devices or image reproducing devices provided with storage media, cellular phones, game machines (including portable game machines), portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 34A to 34F illustrate specific examples of these electronic devices.

Figure 34A:
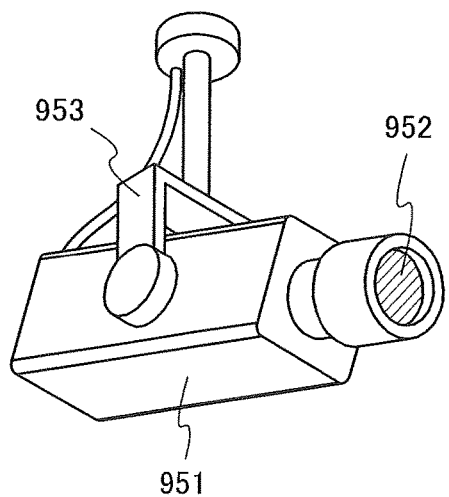
FIGS. 34A to 34F illustrate structure examples of electronic devices.

FIG. 34A illustrates a monitoring camera, which includes a housing 951, a lens 952, a support 953, and the like. The semiconductor device in one embodiment of the present invention can be included as a component of the monitoring camera. Note that a "monitoring camera" is a common name and does not limit the use. For example, a device that functions a monitoring camera can also be called a camera or a video camera.

Figure 34B:
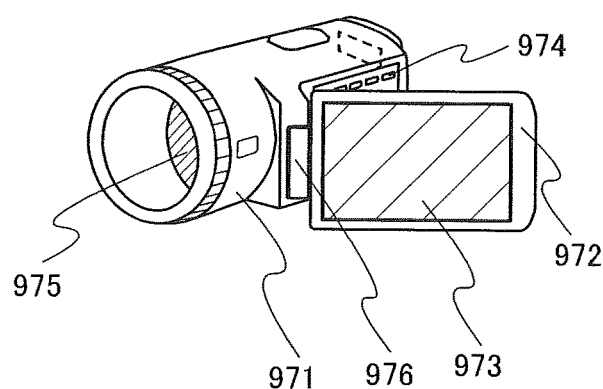

FIG. 34B illustrates a video camera, which includes a first housing 971, a second housing 972, a display portion 973, operation keys 974, a lens 975, a joint 976, and the like. The operation keys 974 and the lens 975 are provided for the first housing 971, and the display portion 973 is provided for the second housing 972. The semiconductor device in one embodiment of the present invention can be included as a component of the video camera.

Figure 34C:
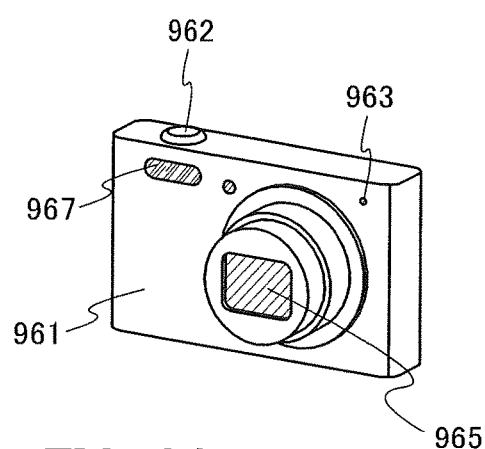

FIG. 34C illustrates a digital camera, which includes a housing 961, a shutter button 962, a microphone 963, a light-emitting portion 967, a lens 965, and the like. The semiconductor device in one embodiment of the present invention can be included as a component of the digital camera.

Figure 34D:
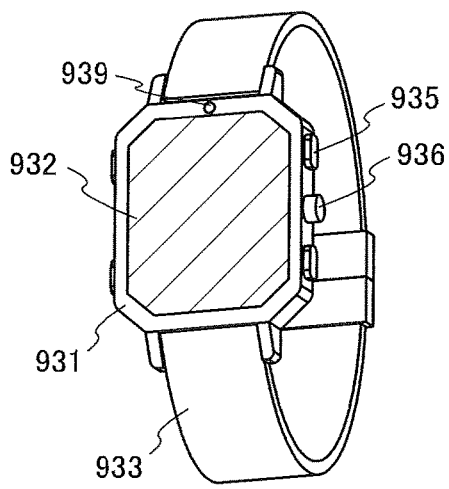

FIG. 34D illustrates a wrist-watch-type information terminal, which includes a housing 931, a display portion 932, a wristband 933, operation buttons 935, a winder 936, a camera 939, and the like. The display portion 932 may be a touch panel. The semiconductor device in one embodiment of the present invention can be included as a component of the information terminal.

Figure 34E:
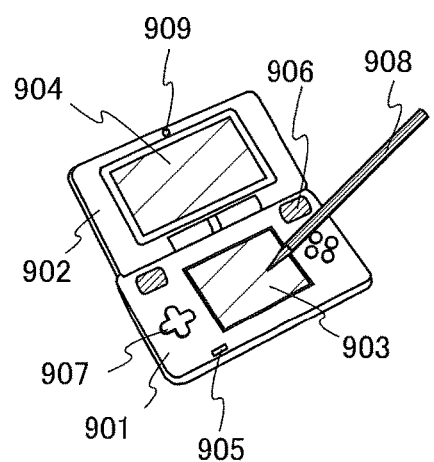

FIG. 34E illustrates a portable game machine, which includes housings 901 and 902, display portions 903 and 904, a microphone 905, speakers 906, an operation key 907, a stylus 908, a camera 909, and the like. Although the portable game machine in FIG. 34E has the two display portions 903 and 904, the number of display portions included in the portable game machine is not limited thereto. The semiconductor device in one embodiment of the present invention can be included as a component of the portable game machine.

Figure 34F:
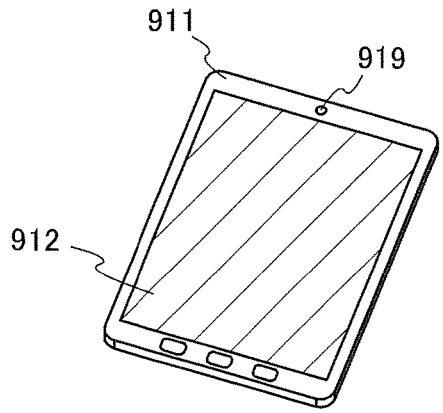

FIG. 34F illustrates a portable data terminal, which includes a housing 911, a display portion 912, a camera 919, and the like. A touch panel function of the display portion 912 enables input and output of information. The semiconductor device in one embodiment of the present invention can be included as a component of the portable data terminal.

This embodiment can be combined with any of the other embodiments described in this specification as appropriate.

This application is based on Japanese Patent Application serial No. 2015-230745 filed with Japan Patent Office on Nov. 26, 2015, the entire contents of which are hereby incorporated by reference.

What is claimed is:

1. A semiconductor device comprising:
a first circuit including first memory blocks, a first reference memory block, a third circuit, a fourth circuit, a fifth circuit, a sixth circuit, and a seventh circuit; and
a second circuit including operation blocks, a second reference memory block, an eighth circuit, a ninth circuit, and a tenth circuit,
wherein the first memory blocks are arranged in a matrix,
wherein the first memory blocks and the first reference memory block each include a first memory cell,
wherein the first memory blocks are configured to store first data,
wherein the third circuit is configured to select the first memory cell to which the first data is written,
wherein the fourth circuit is configured to supply the first data,
wherein the fifth circuit is configured to supply a potential corresponding to a coefficient used for operation to the first memory blocks and the first reference memory block,
wherein the sixth circuit is configured to bring the first reference memory block and the seventh circuit into conduction and to bring a selected first memory block and the seventh circuit into conduction,
wherein the seventh circuit is configured to output second data obtained by operation using a signal output from the first reference memory block and a signal output from the selected first memory block to the second circuit,
wherein the operation blocks are provided in a row direction,
wherein each of the operation blocks includes a second memory block and a third memory block,
wherein the second memory block, the third memory block, and the second reference memory block each include a second memory cell,
wherein the second memory block and the third memory block are each configured to store the second data,
wherein the eighth circuit is configured to select the second memory cell to which the second data is written,
wherein the ninth circuit is configured to supply a potential corresponding to a coefficient used for operation to the second memory block or the third memory block and the second reference memory block,
wherein the tenth circuit is configured to output third data obtained by operation using a signal output from the second reference memory block and a signal output from a selected second memory block or the third memory block,
wherein the second data is alternately input to the second memory block and the third memory block, and
wherein one of the second memory block and the third memory block is configured to perform operation while the second data is input to the other of the second memory block and the third memory block.

2. The semiconductor device according to claim 1,
wherein the first memory blocks include first transistors,
wherein one of the first transistors is provided in each column,
wherein the first reference memory block includes a second transistor,
wherein the first memory cell includes a third transistor, a fourth transistor, and a first capacitor,
wherein one of a source and a drain of the third transistor is electrically connected to a gate of the fourth transistor and one electrode of the first capacitor,
wherein the other of the source and the drain of the third transistor is electrically connected to the fourth circuit,
wherein a gate of the third transistor is electrically connected to the third circuit,
wherein the other electrode of the first capacitor is electrically connected to the fifth circuit,
wherein one of a source and a drain of the fourth transistor is electrically connected to a power supply line,
wherein the other of the source and the drain of the fourth transistor is electrically connected to one of a source and a drain of a first transistor provided in the same column,
wherein the other of the source and the drain of the fourth transistor is electrically connected to one of a source and a drain of the second transistor,
wherein a gate of one of the first transistors and a gate of the second transistor are electrically connected to the sixth circuit, and
wherein the other of the source and the drain of one of the first transistors and the other of the source and the drain of the second transistor are electrically connected to the seventh circuit.

3. The semiconductor device according to claim 1,
wherein second memory cells included in the second memory block, the third memory block, and the second reference memory block each include a fifth transistor, a sixth transistor, and a second capacitor,
wherein one of a source and a drain of the fifth transistor is electrically connected to a gate of the sixth transistor and one electrode of the second capacitor,
wherein the other of the source and the drain of the fifth transistor is electrically connected to the seventh circuit,
wherein the other electrode of the second capacitor is electrically connected to the ninth circuit, and
wherein one of a source and a drain of the sixth transistor is electrically connected to a power supply line.

4. The semiconductor device according to claim 3,
wherein the second memory block and the third memory block each include a seventh transistor, an eighth transistor, and a first inverter circuit,
wherein one seventh transistor and one eighth transistor are provided in each row,
wherein a gate of the fifth transistor is electrically connected to one of a source and a drain of the seventh transistor provided in the same row,
wherein the other of the source and the drain of the sixth transistor is electrically connected to one of a source and a drain of the eighth transistor provided in the same row,
wherein the other of the source and the drain of the seventh transistor is electrically connected to the eighth circuit,
wherein the other of the source and the drain of the eighth transistor is electrically connected to the tenth circuit, wherein a gate of the eighth transistor is electrically connected to an output terminal of the first inverter circuit, and wherein a gate of the seventh transistor is electrically connected to an input terminal of the first inverter circuit.

5. The semiconductor device according to claim 4, wherein an input terminal of a second inverter circuit is electrically connected to the gate of the seventh transistor included in the second memory block, and wherein an output terminal of the second inverter circuit is electrically connected to the gate of the seventh transistor included in the third memory block.

6. The semiconductor device according to claim 3, wherein the other of the source and the drain of the fifth transistor is electrically connected to the fourth circuit, the gate of the fifth transistor is electrically connected to the third circuit, and the other of the source and the drain of the sixth transistor is electrically connected to the tenth circuit.

7. The semiconductor device according to claim 1, wherein transistors included in the first memory cell and the second memory cell each include an oxide semiconductor in a region where a channel is formed.

8. The semiconductor device according to claim 7, wherein the oxide semiconductor includes In, Zn, and M, where M is Al, Ga, Y, or Sn.

9. An electronic device comprising:
the semiconductor device according to claim 1; and
a display device.

10. A semiconductor device comprising:
a first circuit including first memory blocks, a first reference memory block, a third circuit, a fourth circuit, a fifth circuit, a sixth circuit, and a seventh circuit; and
a second circuit including operation blocks, a second reference memory block, an eighth circuit, a ninth circuit, and a tenth circuit, wherein the first memory blocks are arranged in a matrix and includes a first transistor, wherein the first reference memory block includes a second transistor, wherein the first memory blocks and the first reference memory block each include a first memory cell including a third transistor, a fourth transistor, and a first capacitor, wherein one of a source and a drain of the third transistor is electrically connected to a gate of the fourth transistor and one electrode of the first capacitor, wherein the other of the source and the drain of the third transistor is electrically connected to the fourth circuit, wherein a gate of the third transistor is electrically connected to the third circuit, wherein the other electrode of the first capacitor is electrically connected to the fifth circuit, wherein one of a source and a drain of the fourth transistor is electrically connected to a power supply line, wherein the other of the source and the drain of the fourth transistor is electrically connected to one of a source and a drain of the first transistor provided in the same column, wherein the other of the source and the drain of the fourth transistor is electrically connected to one of a source and a drain of the second transistor, wherein a gate of the first transistor and a gate of the second transistor are electrically connected to the sixth circuit, wherein the other of the source and the drain of the first transistor and the other of the source and the drain of the second transistor are electrically connected to the seventh circuit, wherein the operation blocks are provided in a row direction, wherein each of the operation blocks includes a second memory block and a third memory block, and wherein the second memory block, the third memory block, and the second reference memory block each include a second memory cell.

11. The semiconductor device according to claim 10, wherein the second memory cells included in the second memory block, the third memory block, and the second reference memory block each include a fifth transistor, a sixth transistor, and a second capacitor, wherein one of a source and a drain of the fifth transistor is electrically connected to a gate of the sixth transistor and one electrode of the second capacitor, wherein the other of the source and the drain of the fifth transistor is electrically connected to the seventh circuit, wherein the other electrode of the second capacitor is electrically connected to the ninth circuit, and wherein one of a source and a drain of the sixth transistor is electrically connected to the power supply line.

12. The semiconductor device according to claim 11, wherein the second memory block and the third memory block each include a seventh transistor, an eighth transistor, and a first inverter circuit, wherein one seventh transistor and one eighth transistor are provided in each row, wherein a gate of the fifth transistor is electrically connected to one of a source and a drain of the seventh transistor provided in the same row, wherein the other of the source and the drain of the sixth transistor is electrically connected to one of a source and a drain of the eighth transistor provided in the same row, wherein the other of the source and the drain of the seventh transistor is electrically connected to the eighth circuit, wherein the other of the source and the drain of the eighth transistor is electrically connected to the tenth circuit, wherein a gate of the eighth transistor is electrically connected to an output terminal of the first inverter circuit, and wherein a gate of the seventh transistor is electrically connected to an input terminal of the first inverter circuit.

13. The semiconductor device according to claim 12, wherein an input terminal of a second inverter circuit is electrically connected to the gate of the seventh transistor included in the second memory block, and wherein an output terminal of the second inverter circuit is electrically connected to the gate of the seventh transistor included in the third memory block.

14. The semiconductor device according to claim 10, wherein in the second memory cell included in the second reference memory block, the other of the source and the drain of the fifth transistor is electrically connected to the fourth circuit, the gate of the fifth transistor is electrically connected to the third circuit, and the other of the source and the drain of the sixth transistor is electrically connected to the tenth circuit.

15. The semiconductor device according to claim 10,
wherein the second memory cells arranged in k rows and k columns are provided in the second memory block and the third memory block,
wherein k is a natural number of 2 or more, and
wherein the second memory cells arranged in one row and k columns are provided in the second reference memory block.

16. The semiconductor device according to claim 10, wherein transistors included in the first memory cell and the second memory cell each include an oxide semiconductor in a region where a channel is formed.

17. The semiconductor device according to claim 16, wherein the oxide semiconductor includes In, Zn, and M, where M is Al, Ga, Y, or Sn.

18. An electronic device comprising:
the semiconductor device according to claim 10; and
a display device.

19. A semiconductor device comprising:
a memory block including a first memory cell, a second memory cell, and a first transistor,
wherein the first memory cell including:
  a second transistor;
  a third transistor; and
  a first capacitor;
  wherein one of a source and a drain of the second transistor is electrically connected to a gate of the third transistor and an electrode of the first capacitor,
wherein the second memory cell including:
  a fourth transistor;
  a fifth transistor; and
  a second capacitor;
  wherein one of a source and a drain of the fourth transistor is electrically connected to a gate of the fifth transistor and an electrode of the second capacitor,
wherein one of a source and a drain of the first transistor is electrically connected to one of a source and a drain of the third transistor and one of a source and a drain of the fifth transistor.

20. The semiconductor device according to claim 19, wherein the first memory cell and the second memory cell are provided in one column of the memory block.

21. The semiconductor device according to claim 19, wherein the first transistor, the second transistor, the third transistor, the fourth transistor, and the fifth transistor each include an oxide semiconductor in a region where a channel is formed.

22. The semiconductor device according to claim 21, wherein the oxide semiconductor includes In, Zn, and M, where M is Al, Ga, Y, or Sn.

23. An electronic device comprising:
the semiconductor device according to claim 19; and
a display device.

24. A semiconductor device comprising:
a memory block including a first memory cell, a second memory cell, and a first transistor,
wherein the first memory cell including:
  a second transistor;
  a third transistor;
    a first photoelectric conversion element; and
  a first capacitor;
  wherein one of a source and a drain of the second transistor is electrically connected to a gate of the third transistor, an electrode of the first capacitor, and an electrode of the first photoelectric conversion element,
wherein the second memory cell including:
  a fourth transistor;
  a fifth transistor;
    a second photoelectric conversion element; and
  a second capacitor;
  wherein one of a source and a drain of the fourth transistor is electrically connected to a gate of the fifth transistor, an electrode of the second capacitor, and an electrode of the second photoelectric conversion element,
wherein one of a source and a drain of the first transistor is electrically connected to one of a source and a drain of the third transistor and one of a source and a drain of the fifth transistor.

25. The semiconductor device according to claim 24, wherein a sixth transistor is provided between the one of the source and the drain of the second transistor and the electrode of the first photoelectric conversion element, and
wherein a seventh transistor is provided between the one of the source and the drain of the fourth transistor and the electrode of the second photoelectric conversion element.

26. The semiconductor device according to claim 24, wherein the first memory cell and the second memory cell are provided in one column of the memory block.

27. The semiconductor device according to claim 24, wherein the first transistor, the second transistor, the third transistor, the fourth transistor, and the fifth transistor each include an oxide semiconductor in a region where a channel is formed.

28. The semiconductor device according to claim 27, wherein the oxide semiconductor includes In, Zn, and M, where M is Al, Ga, Y, or Sn.

29. An electronic device comprising:
the semiconductor device according to claim 24; and
a display device.

* * * * *

UNITED STATES PATENT AND TRADEMARK OFFICE
CERTIFICATE OF CORRECTION

PATENT NO. : 9,870,827 B2
APPLICATION NO. : 15/359017
DATED : January 16, 2018
INVENTOR(S) : Takashi Nakagawa et al.

Page 1 of 1

It is certified that error appears in the above-identified patent and that said Letters Patent is hereby corrected as shown below:

In the Claims

-- Claim 14, Column 54, Line 60: change "claim 10" to -- claim 11 --.

Signed and Sealed this
Tenth Day of July, 2018

Andrei Iancu
*Director of the United States Patent and Trademark Office*